(12) United States Patent
Yamazaki et al.

(10) Patent No.: US 8,486,804 B2
(45) Date of Patent: Jul. 16, 2013

(54) SEMICONDUCTOR DEVICE

(75) Inventors: Shunpei Yamazaki, Tokyo (JP);
Masahiro Katayama, Tochigi (JP);
Yoshiaki Oikawa, Tochigi (JP); Atsushi Hirose, Kanagawa (JP); Masayuki Sakakura, Tochigi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 1601 days.

(21) Appl. No.: 11/928,912

(22) Filed: Oct. 30, 2007

(65) Prior Publication Data

US 2008/0099664 A1    May 1, 2008

(30) Foreign Application Priority Data

Oct. 31, 2006    (JP) .................................. 2006-295929

(51) Int. Cl.
*H01L 21/302* (2006.01)
(52) U.S. Cl.
USPC .................... 438/459; 257/E21.568; 438/113
(58) Field of Classification Search
USPC ............................ 438/458, 459–465, 106–113
See application file for complete search history.

(56) References Cited

U.S. PATENT DOCUMENTS

| 6,498,073 | B2 | 12/2002 | Sarma et al. |
| 6,781,152 | B2* | 8/2004 | Yamazaki ........................ 257/59 |
| 7,119,364 | B2 | 10/2006 | Yamazaki |
| 7,153,720 | B2 | 12/2006 | Augusto |
| 7,253,391 | B2 | 8/2007 | Koyama et al. |
| 7,449,718 | B2 | 11/2008 | Nishi et al. |
| 7,501,306 | B2 | 3/2009 | Nishi et al. |
| 7,601,236 | B2* | 10/2009 | Yamashita et al. ............ 156/230 |
| 7,635,605 | B2 | 12/2009 | Shibayama |
| 7,666,050 | B2* | 2/2010 | Yamashita et al. ............ 445/26 |
| 7,888,714 | B2 | 2/2011 | Takahashi et al. |
| 2001/0040645 | A1 | 11/2001 | Yamazaki |
| 2005/0056842 | A1* | 3/2005 | Nishi et al. ..................... 257/66 |
| 2005/0167573 | A1 | 8/2005 | Maruyama et al. |
| 2006/0146233 | A1* | 7/2006 | Park ............................... 349/95 |
| 2006/0187381 | A1* | 8/2006 | Yokozawa ..................... 349/106 |

(Continued)

FOREIGN PATENT DOCUMENTS

| CN | 1312590 A | 9/2001 |
| CN | 1735968 A | 2/2006 |

(Continued)

OTHER PUBLICATIONS

Office Action, Chinese Appln. No. 200710168213.5, dated Aug. 13, 2010, 15 pages with English translation.

(Continued)

*Primary Examiner* — Savitr Mulpuri
(74) *Attorney, Agent, or Firm* — Fish & Richardson P.C.

(57) ABSTRACT

A semiconductor device including a first element including a photodiode and an amplifier circuit which amplifies output current of the photodiode, over a first insulating film; and a second element including a color filter and an overcoat layer over the color filter over a second insulating film is manufactured. The first element and the second element are attached to each other by bonding the first insulating film and the second insulating film with a bonding material. Further, the amplifier circuit is a current mirror circuit including a thin film transistor. Still further, a color film may be used instead of a color filter.

7 Claims, 58 Drawing Sheets

U.S. PATENT DOCUMENTS

| | | |
|---|---|---|
| 2007/0015302 A1 | 1/2007 | Nishi et al. |
| 2007/0054436 A1 | 3/2007 | Hirakata et al. |
| 2007/0082430 A1 | 4/2007 | Yamazaki |
| 2007/0113886 A1 | 5/2007 | Arao et al. |
| 2007/0187790 A1 | 8/2007 | Takahashi et al. |
| 2009/0212285 A1 | 8/2009 | Nishi et al. |
| 2010/0067235 A1 | 3/2010 | Yamashita et al. |

FOREIGN PATENT DOCUMENTS

| | | |
|---|---|---|
| EP | 1122794 A2 | 8/2001 |
| EP | 1583148 A1 | 10/2005 |
| EP | 1719988 A1 | 8/2006 |
| JP | 09045886 A | 2/1997 |
| JP | 2004531877 A | 10/2004 |
| JP | 2005-183374 A | 7/2005 |
| JP | 2005241457 A | 9/2005 |
| JP | 2005268238 A | 9/2005 |
| JP | 2006509358 A | 3/2006 |
| JP | 2006093587 A | 4/2006 |
| JP | 2006108307 A | 4/2006 |
| KR | 20030039114 A | 5/2003 |
| WO | 02058153 A2 | 7/2002 |
| WO | 2004054001 A2 | 6/2004 |
| WO | 2004/068582 A1 | 8/2004 |
| WO | 2005/052893 A1 | 6/2005 |

OTHER PUBLICATIONS

European Search Report (Application No. 07021194.1) dated Mar. 14, 2012, in English.

Office Action dated Mar. 5, 2013 in Japanese Application No. 2007-272016 with English Translation.

* cited by examiner

PRIOR ART

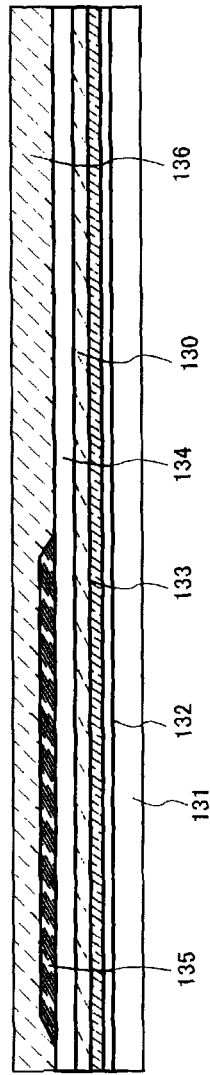
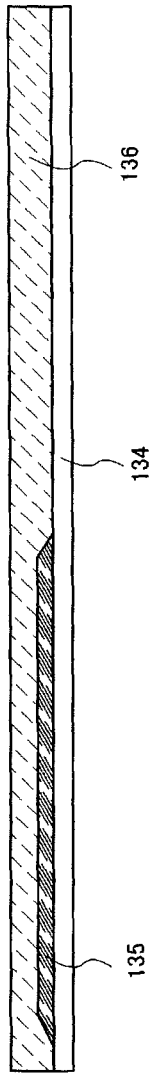
FIG. 3A
FIG. 3B

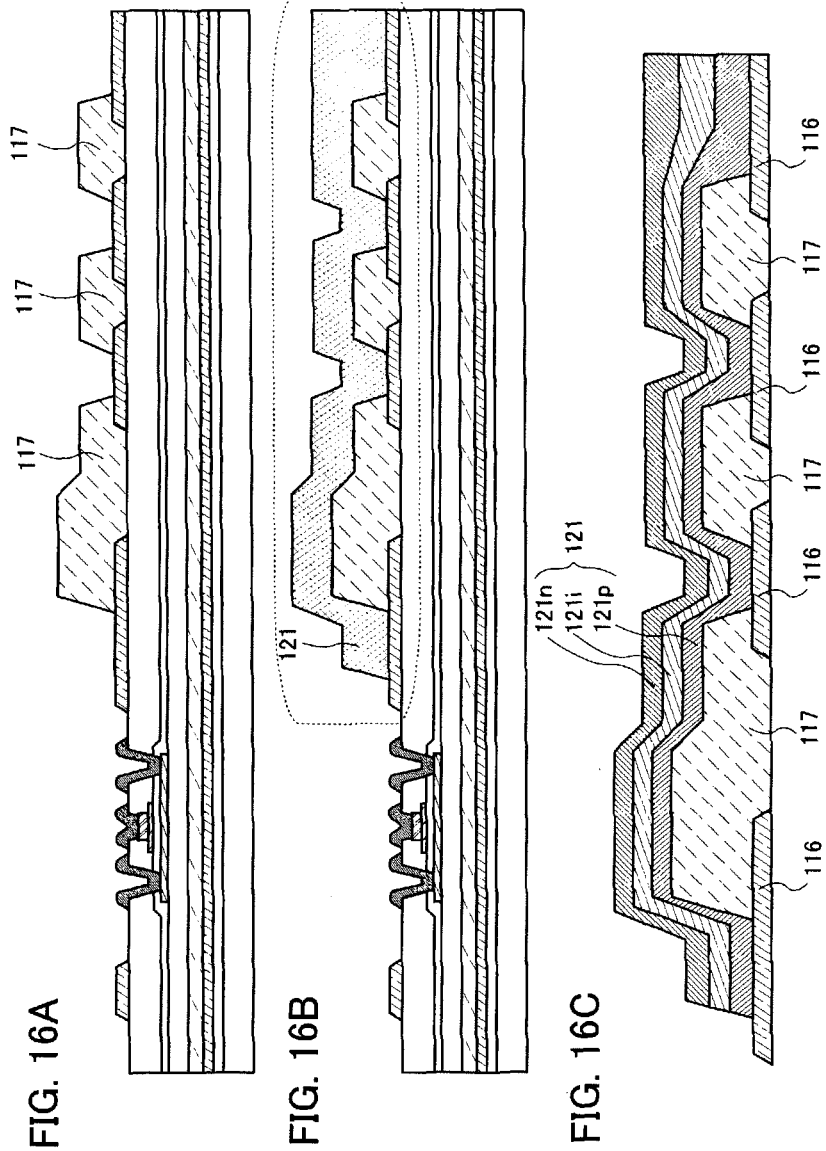

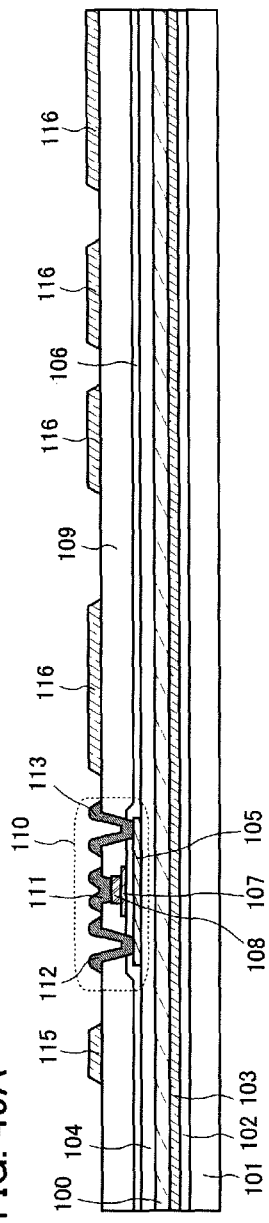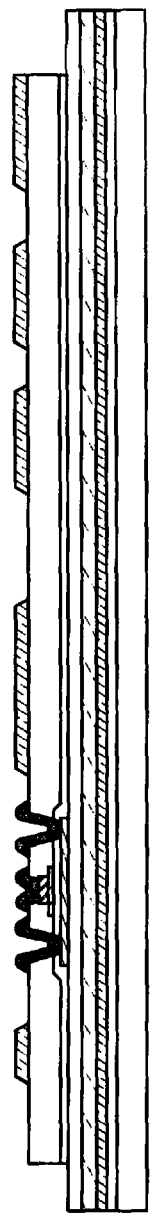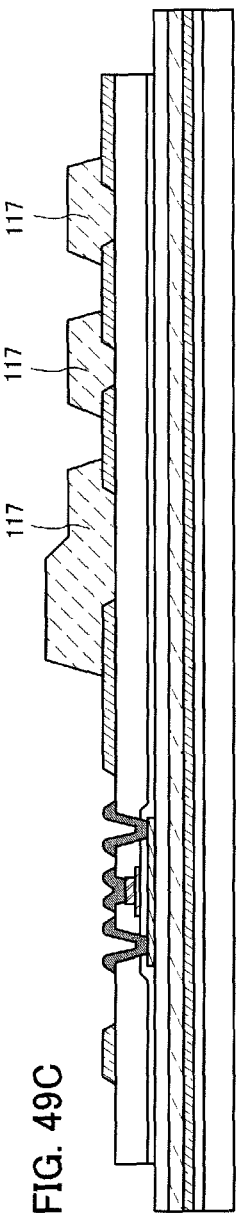
FIG. 49A
FIG. 49B
FIG. 49C

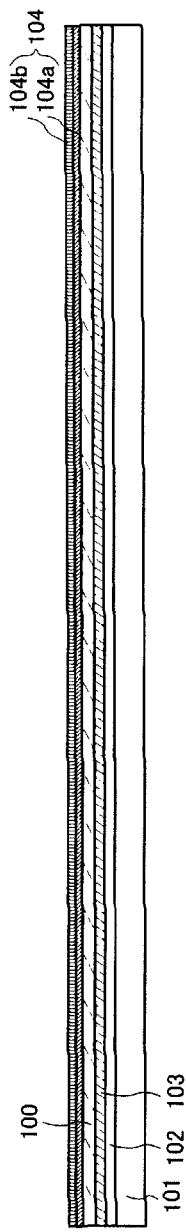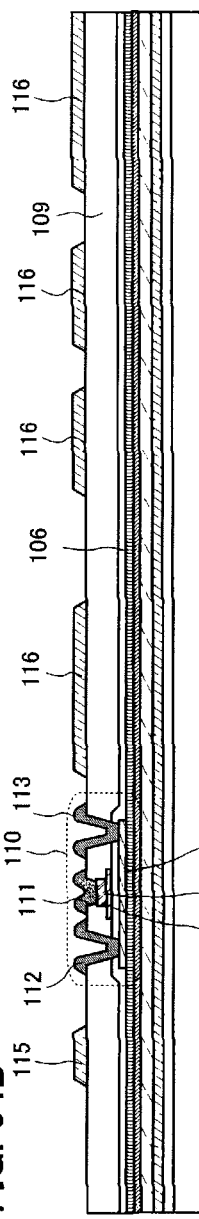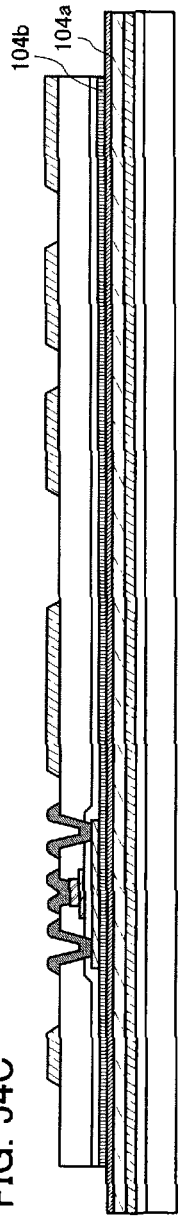
FIG. 54A
FIG. 54B
FIG. 54C

SEMICONDUCTOR DEVICE

BACKGROUND OF THE INVENTION

1. Field of the Invention

The present invention relates to a photoelectric conversion device and a semiconductor device having a photoelectric conversion element. Specifically, the present invention relates to a photoelectric conversion device formed from a thin film semiconductor element and a manufacturing method thereof. Moreover, the present invention relates to an electronic device using a photoelectric conversion device.

2. Description of the Related Art

A number of photoelectric conversion devices generally used for detecting an electromagnetic wave are known, and for example, a photoelectric conversion device having sensitivity to ultra-violet rays to infrared rays is referred to as a light sensor (also referred to as photosensor) in general. A light sensor having sensitivity to light in a visible region with a wavelength of 400 nm to 700 nm is particularly referred to as a visible light sensor, and a large number of visible light sensors are used for devices which need illuminance adjustment or on/off control depending on human living environment.

In particular, in a display device, brightness in the periphery of the display device is detected so as to adjust display luminance thereof. This is done because unnecessary electric-power can be reduced by detecting ambient brightness to obtain appropriate display luminance. For example, such a light sensor for adjusting luminance is used for a cellular phone or a personal computer.

In addition, as well as ambient brightness, luminance of a back light of a display device, particularly, a liquid crystal display device is also detected by a light sensor to adjust luminance of a display screen.

In such a light sensor, a photodiode is used for a sensing part and an output current of the photodiode is amplified in an amplifier circuit. As such an amplifier circuit, for example, a current mirror circuit is used.

FIG. 2A shows a cross-sectional view of a conventional light sensor and a manufacturing method thereof (see Reference 1: PCT International Publication No. 04/068582).

First, a metal film 1102 is formed on a first substrate 1101. A single layer or a laminate formed of an element selected from W, Ti, Ta, Mo, Cr, Nd, Fe, Ni, Co, Zr, Zn, Ru, Rh, Pd, Os, and Ir or an alloy material or a compound material containing the above element as a main component can be used. Alternatively, a single layer or a laminate of nitride thereof may be used. The thickness of the metal film 1102 is 10 nm to 200 nm, preferably 50 nm to 75 nm.

Next, an insulating film 1103 is formed on the metal film 1102. At this time, an amorphous metal oxide film 1100 is formed between the metal film 1102 and the insulating film 1103 with a thickness of about 2 nm to 5 nm. When peeling is performed in a subsequent step, the separation occurs within the metal oxide film 1100, at the interface between the metal oxide film 1100 and the insulating film 1103, or at the interface between the metal oxide film 1100 and the metal film 1102.

As the insulating film 1103, a film is formed of silicon oxide, silicon oxide containing nitrogen, or a metal oxide material by sputtering or plasma CVD. It is desirable that the thickness of the insulating film 1103 be twice the thickness of the metal film 1102 or more, preferably 150 nm to 200 nm.

Next, a film formed of a material containing at least hydrogen is formed on the insulating film 1103. As the film formed of a material containing at least hydrogen, a semiconductor film, a nitride film, or the like can be used. A semiconductor film is formed here. After that, heat treatment for diffusing the hydrogen contained in the film of a material containing at least hydrogen is performed. This heat treatment is performed at a temperature of 410° C. or higher, and may be performed separately from a forming process of a polysilicon film or may be performed as well as for the forming process of a crystalline semiconductor film to reduce the number of steps. For example, in the case where an amorphous silicon film containing hydrogen is used as the material film containing hydrogen and heated to form a polysilicon film, if heat treatment is performed at a temperature of 500° C. or higher for crystallization, diffusion of hydrogen can be performed at the same time as the polysilicon film is formed.

Then, by a known technique, the polysilicon film is etched into a desired shape to form thin film transistors (TFTs) are formed. Each TFT has a polysilicon film 1105 including a source region, a drain region, and a channel forming region, a gate insulating film which covers the polysilicon film 1105, a gate electrode formed on the channel forming region of the polysilicon film 1105, and a source electrode 1107 and a drain electrode 1108 which are connected to the source region and the drain region through an interlayer insulating film 1119. Note that the interlayer insulating film 1119 is formed of a plurality of insulating films which isolate a gate electrode from a source electrode and a drain electrode.

Next, a photoelectric conversion element connected to a source electrode 1107 of a TFT over the interlayer insulating film 1119. Here, a diode is formed as the photoelectric conversion element. First, a first electrode 1110 connected to the source electrode 1107 is formed and then an amorphous silicon film 1111 which is a photoelectric conversion layer and a second electrode 1112 are formed thereon. After that, the amorphous silicon film 1111 and the second electrode 1112 are etched into a desired shape to form the diode. After that, a wiring 1113 connected to the second electrode of the diode is formed and at the same time, a wiring 1114 connected to the drain electrode 1108 and an output terminal is formed.

Then, a second substrate 1115 to be a support for fixing a semiconductor film is attached with an adhesive material 1116. Note that it is preferable that a substrate which is more rigid than the first substrate 1101 is used as the second substrate 1115. Typically, a glass substrate, a quartz substrate, a metal substrate, a ceramic substrate, or a plastic substrate can be used as the second substrate 1115. In addition, an adhesive material made of an organic material is preferably used as the adhesive material 1116. Here, a planarization layer may be formed on a part of the adhesive material. Here, the planarization layer may be formed by applying a water-soluble resin 1116a to an adhesive material formed of an organic material and attaching a member 1116b (hereinafter referred to as a double-sided sheet), each side of which is covered with a reactive peeling adhesive material thereonto thereby attaching the TFT 1104 and the diode (including the electrode 1110, the amorphous silicon film 1111, and the electrode 1112) to the second substrate 1115. Using the attachment method, a subsequent separation process can be carried out with relatively weak force. As the adhesive material made of an organic material, a variety of peeling adhesive materials such as a reactive peeling adhesive material, a heat peeling adhesive material, a light-peeling adhesive material such as a UV peeling adhesive material, and an anaerobic peeling adhesive material can be given.

In FIG. 2B, the first substrate 1101 and the metal film 1102 formed thereover are collectively referred to as a release body 1150. Further, layers from the insulating film 1103 to the wiring 1113 connected to the second electrode of the diode and a wiring 1114 connected to an external terminal of the diode are collectively referred to as a stack body 1151.

Next, the metal film 1102 over the first substrate 1101 is peeled from the insulating film 1103 by a physical means. Physical force is relatively low force, for example, load using a member having a sharp end of a wedge shape or the like, wind pressure of gas blown from a nozzle, or ultrasonic waves. Separation occurs within the metal oxide film 1100, at the interface between the insulating film 1103 and the metal oxide film 1100, or at the interface between the metal oxide film 1100 and the metal film 1102, so that the stack body 1151 and the release body 1150 are torn off from each other with relatively low force. Thus, the stack body 1151 can be detached from the release body 1150.

Then, a third substrate 1117 and the insulating film 1103 (that is the stack body 1151) are bonded with a bonding material 1118 as shown in FIG. 2C. As the third substrate 1117, a plastic substrate or a member formed of an organic resin is used. It is preferable that a plastic substrate made of PET (polyethylene terephthalate), PEN (polyethylene naphthalate), PES (polyether sulfone), polypropylene, polypropylene sulfide, polyearbonate, polyetherimide, polyphenylene sulfide, polyphenylene oxide, polysulfone, or polyphthalamide is used as the plastic substrate.

It is important that the bonding material 1118 is a material having a higher adhesiveness between the stack body 1151 including the insulating film 1103 and the third substrate 1117 than the adhesiveness between the second substrate 1115 and the stack body 1151 that is a separation layer, of the adhesive material 1116 formed of an organic material.

As the bonding material 1118, various kinds of curable bonding materials such as a reactive curable bonding material, a heat-curable bonding material, a light-curable bonding material such as a UV-curable bonding material, and an anaerobic curable bonding material can be used.

Alternatively, an adhesive material may be provided on the insulating film 1103 instead of performing the above steps. In this case, a release paper (a release liner, that is, a separator or the like, in which a sheet having a separation surface on one or each substrate surface) may be provided so that the adhesive material does not adhere to other members. When a release liner is peeled, the adhesive material can adhere to any member; therefore, a substrate is not required and in addition, a thin semiconductor device can be provided.

Next, as shown in FIG. 2D, the adhesive material 1116 and the second substrate 1115 are separated from the stack body 1151. The adhesive material 1116 made of an organic material is subjected to thermal reaction, photoreaction, reaction to humidity, or chemical reaction (adhesion is decreased using for example, water, oxygen, or the like), and then the adhesive material 1116 and the second substrate 1115 are separated from the stack body 1151 formed from an organic material.

Through the above steps, as shown in FIG. 2E, a semiconductor device having a TFT formed from a polysilicon film and an element formed from an amorphous silicon film over a plastic substrate can be formed.

SUMMARY OF THE INVENTION

Note that in the structure shown in FIG. 2A to FIG. 2E, a color filter is necessarily formed through another process, so that the number of manufacturing steps and manufacturing cost would increase.

As described above, light sensors are used for a variety of applications. For example, liquid crystal display devices are widely spread as displays for monitors of still cameras or video cameras in addition to televisions, and a display capable of expanding a color reproduction range to produce right color is demanded. In order to expand the color reproduction range, it is said that a backlight using a cold cathode fluorescent lamp or a light emitting diode is necessarily controlled precisely to be lit.

The light sensor is used as a key device for correcting a backlight. In this case, when the light sensor is incorporated with a backlight and the like as a unit, it is necessary that the light sensor is compact and thin so as not to be an obstacle and has a function of color correction.

It is an objective of the present invention to obtain a device in which a photoelectric conversion device having a photoelectric conversion element and a circuit for driving it are formed over a substrate separately from a color filter on another substrate, and at least one of them is separated and attached to each other, to be lightweight and thin, and preferably flexible.

The present invention relates to a semiconductor device including a first element including a photodiode and an amplifier circuit which amplifies output current of the photodiode, over a first insulating film; and a second element including a color filter and an overcoat layer over the color filter over a second insulating film. The first element and the second element are attached to each other by bonding the first insulating film and the second insulating film with a bonding material.

Further, the present invention relates to a semiconductor device including a first element including a photodiode and an amplifier circuit which amplifies output current of the photodiode, over an insulating film; and a second element including a color filter and an overcoat layer over the color filter, over a substrate. The first element and the second element are attached to each other by bonding the insulating film and the overcoat layer with a bonding material.

Further, the present invention relates to a semiconductor device including a first element including a photodiode and an amplifier circuit which amplifies output current of the photodiode, over a substrate; and a second element including a color filter and an overcoat layer over the color filter, over an insulating film. The first element and the second element are attached to each other by bonding the substrate and the insulating film with a bonding material.

Further, the present invention relates to a semiconductor device including an element including a photodiode and an amplifier circuit which amplifies output current of the photodiode, over an insulating film; and a color film which is bonded to the insulating film with a bonding material.

In the present invention, the amplifier circuit is a current mirror circuit including a thin film transistor.

Further, in the present invention, the bonding material is a reactive curable bonding material, a heat-curable bonding material, a light-curable bonding material or an anaerobic curable bonding material.

Note that, in this specification, a semiconductor device refers to a device having a semiconductor layer, and a whole device including elements each having a semiconductor layer is also referred to as a semiconductor device.

In accordance with the present invention, lightweight, thin, and flexible photoelectric conversion devices and semiconductor devices can be obtained. Further, in accordance with the present invention, manufacturing cost is reduced, and miniaturized photoelectric conversion devices and semiconductor devices can be manufactured.

BRIEF DESCRIPTION OF THE DRAWINGS

In the accompanying drawings:

FIGS. 3A and 3B are cross-sectional views illustrating manufacturing steps of a semiconductor device of the present invention;

FIGS. 16A to 16C are cross-sectional views each illustrating a manufacturing step of a semiconductor device of the present invention;

FIGS. 49A to 49C are cross-sectional views illustrating manufacturing steps of a semiconductor device of the present invention;

FIGS. 54A to 54C are cross-sectional views illustrating manufacturing steps of a semiconductor device of the present invention;

DETAILED DESCRIPTION OF THE INVENTION

Figure 1:
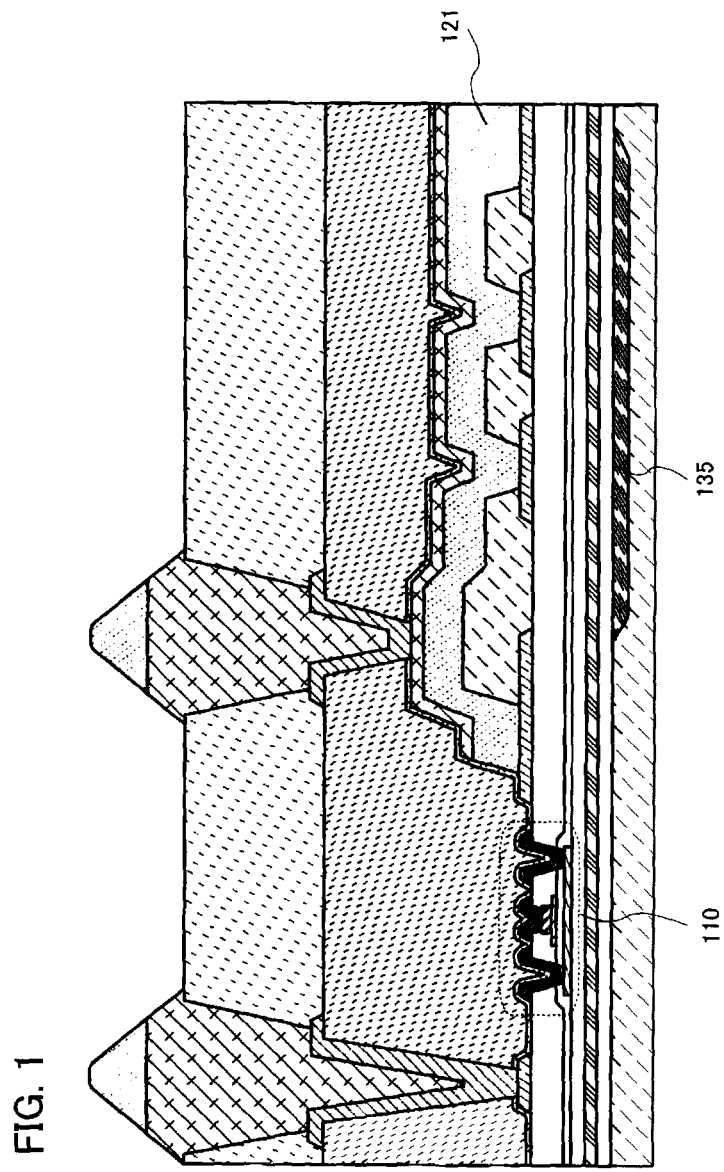
FIG. 1 is a cross-sectional view of a semiconductor device of the present invention.
Figure 2A:
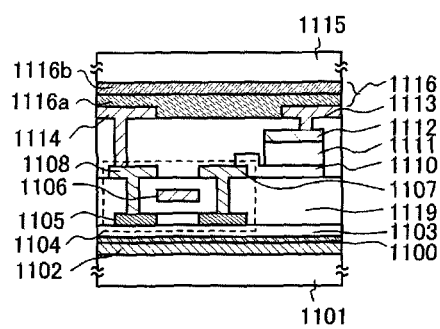
FIGS. 2A to 2E are cross-sectional views of a conventional semiconductor device.
Figure 2D:
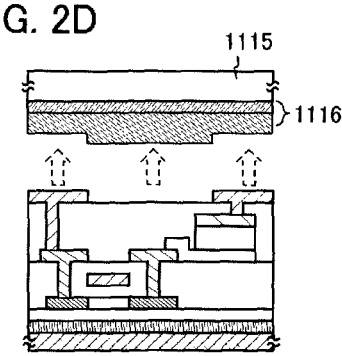
Figure 2B:
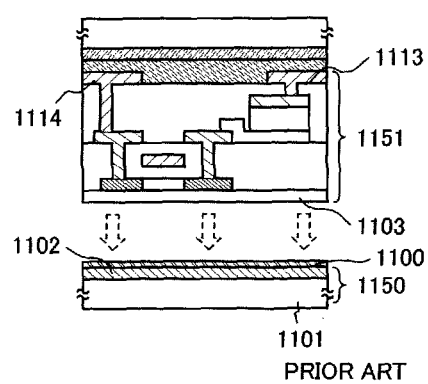
Figure 2E:
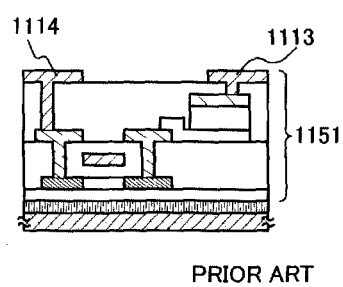
Figure 2C:
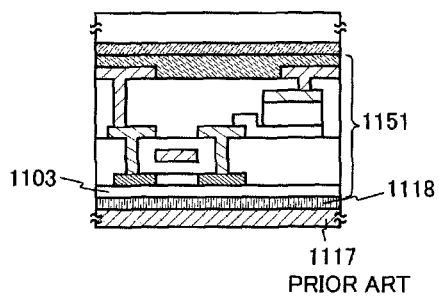

Embodiment Modes of the present invention will be described below with reference to the drawings.

Note that the present invention can be implemented in different modes, and it is easily understood by those skilled in the art that the mode and details can be variously modified without departing from the spirit and scope of the present invention. Therefore, the invention is should not be construed as being limited to the description of the embodiment modes.

Note that throughout the drawings for describing the embodiment modes of the present invention, like portions or portions having like functions are denoted by like reference numerals, and description of them will not be repeated.

Embodiment Mode 1

This embodiment mode will be described below with reference to FIG. 1, FIGS. 3A and 3B, FIGS. 10A to 10D, FIG. 11, FIGS. 12A and 12B, FIG. 13, FIG. 14, FIG. 15, FIGS. 16A to 16C, FIGS. 17A and 17B, FIG. 18, FIG. 19, FIG. 20, FIG. 21, FIG. 22, FIG. 23, FIG. 24, FIG. 25, and FIG. 45.

First, an insulating film 102 is formed over a substrate 101. As the substrate 101, one of a glass substrate, a quartz substrate, a ceramics substrate, a silicon substrate, a metal substrate, or a stainless-steel substrate, and the like can be used. In this embodiment mode, a glass substrate is used as the substrate 101.

As the insulating film 102, a film may be formed of silicon oxide, silicon oxide containing nitrogen, silicon nitride, silicon nitride containing oxygen, or a metal oxide material by sputtering or plasma CVD.

A metal film 103 is formed over the insulating film 102. As the metal film 103, a single layer formed of an element selected from W, Ti, Ta, Mo, Cr, Nd, Fe, Ni, Co, Zr, Zn, Ru, Rh, Pd, Os, or Ir, or an alloy material or a compound material which contain the element as a main component; a laminate thereof; a single layer or a laminate of a nitride thereof may be used. The thickness of the metal film 103 is 10 nm to 200 nm, preferably 25 nm to 75 nm.

Next, an insulating film 104 is formed on the metal film 103. At this time, an amorphous metal oxide film 100 is formed with a thickness of about 2 nm to 5 nm between the metal film 103 and the insulating film 104 (See FIG. 10A). When peeling is performed in a subsequent step, the separation occurs within the metal oxide film 100, at the interface between the metal oxide film 100 and the insulating film 104, or at the interface between the metal oxide film 100 and the metal film 103. As the insulating film 104, a film is formed of silicon oxide, silicon oxide containing nitrogen, silicon nitride, silicon nitride containing oxygen, or a metal oxide material by sputtering or plasma CVD. It is desirable that the thickness of the insulating film 104 be twice the thickness of the metal film 103 or more, preferably 150 nm to 200 nm.

Next, a film formed of a material containing at least hydrogen is formed on the insulating film 104. As the film formed of a material containing at least hydrogen, a semiconductor film, a nitride film, or the like can be used. A semiconductor film is formed in this embodiment mode. After that, heat treatment for diffusing the hydrogen contained in the film formed of a material containing at least hydrogen is performed. This heat treatment is performed at a temperature of 410° C. or higher, and may be performed separately from the process of forming a polysilicon film or may also be performed in the process of forming a crystalline semiconductor film to reduce the number of steps.

In this embodiment mode, in order to perform heat treatment for diffusing hydrogen and formation of a semiconductor film to be an active layer at the same time, an amorphous semiconductor film containing hydrogen as a material film containing hydrogen, for example, an amorphous silicon film, which contains hydrogen is formed and heated to form a crystalline semiconductor film, for example, a polycrystalline silicon film. Here, if heat treat at 500° C. or more is performed to crystallize an amorphous semiconductor film, a crystalline semiconductor film is formed and hydrogen is diffused at the same time.

Needless to say, heat treatment for diffusing hydrogen may be carried out in a step different from the formation of the semiconductor layer to be an active layer. In that case, a material film containing hydrogen is formed and heated, and a semiconductor film to be an active layer may be formed thereover. The semiconductor film to be an active layer may be obtained by forming an amorphous semiconductor film and then crystallizing it or may be formed by forming a crystalline semiconductor film from the start.

Next, a semiconductor island film 105 is formed by etching the crystalline semiconductor film into an island shape by a known technique.

Figure 10:
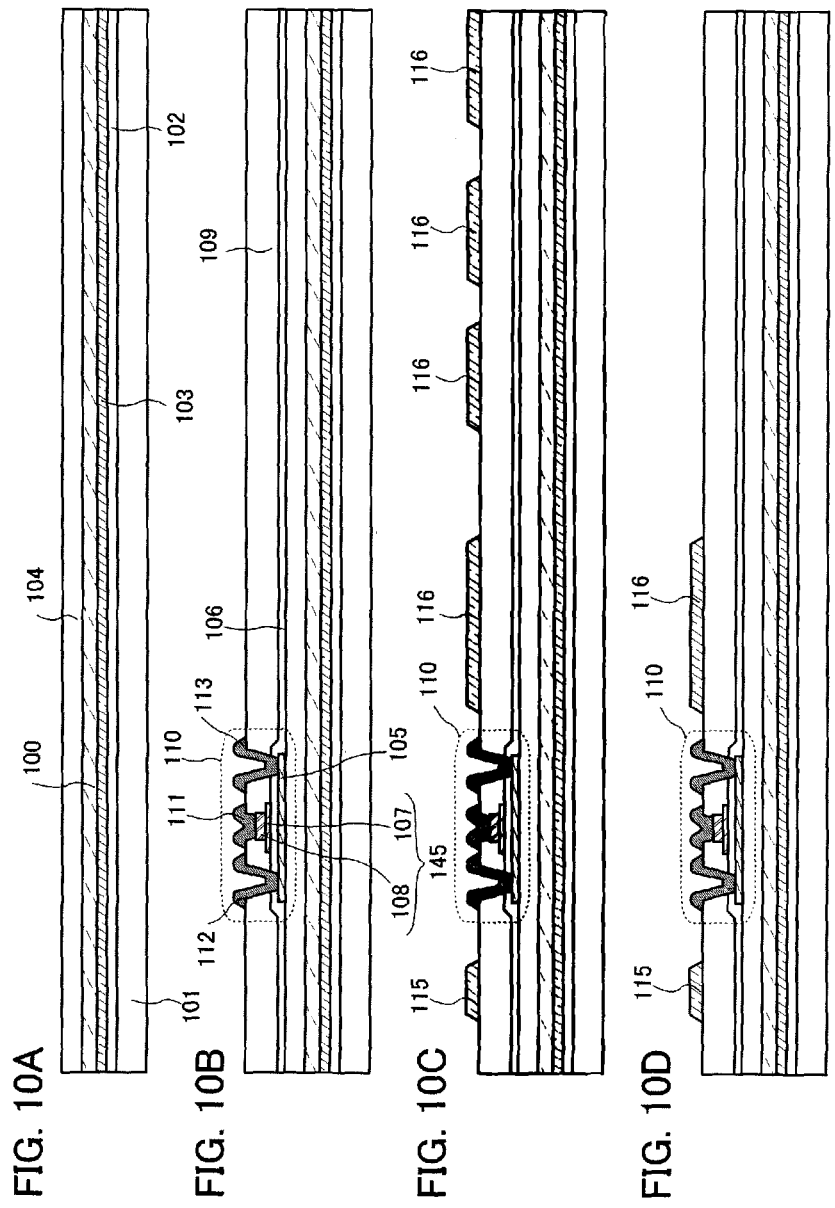
FIGS. 10A to 10D are cross-sectional views illustrating manufacturing steps of a semiconductor device of the present invention.

In the semiconductor island film 105, a source region, a drain region, and a channel formation region are formed. In addition, a gate insulating film 106 covering the semiconductor island film 105, a lower gate electrode 107 and an upper gate electrode 108 which are formed over channel formation regions of the semiconductor island film 105 are provided. In FIG. 10B, the gate electrode has a two layer structure of the lower gate electrode 107 and the upper gate electrode 108; alternatively, a gate electrode having a single layer structure may be manufactured. Note that although not shown, the lower gate electrode 107 and the upper gate electrode 108 are collectively used as a gate electrode 145. As described above, a TFT 110 is formed.

Note that in this embodiment mode, the TFT 110 is a top gate TFT; however a bottom gate TFT may be formed instead. Further, a single gate TFT having one channel formation region or a multi-gate TFT having a plurality of channel formation regions may be formed.

An interlayer insulating film 109 is formed to cover the gate electrode 145 having the lower gate electrode 107 and the upper gate electrode 108, and the gate insulating film 106.

Note that the interlayer insulating film 109 may be a single layer insulating film or a laminate of insulating layers made of different materials.

Over the interlayer insulating film 109, a source electrode 112 and a drain electrode 113 which are electrically connected to the source region and the drain region in the semiconductor island film 105 are formed. In addition, a gate wiring 111 electrically connected to the gate electrode 145 is formed (See FIG. 10B).

Figure 11:
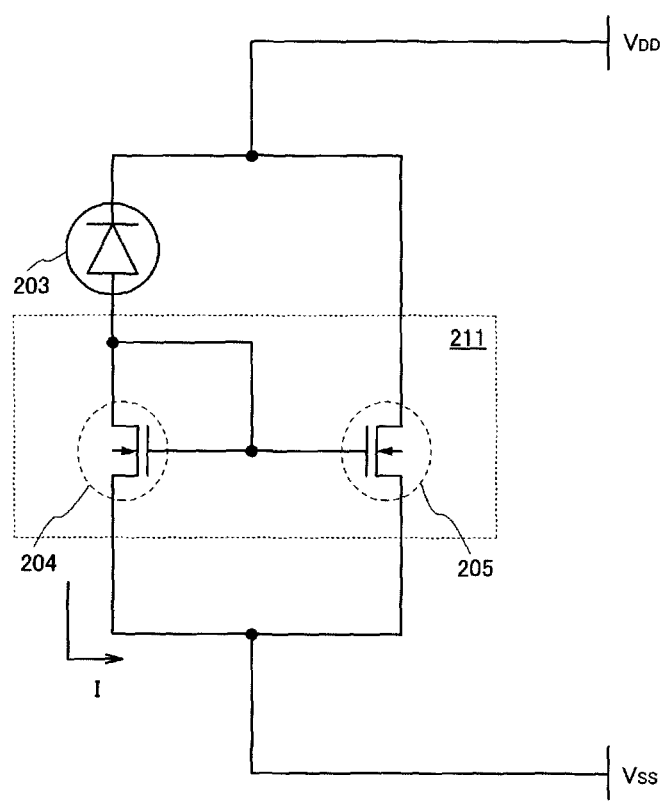
FIG. 11 is a circuit diagram of a semiconductor device of the present invention.

Note that through steps up to and including the step shown in FIG. 10B, only one TFT is shown. However, the TFT 110 is a TFT forming an amplifier circuit which amplifies photocurrent obtained in the photoelectric conversion layer 121, for example, a current mirror circuit, so that at least two transistors are formed. FIG. 11 shows a circuit configuration of a photodiode 203 having the photoelectric conversion layer 121 and a current mirror circuit 211 including a TFT 204 and a TFT 205. The TFT 110 in FIG. 10B is either the TFT 204 or the TFT 205.

In FIG. 11, a gate electrode of the TFT 204 forming the current mirror circuit 211 is electrically connected to a gate electrode of the TFT 205 which is another TFT forming the current mirror circuit 211, and further electrically connected to a drain electrode (also referred to as "drain terminal") which is one of the source electrode and drain electrode of the TFT 204.

The drain terminal of the TFT 204 is electrically connected to the photodiode 203, the drain terminal of the TFT 205, and the high potential power supply $V_{DD}$.

The source electrode (also referred to as "source terminal") of the TFT 204 which is the other of the source electrode and drain electrode is electrically connected to the low potential power supply $V_{SS}$ and a source terminal of the TFT 205.

Further, the gate electrode of the TFT 205 forming the current mirror circuit 211 is electrically connected to the gate electrode and the drain terminal of the TFT 204.

Further, the gate electrodes of the TFT 204 and TFT 205 are connected to each other, so that a common potential is applied thereto.

FIG. 11 illustrates an example of a current mirror circuit having two TFTs. Provided that the TFTs 204 and 205 have the same characteristics, the ratio of a reference current to an output current is 1:1.

Figure 12A:
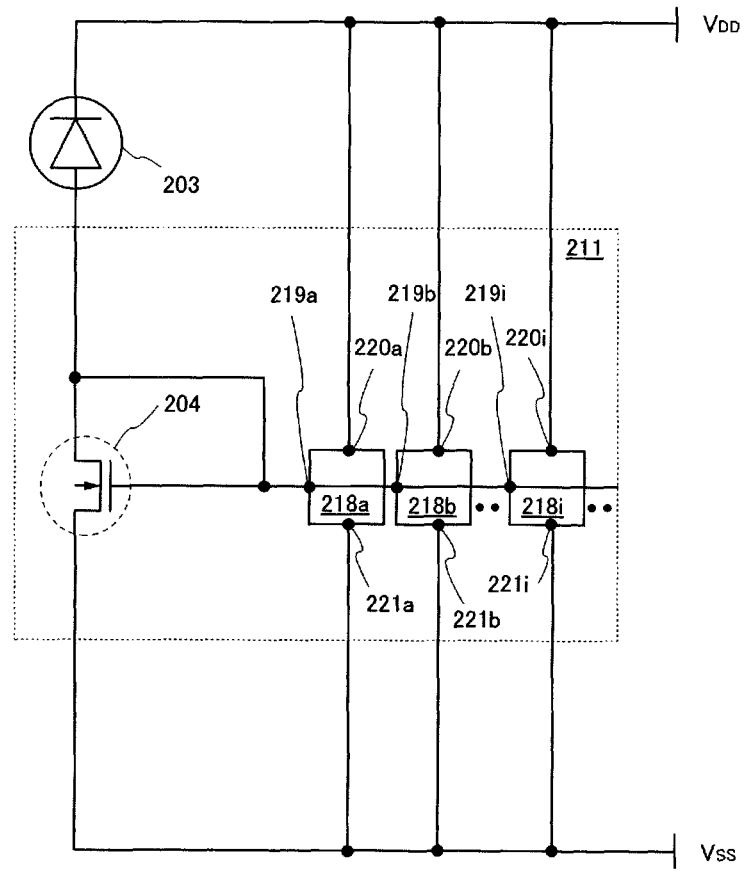
FIGS. 12A and 12B are circuit diagrams of a semiconductor device of the present invention.
Figure 12B:
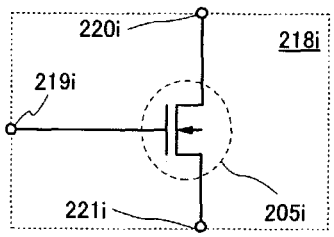

FIGS. 12A and 12B illustrate circuit configurations with which an output value can be increased n times. The circuit configuration of FIGS. 12A and 12B correspond to the configuration of n TFTs 205 in FIG. 11 are provided. When the ratio of the TFT 204 to the TFTs 205 is set at 1: n as shown in FIGS. 12A and 12B, the output value can be increased n times. This serves the same principle as a configuration in which the channel width W of a TFT is increased so as to increase the limit of the current flow through the TFT n times.

For example, in order to increase an output value 100 times as large, the desired current can be obtained by connecting one TFT 204 and 100 TFTs 205 in parallel.

FIG. 12B shows a specific circuit configuration of a circuit 218i (e.g., circuits 218a, 218b, and the like) shown in FIG. 12A.

The circuit configuration of FIG. 12B is based on the circuit configurations of FIGS. 11 and 12A, and components that are common to FIGS. 11, 12A, and 12B are denoted by like reference numerals. A gate electrode of a TFT 205i (205a, 205b, . . . 205i) is electrically connected to a terminal 219i (219a, 219b, . . . 219i) and is further electrically connected to a terminal 220i (220a, 220b, . . . 220i), and a source terminal of the TFT 205i is electrically connected to a terminal 221i (221a, 221b, . . . 221i).

In order to explain the circuits 218a and 218b, and the like in FIG. 12A, one of them, i.e., the circuit 218i is shown as a representative example in FIG. 12B. Since the circuit 218i is based on the circuit configuration of FIG. 11, reference numerals with "i" in FIGS. 12A and 12B denote the same components as those without "i" in FIG. 11. That is, the TFT 205 in FIG. 11 and the TFT 205i in FIG. 12B, for example, are the same TFTs.

Therefore, the TFT 205 corresponds to n (a, b, . . . i) TFTs 205i, and the like in FIG. 12A. Accordingly, a current flow through the TFT 204 can be amplified n times to be output.

Note that components that are common to FIGS. 11, 12A, and 12B are denoted by common reference numerals.

In addition, although FIG. 11 illustrates an equivalent circuit of the current mirror circuit 211 using n-channel TFTs, the n-channel TFTs may be replaced with p-channel TFTs.

Figure 13:
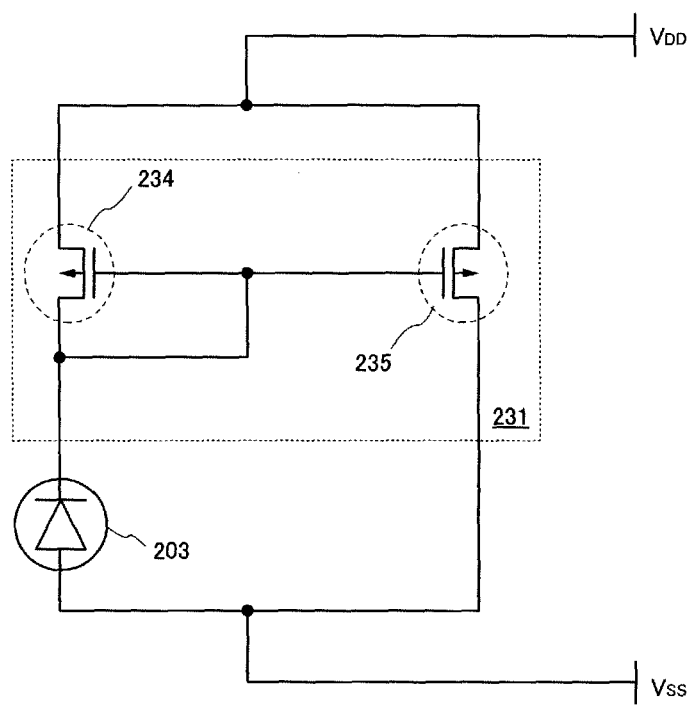
FIG. 13 is a circuit diagram of a semiconductor device of the present invention.

When the amplifier circuit is formed from p-channel TFTS, an equivalent circuit shown in FIG. 13 is obtained. As shown in FIG. 13, a current mirror circuit 231 includes p-channel TFTs 234 and 235. Note that components common to FIGS. 11 to 13 are denoted by common reference numerals.

After the TFT 110 is manufactured as described above, electrodes 115 and 116 are formed over the interlayer insulating film 109. FIG. 10C shows a plurality of electrodes 116, whereas only one electrode 116 is formed in FIG. 10D.

Note that in this embodiment mode, the electrodes 115 and 116 are formed using a titanium film by depositing titanium (Ti) to a thickness of 400 nm.

Note that the electrodes 115 and 116 may be formed through the same steps as the source electrode 112 and drain electrode 113.

Figure 14:
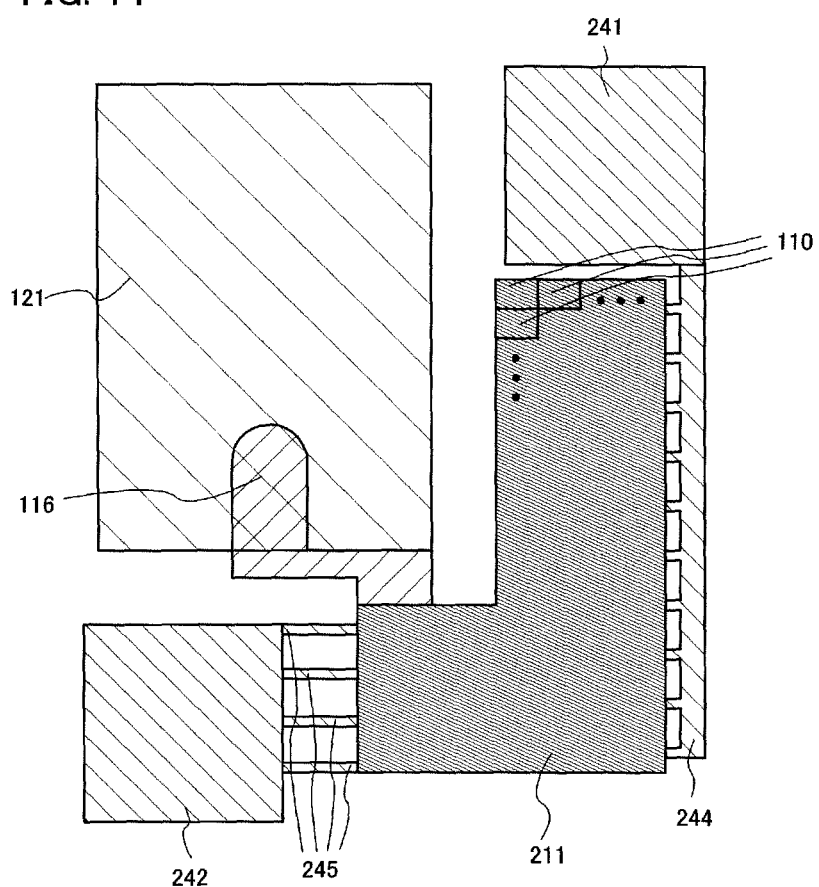
FIG. 14 is a top view of a semiconductor device of the present invention.
Figure 15:
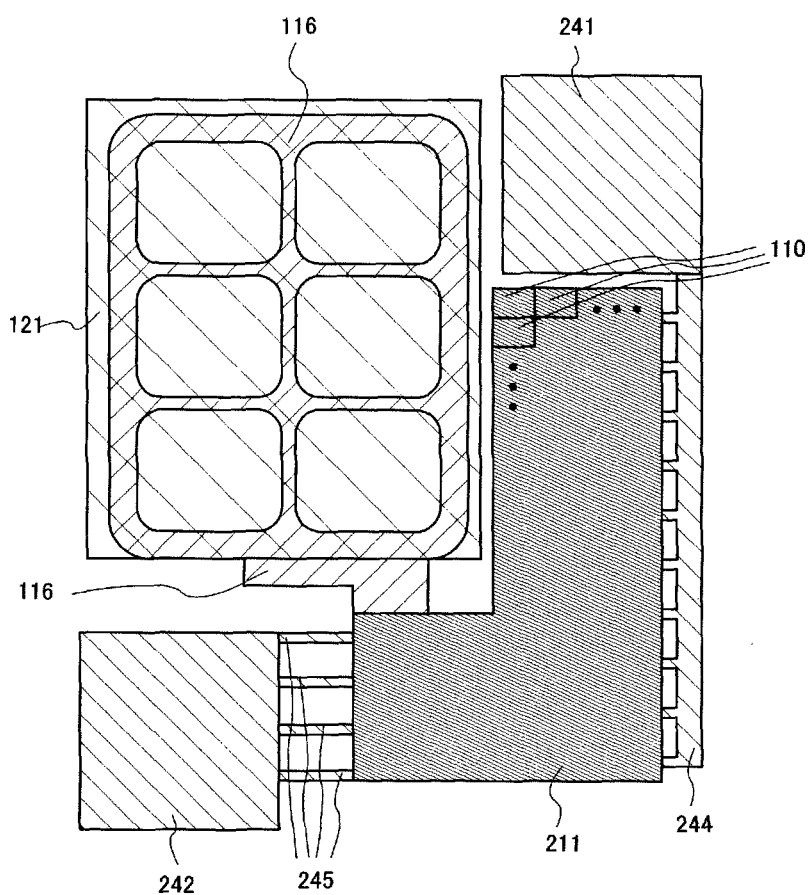
FIG. 15 is a top view of a semiconductor device of the present invention.

FIG. 15 illustrates a top view of the electrode 116 and the periphery thereof in FIG. 10C. FIG. 14 illustrates a top view of the electrode 116 and the periphery thereof in FIG. 10D.

In FIG. 15, the electrode 116 is a grid electrode, and a plurality of parts of it is connected to a photoelectric conversion layer 121 which is formed through steps to be later described. Therefore, when a cross section of the electrode 116 is viewed, as shown in FIG. 10C, a plurality of electrodes seem to be formed; however, actually the electrodes 116 electrodes are manufactured of the same material through the same steps. When the electrodes 116 are formed in a grid pattern as shown in FIG. 15, it is advantageous that the resistance value of the photoelectric conversion layer 121 is lowered.

Further, in FIG. 14, since the electrode 116 is an electrode having a rectangular shape with round ends, when the cross section of it is viewed, only one electrode 116 seems to be formed as shown in FIG. 10D.

Note that in FIG. 14 and FIG. 15, the electrode 116 is electrically connected to the current mirror circuit 211. The current mirror circuit 211 has two to (n+1) TFTs 110.

Specifically, as described above, when the ratio of reference current to output current of 1:1 is desired, one each of a reference TFT and an output TFT may be formed as shown in the circuit diagram of FIG. 11. Further, when the ratio of reference current to output current of 1:n is desired, one reference TFT and n number of output TFTs may be formed. Circuit diagrams of those cases are shown in FIG. 12A and FIG. 12B.

The current mirror circuit 211 is electrically connected to a connection electrode 241 connected to a high potential power supply $V_{DD}$ through a wiring 244, and further electrically connected to a connection electrode 242 connected to a low potential power supply $V_{SS}$ through a wiring 245.

Next, as shown in FIG. 16A, an overcoat layer 117 is provided over the electrode 116 and the interlayer insulating film 109. Note that FIG. 16A illustrates a structure in which the overcoat layer 117 is additionally formed in the structure shown in FIG. 10C; however, the structure in FIG. 10D may also be used naturally.

The overcoat layer 117 has a function of improving the shape of the photoelectric conversion layer 121 by sloping the ends of the overcoat layer 117 so that a p-type semiconductor layer 121p is not shorted to an n-type semiconductor layer 121n, a function of suppressing mixing of contaminants into the photoelectric conversion layer 121, and a function of adjusting light which enters the photoelectric conversion layer 121. Further, the overcoat layer 117 may be formed of a light-transmitting insulating material. For example, an organic resin material such as acrylic or polyimide, or an inorganic material such as silicon nitride, silicon oxide, silicon oxide containing nitrogen, or silicon nitride containing oxygen can be used. Moreover, a layered film in which those materials are stacked can be used to form the overcoat layer 117. In this embodiment mode, polyimide is used for the overcoat layer 117.

Next, a p-type semiconductor film, an i-type semiconductor film, and an n-type semiconductor film are formed over the electrode 116 and the overcoat layer 117, and etched to form the photoelectric conversion layer 121 having the p-type semiconductor layer 121p, the i-type semiconductor layer 121i, and the n-type semiconductor layer 121n (See FIG. 16B and FIG. 16C). Note that a magnified view of the region surrounded by the dotted lines in FIG. 16B is shown in FIG. 16C.

The p-type semiconductor layer 121p may be formed by depositing an amorphous semiconductor film containing an impurity element of Group 13, e.g., boron (B) by plasma CVD.

In FIG. 16B and FIG. 16C, the electrode 116 is in contact with the bottom layer of the photoelectric conversion layer 121, i.e., the p-type semiconductor layer 121p in this embodiment mode.

After the formation of the p-type semiconductor layer 121p, the i-type semiconductor layer 121i and the n-type semiconductor layer 121n are sequentially formed. Accordingly, the photoelectric conversion layer 121 having the p-type semiconductor layer 121p, the i-type semiconductor layer 121i, and the n-type semiconductor layer 121n are formed.

The i-type semiconductor layer 121i may be formed by depositing an amorphous semiconductor film by plasma CVD, for example. The n-type semiconductor layer 121n may be formed either by depositing an amorphous semiconductor film containing an impurity element of Group 15, e.g., phosphorus (P) or by depositing an amorphous semiconductor film and doping the film with an impurity element of Group 15.

Note that an amorphous silicon film, an amorphous germanium film, or the like may be used as the amorphous semiconductor film.

Note that in this specification, an i-type semiconductor film refers to a semiconductor film in which the concentration of an impurity which imparts p-type or n-type conductivity is $1 \times 10^{20}$ cm$^{-3}$ or less, and the concentration of oxygen and nitrogen is $5 \times 10^{19}$ cm$^{-3}$ or less, and the dark conductivity against light conductivity is 100 times or more. Further, 10 ppm to 1000 ppm of boron (B) may be added to the i-type semiconductor film.

Further, other than an amorphous semiconductor film, a microcrystalline semiconductor film (also referred to as a semiamorphous semiconductor film) may be used as the p-type semiconductor layer 121p, the i-type semiconductor layer 121i, and the n-type semiconductor layer 121n.

Alternatively, the p-type semiconductor layer 121p and the n-type semiconductor layer 121n may be formed using a microcrystalline semiconductor film, and the i-type semiconductor layer 121i may be formed using an amorphous semiconductor film.

The semiamorphous semiconductor film is a film containing a semiconductor with an intermediate structure between an amorphous semiconductor and a semiconductor film having a crystal structure (including a single crystal structure and a polycrystalline structure). The semiamorphous semiconductor film is a semiconductor film having a third condition that is stable in term of free energy and is a crystalline substance having a short-range order and lattice distortion. A crystal grain thereof can be dispersed in the non-single crystal semiconductor film by setting a grain size thereof to be 0.5 nm to 20 nm. Raman spectrum thereof is shifted toward lower wave number than 520 cm$^{-1}$. The diffraction peaks of (111) and (220), which are thought to be derived from a Si crystal lattice, are observed in the semiamorphous semiconductor film by X-ray diffraction. Hydrogen or halogen of at least 1 atomic % or more is contained in the semiamorphous semiconductor film for terminating a dangling bond. In this specification, such a semiconductor film is referred to as a semiamorphous semiconductor (SAS) film for the sake of convenience. The lattice distortion is further extended by adding a rare gas element such as helium, argon, krypton, and neon so that the favorable semiamorphous semiconductor film with improved stability can be obtained. It is to be noted that a microcrystal semiconductor film is also included in a semiamorphous semiconductor film.

An SAS film can be obtained by glow discharge decomposition of a gas containing silicon. $SiH_4$ is a typical gas containing silicon, and additionally, $Si_2H_6$, $SiH_2Cl_2$, $SiHCl_3$, $SiCl_4$, $SiF_4$, or the like can be used. An SAS film can be easily formed by using the gas containing silicon diluted with hydrogen or gas in which one or more of rare gas elements selected from helium, argon, krypton, and neon is/are added to hydrogen. The gas containing silicon is preferably diluted with a 2 to 1000 fold dilution factor. In addition, a carbide gas such as $CH_4$ or $C_2H_6$; a germanide gas such as $GeH_4$ and $GeF_4$; $F_2$; and the like may be mixed into the gas containing silicon to adjust the width of an energy band at 1.5 eV to 2.4 eV or 0.9 eV to 1.1 eV.

Note that in this specification, the photoelectric conversion layer 121, photodiode 203 including the photoelectric conversion layer 121, and also an element having the photodiode 203 are referred to as a photoelectric conversion element, or a photoelectric conversion device.

Next, an auxiliary electrode 122 is formed on the top face of the photoelectric conversion layer 121. The auxiliary electrode 122 may be formed only when the resistance of the photoelectric conversion layer 121 is high, and if the resistance of the photoelectric conversion layer 121 is low, the auxiliary electrode 122 is not required to be formed. In this embodiment mode, as the auxiliary electrode 122, titanium (Ti) is formed to a thickness of 20 nm to 30 nm.

Further, after the p-type semiconductor film, the i-type semiconductor film, and the n-type semiconductor film are formed, a conductive film to be the auxiliary electrode 122 is formed, and then the conductive film is etched to form the auxiliary electrode 122. Further, the photoelectric conversion layer 121 may be formed by etching the p-type semiconductor film, the i-type semiconductor film, and the n-type semiconductor film.

Figure 17A:
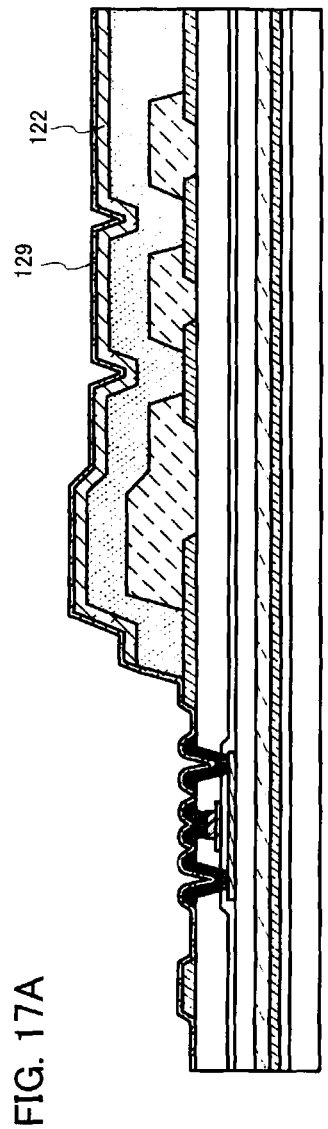
FIGS. 17A and 17B are cross-sectional views illustrating manufacturing steps of a semiconductor device of the present invention.
Figure 17B:
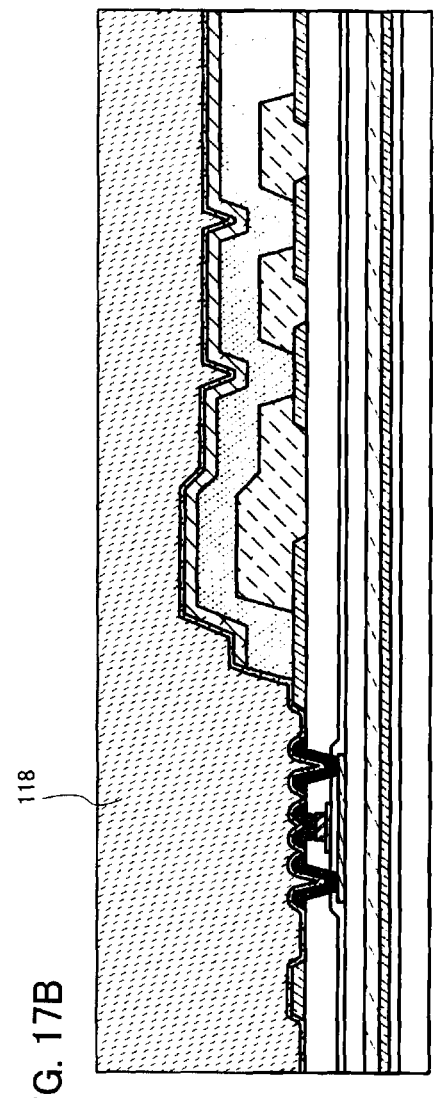
Figure 18:
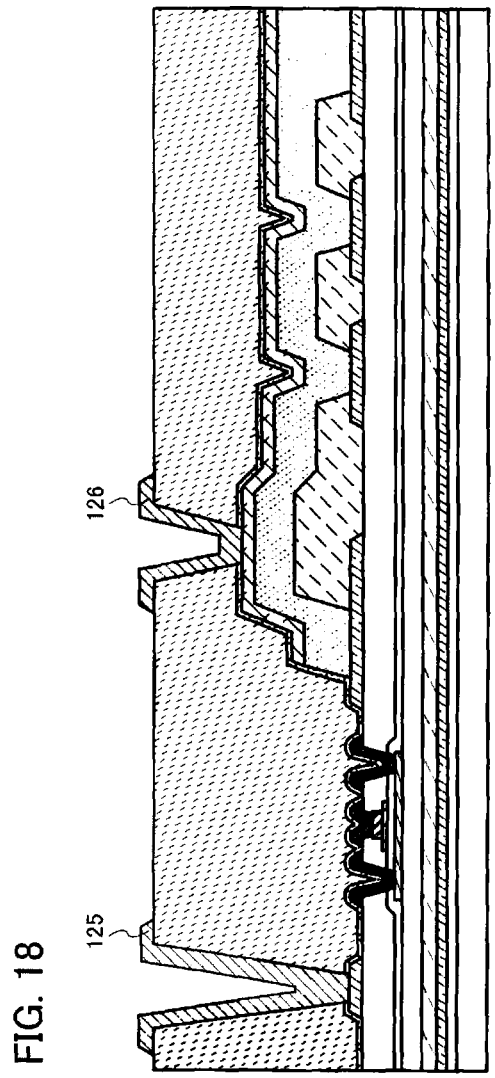
FIG. 18 is a cross-sectional view illustrating a manufacturing step of a semiconductor device of the present invention.

Next, a protective film 129 is formed to cover an exposed surface (See FIG. 17A). As the protective film 129, in this embodiment mode, a silicon nitride film is used. The protective film 129 is for protecting the gate wiring 111, source electrode 112, and drain electrode 113 of the TFT 110 so as not to be etched when an interlayer insulating film 118 in a later step.

Next, the interlayer insulating film 118 is formed over the protective film 129. The interlayer insulating film 118 also serves as a planarization film. In this embodiment mode, polyimide is formed to a thickness of 2 μm as the interlayer insulating film 118.

Next, the interlayer insulating film 118 is etched to form contact holes. At that time, because of the presence of the protective film 129, the gate wiring 111, source electrode 112, and drain electrode 113 of the TFT 110 are not etched. Then, a part of the protective film 129 of a region where an electrode 125 and an electrode 126 are formed is etched to form contact holes. In addition, the electrode 125 electrically connected to the electrode 115 through one of the contact holes formed in the interlayer insulating film 118 and the protective film 129 and the electrode 126 electrically connected to the auxiliary electrode 122 through the other contact hole formed in the interlayer insulating film 118 and the protective film 129 are formed on the interlayer insulating film 118 (See FIG. 18). As the electrode 125 and the electrode 126, tungsten (W), titanium (TI), tantalum (Ta), silver (Ag), or the like can be used.

In this embodiment mode, conductive films of titanium (Ti) which are formed to a thickness of 30 nm to 50 nm are used as the electrode 125 and the electrode 126.

Figure 19:
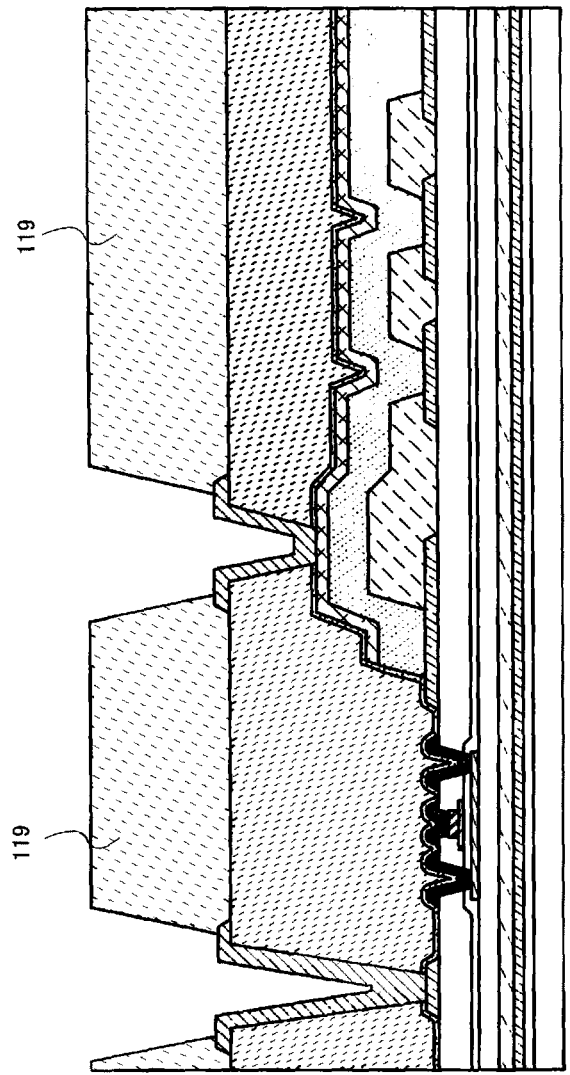
FIG. 19 is a cross-sectional view illustrating a manufacturing step of a semiconductor device of the present invention.
Figure 20:
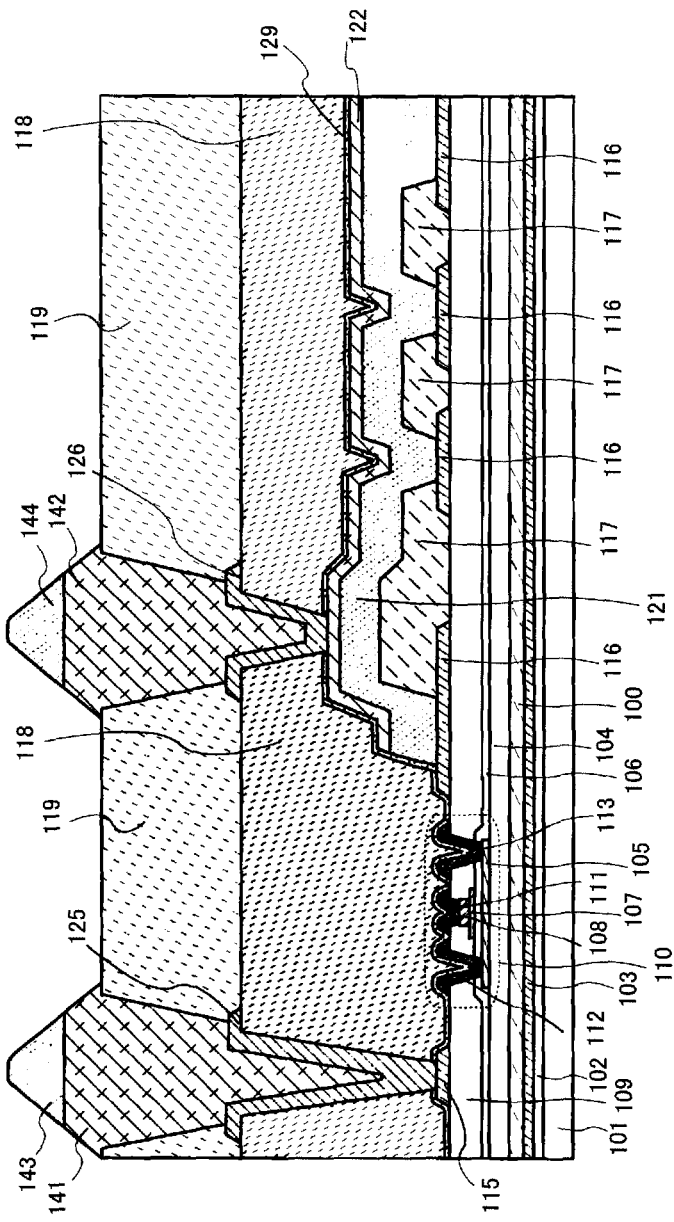
FIG. 20 is a cross-sectional view illustrating a manufacturing step of a semiconductor device of the present invention.

Note that in the case where the auxiliary electrode 122 is not formed, the electrode 126 may be electrically connected to the topmost layer of the photoelectric conversion layer 121, and the n-type semiconductor layer 121*n* in this embodiment mode Then, the interlayer insulating film 119 is formed over the interlayer insulating film 118 by screen printing or inkjet printing (See FIG. 19). In that case, the interlayer insulating film 119 is not formed over the electrode 125 and electrode 126. In this embodiment mode, an epoxy resin is used for the interlayer insulating film 119.

Next, for example, an electrode 141 electrically connected to the electrode 125 and an electrode 142 electrically connected to the electrode 126 are formed by a printing method using nickel (Ni) paste. In addition, an electrode 143 and an electrode 144 are formed by a printing method using copper (Cu) paste over the electrode 141 and electrode 142, respectively (See FIG. 20).

Then, a second substrate 151 to be a support is attached with an adhesive material 152. Note that a substrate which is more rigid than the substrate 101 is preferably used as the second substrate 151. Typically, a glass substrate, a quartz substrate, a metal substrate, a ceramics substrate, or a plastic substrate can be used as the second substrate 151 as appropriate.

Further, as the adhesive material 152, an adhesive material made of an organic material may be used. At that time, a planarization layer may be formed in a part of the adhesive material. In this embodiment mode, as the planarization layer, an adhesive material made of an organic material is coated with a water soluble resin 152*a*, and a member 152*b* whose each side is covered with a reactive peeling adhesive material (hereinafter referred to as a double-sided sheet) may be bonded thereonto to attach the interlayer insulating film 119, electrode 141, electrode 143, electrode 142, electrode 144, or the like to the second substrate 151.

Using the adhesion method, later steps of separation can be performed with relatively low force. As an adhesive material made of an organic material, a variety of peeling adhesive materials such as a reactive release adhesive material, a heat peelable adhesive material, a light-peeling adhesive material such as a UV peeling adhesive material, and an anaerobic peeling adhesive material can be given.

Figure 45:
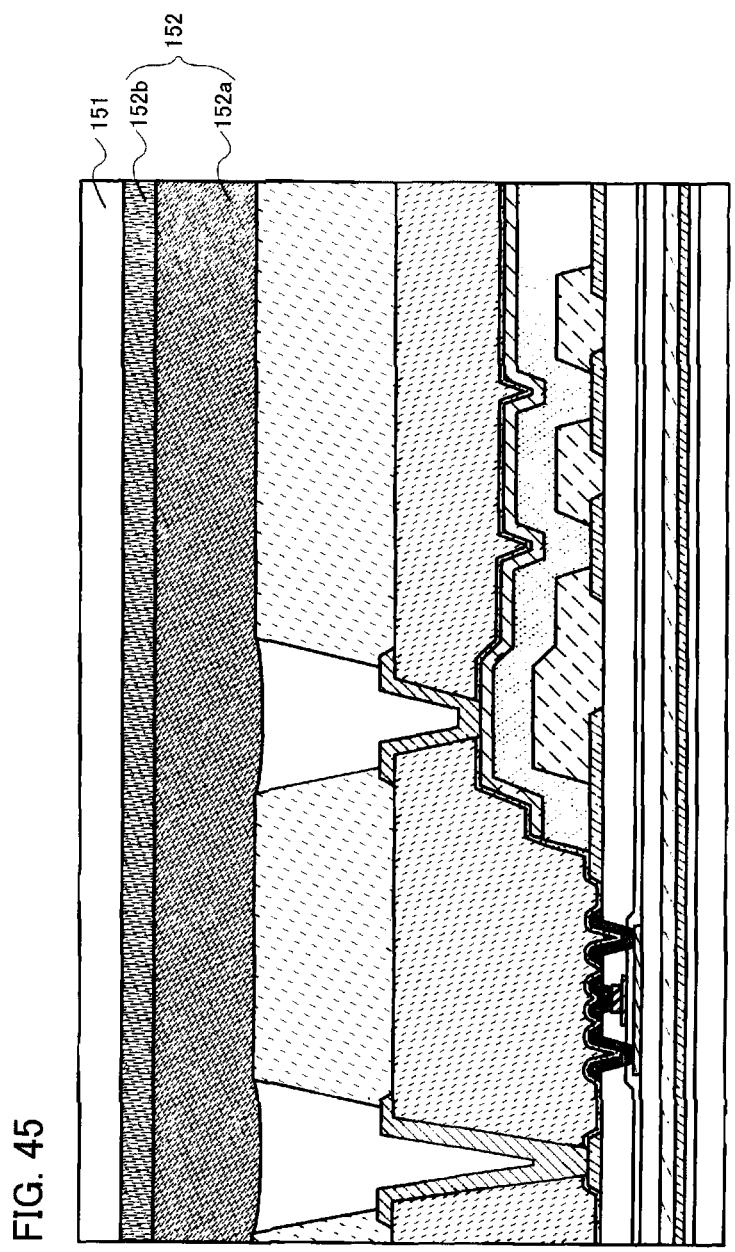
FIG. 45 is a cross-sectional view illustrating a manufacturing step of a semiconductor device of the present invention.

Note that in this embodiment mode, after the step of forming the electrode 143 and the electrode 144, the second substrate 151 to be a support is attached with the adhesive material 152; however, the second substrate 151 may be attached with the adhesive material 152 before forming the electrode 141, electrode 143, electrode 142, and electrode 144, that is, after the step shown in FIG. 19 is performed (See FIG. 45).

Figure 22:
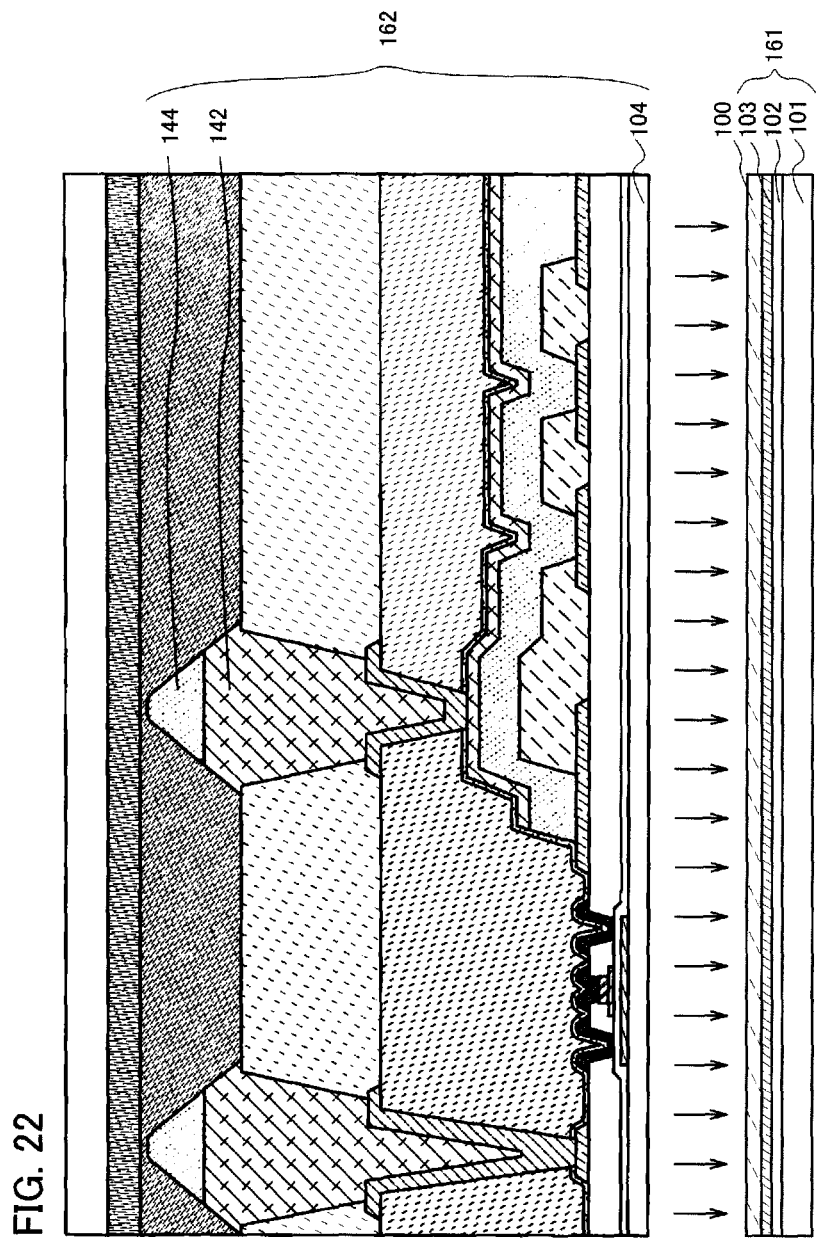
FIG. 22 is a cross-sectional view illustrating a manufacturing step of a semiconductor device of the present invention.

In FIG. 22, the substrate 101 and the metal film 103 are referred to as a release body 161. Further, the layer from the insulating film 104 to the electrode 143 and the electrode 144 is referred to as a stack body 162.

Figure 23:
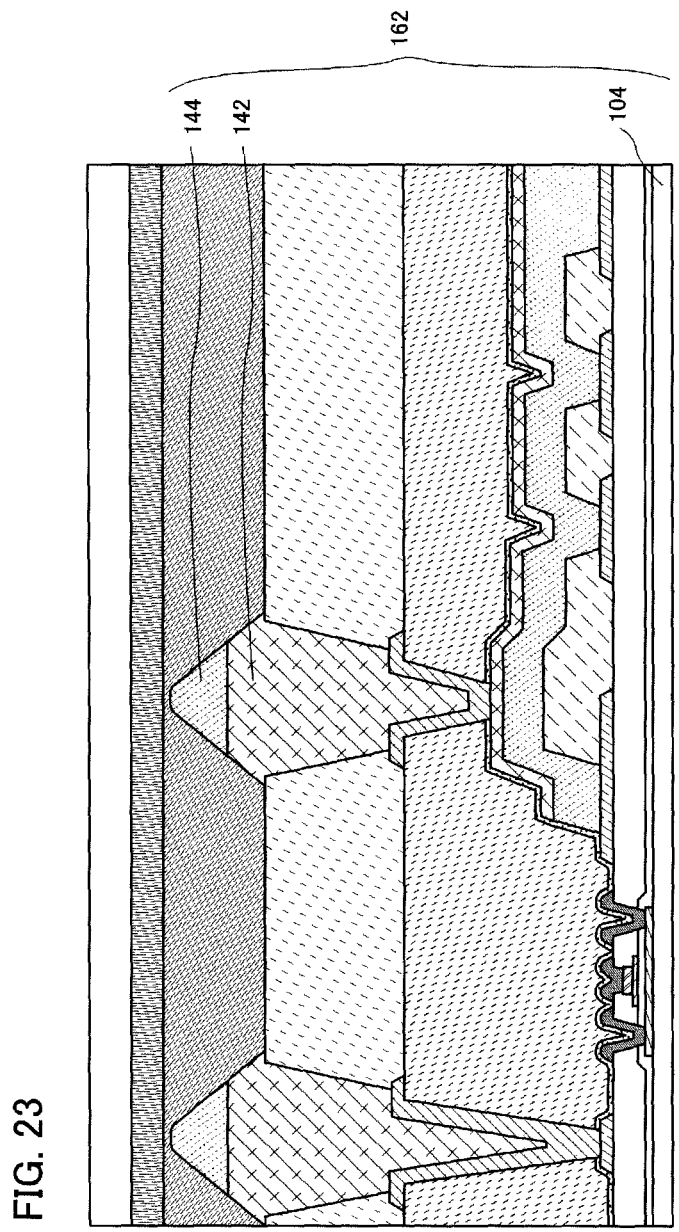
FIG. 23 is a cross-sectional view illustrating a manufacturing step of a semiconductor device of the present invention.

Next, the metal film 103 over the substrate 101 is peeled form the insulating film 104 by a physical means (See FIG. 22). Physical force is relatively low force, for example, load using a member having a sharp end of a wedge shape or the like, wind pressure of gas blown from a nozzle, or ultrasonic waves. Separation occurs within the metal oxide film 100, at the interface between the insulating film 104 and the metal oxide film 100, or at the interface between the metal oxide film 100 and the metal film 103, so that the release body 161 and the stack body 162 are torn off from each other with relatively low force. Thus, the stack body 162 can be detached from the release body 161. The stack body 162 from which the release body 161 is separated is shown in FIG. 23.

Here, a color filter will be described. Over a substrate 131, an insulating film 132, a metal film 133, and an insulating film 134 are formed. The substrate 131, the insulating film 132, the metal film 133, and the insulating film 134 may be formed of the same material as the substrate 101, the insulating film 102, the metal film 103, and the insulating film 104, respectively. Further, a metal oxide film 130 is formed between the metal film 133 and the insulating film 134.

In this embodiment mode, a glass substrate is used as the substrate 131; a silicon oxide film containing nitrogen as the insulating film 132; a tungsten (W) film as the metal film 133, and a silicon oxide film containing nitrogen as the insulating film 134.

A color filter 135 is formed over a part or the entire surface of the insulating film 134.

As a manufacturing method for manufacturing the color filter 135, a known method such as an etching method using a colored resin, a color resist method using a color resist, a staining method, an electrodeposition method, a micelle electrolytic method, an electrodeposition transfer method, a film dispersion method, an inkjet method (droplet discharging method), or a silver-based color development method can be used.

In this embodiment mode, a color filter is formed by an etching method using a photosensitive resin in which colorant is dispersed. A photosensitive acrylic resin in which a red colorant, a green colorant, or a blue colorant is dispersed is applied to the insulating film 134 by a coating method. Next, the acrylic resin is dried and after it is temporarily baked, exposure and development are performed, and then, the acryl is hardened by heating at 220° C. to form the color filter 135 of 1.0–2.5 μm.

Note that the position of the color filter 135 is adjusted to the region where the photoelectric conversion layer 121 is formed after the attachment with a bonding material 137.

An overcoat layer 136 is formed so as to cover the color filter 135 (See FIG. 3A). The overcoat layer 136 may be formed of the same material as the overcoat layer 117.

Next, as shown in FIG. 22, the metal film 133 over the substrate 131 is separated from the insulating film 134 by a physical means. Thus, the substrate 131, the insulating film 132, the metal film 133, the metal oxide film 130, the insulating film 134, and the color filter 135 can be removed from the overcoat layer 136 (See FIG. 3B).

Figure 24:
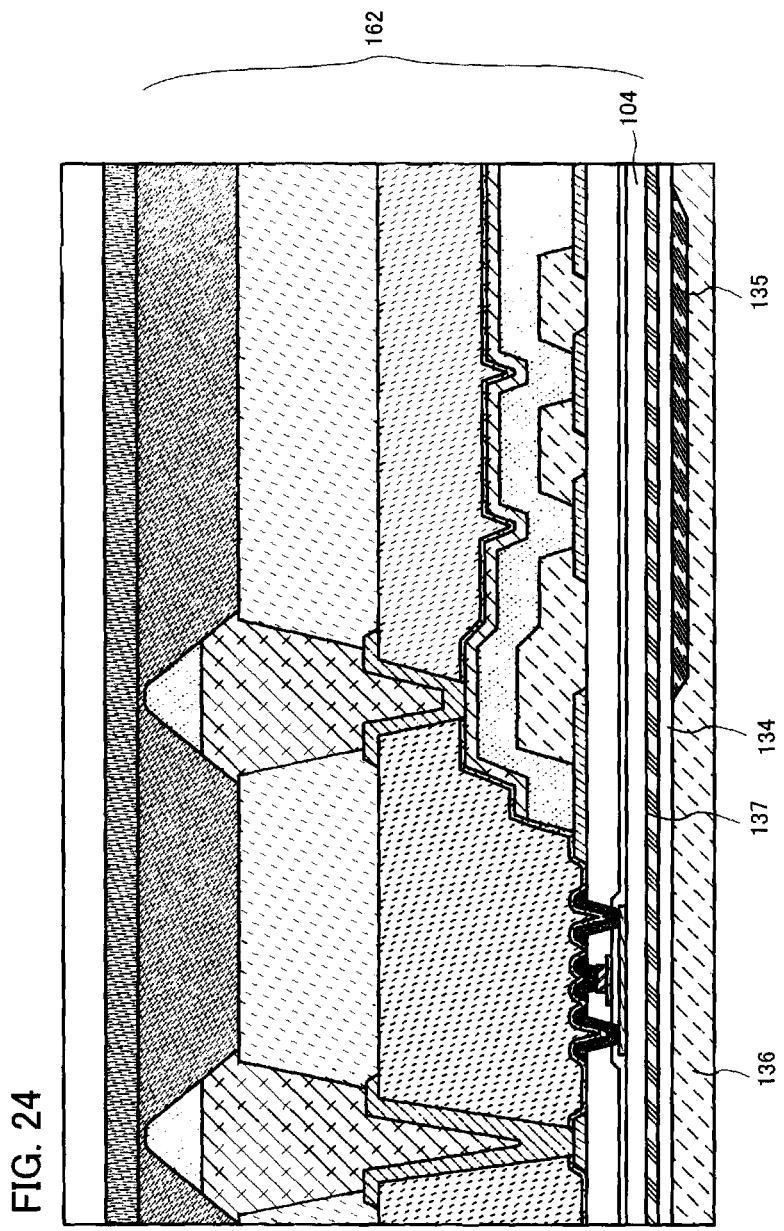
FIG. 24 is a cross-sectional view illustrating a manufacturing step of a semiconductor device of the present invention.

Next, the insulating film 104 and the insulating film 134 are bonded to each other using a bonding material 137 (See FIG. 24). As the bonding material 137, a material having a higher adhesiveness between the stack body 162 including the insulating film 104 and the insulating film 134 than the adhesiveness between the second substrate 151 and the stack body 162 that is a separation layer, of the adhesive material 152 formed of an organic material. In other words, it is preferable that the adhesion of the bonding material 137 is higher than the adhesive material 152.

As the bonding material 137, various kinds of curable bonding materials such as a reactive curable bonding material, a heat-curable bonding material, a light-curable bonding material such as a UV-curable bonding material, and an anaerobic curable bonding material can be used. In this embodiment mode, an epoxy resin may be used as the bonding material 137.

Note that an adhesive material (hereinafter referred to as "double-sided tape") in which a release paper (a release liner, that is, a separator or the like, in which a sheet having a separation surface on one or each substrate side) is provided so that the adhesive material does not adhere to other members may be provided on the insulating film 104. When a release liner is peeled, the adhesive material can adhere to any member. As a material of such double-sided tape, polyimide (PI), polyethylene naphthalate (PEN), polyethylene terephthalate (PET), and the like can be given.

Figure 25:
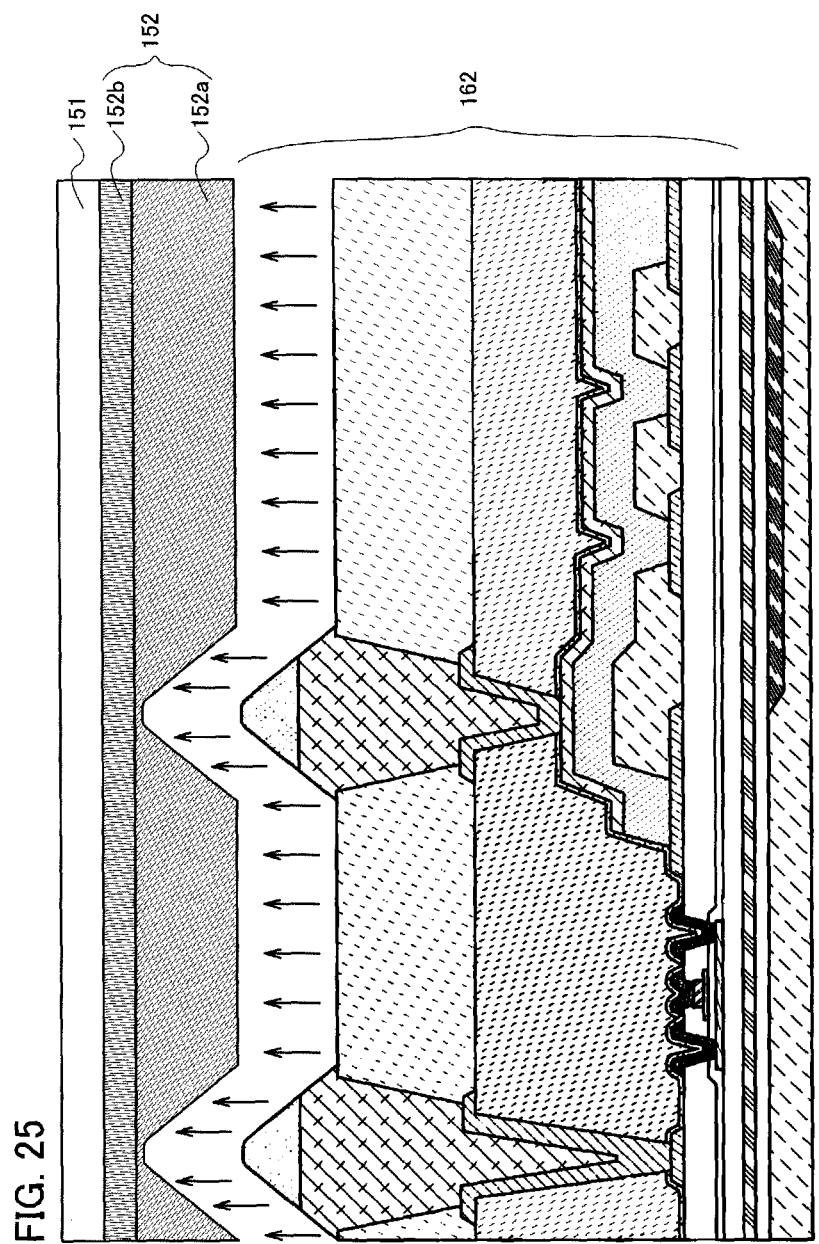
FIG. 25 is a cross-sectional view illustrating a manufacturing step of a semiconductor device of the present invention.

Next, the adhesive material 152 and the second substrate 151 are separated from the stack body 162 (See FIG. 25). The adhesive material 152 made of an organic material is subjected to thermal reaction, photoreaction, reaction to humidity, or chemical reaction (adhesion is decreased using for example, water, oxygen or the like), and then the adhesive material 152 and the second substrate 151 are separated from the stack body 162 formed from an organic material.

Through the above steps, as shown in FIG. 1, a semiconductor device which is also a photoelectric conversion device having the photoelectric conversion layer 121, the TFT 110, and the color filter 135 are formed.

A semiconductor device manufactured in accordance with this embodiment mode is a lightweight and thin semiconductor device, so that the volume can be smaller than conventional semiconductor devices. As a result, electronic devices using the semiconductor device can be smaller and thinner. Further, in accordance with this embodiment mode, miniaturized semiconductor devices can be manufactured at lower manufacturing cost. In addition, a semiconductor device manufactured according to this embodiment mode has flexibility.

Embodiment Mode 2

In this embodiment mode, semiconductor devices having different structures from the ones in Embodiment Mode 1 will be described with reference to FIG. 4 and FIG. 5.

First, steps up to and including the step shown in FIG. 23 is performed in reference to description of Embodiment Mode 1.

Figure 4:
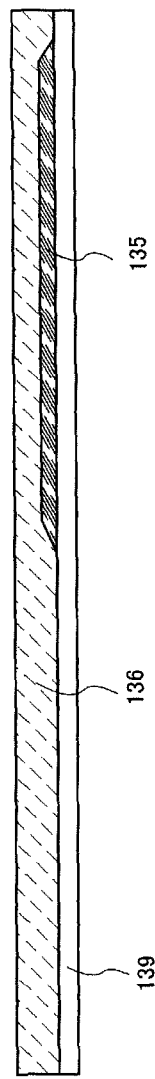
FIG. 4 is a cross-sectional view illustrating a manufacturing step of a semiconductor device of the present invention.
Figure 5:
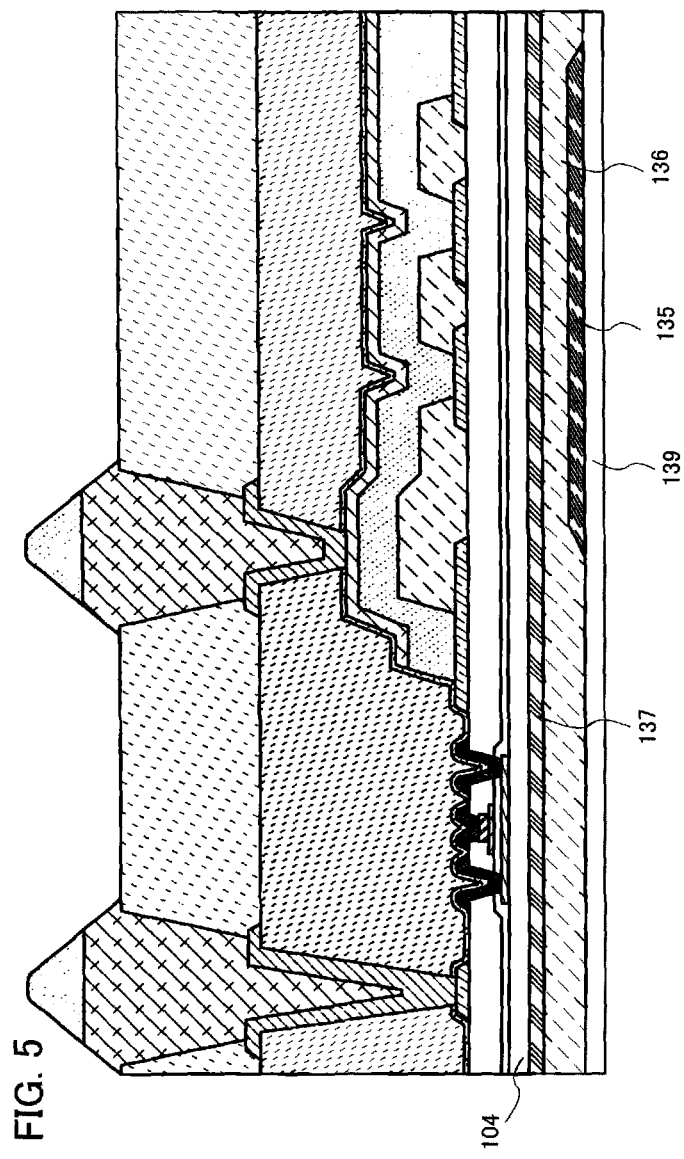
FIG. 5 is a cross-sectional view of a semiconductor device of the present invention.

As shown in FIG. 4, a color filter 135 and an overcoat layer 136 are formed over a substrate 139. The substrate 139 may be formed of the same material as the substrate 131, and the color filter 135 and the overcoat layer 136 are similar to the ones in Embodiment Mode Note that the position of the color filter 135 is adjusted so as to fit the region where the photoelectric conversion layer 121 is formed after attachment with the bonding material 137.

Then, as in Embodiment Mode 1, the overcoat layer 136 and the insulating film 104 with a bonding material 137, and the second substrate 151 and the adhesive material 152 are peeled off. In this manner, a semiconductor device of this embodiment mode is completed (See FIG. 5).

A semiconductor device manufactured in accordance with this embodiment mode is a lightweight and thin semiconductor device, so that the volume can be smaller than conventional semiconductor devices. As a result, electronic devices using the semiconductor device can be smaller and thinner. Further, in accordance with this embodiment mode, miniaturized semiconductor devices can be manufactured at lower manufacturing cost.

Embodiment Mode 3

In this embodiment mode, semiconductor devices having different structures from the ones in Embodiment Mode 1 and Embodiment Mode 2 will be described with reference to FIG. 6 and FIG. 7.

Figure 6:
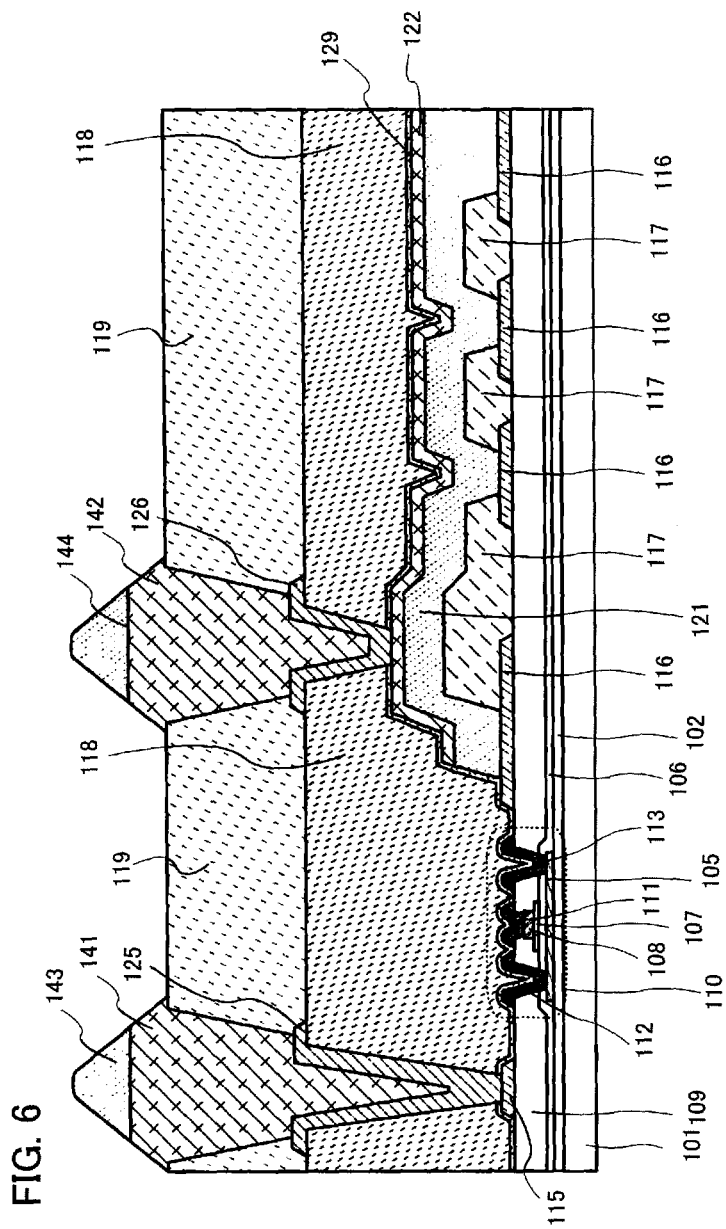
FIG. 6 is a cross-sectional view illustrating a manufacturing step of a semiconductor device of the present invention.
Figure 7:
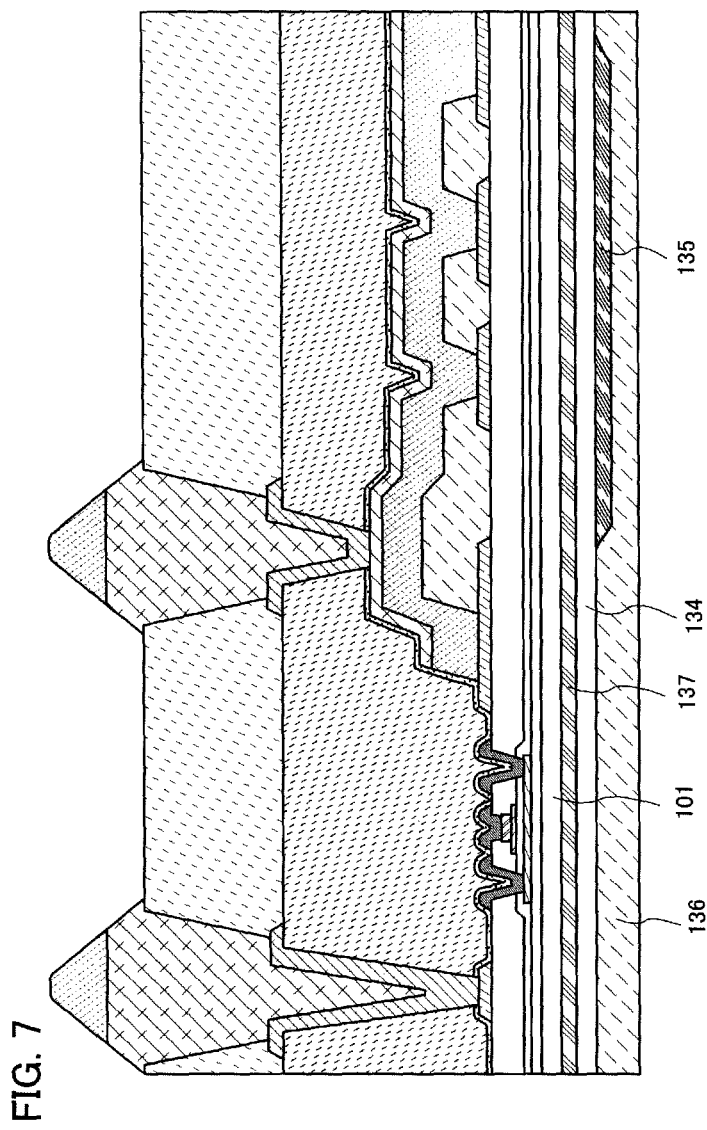
FIG. 7 is a cross-sectional view of a semiconductor device of the present invention.

First, a layered structure shown in FIG. 6 is manufactured based on Embodiment Mode 1. The layered structure shown in FIG. 6 corresponds to the structure of a layered structure in FIG. 20 excluding the metal film 103, the metal oxide film 100, and the insulating film 104. Specifically in FIG. 6, after the insulating film 102 over the substrate 101 is formed, the TFT 110 may be formed immediately without forming the metal film 103, the metal oxide film 100, and the insulating film 104.

Figure 21:
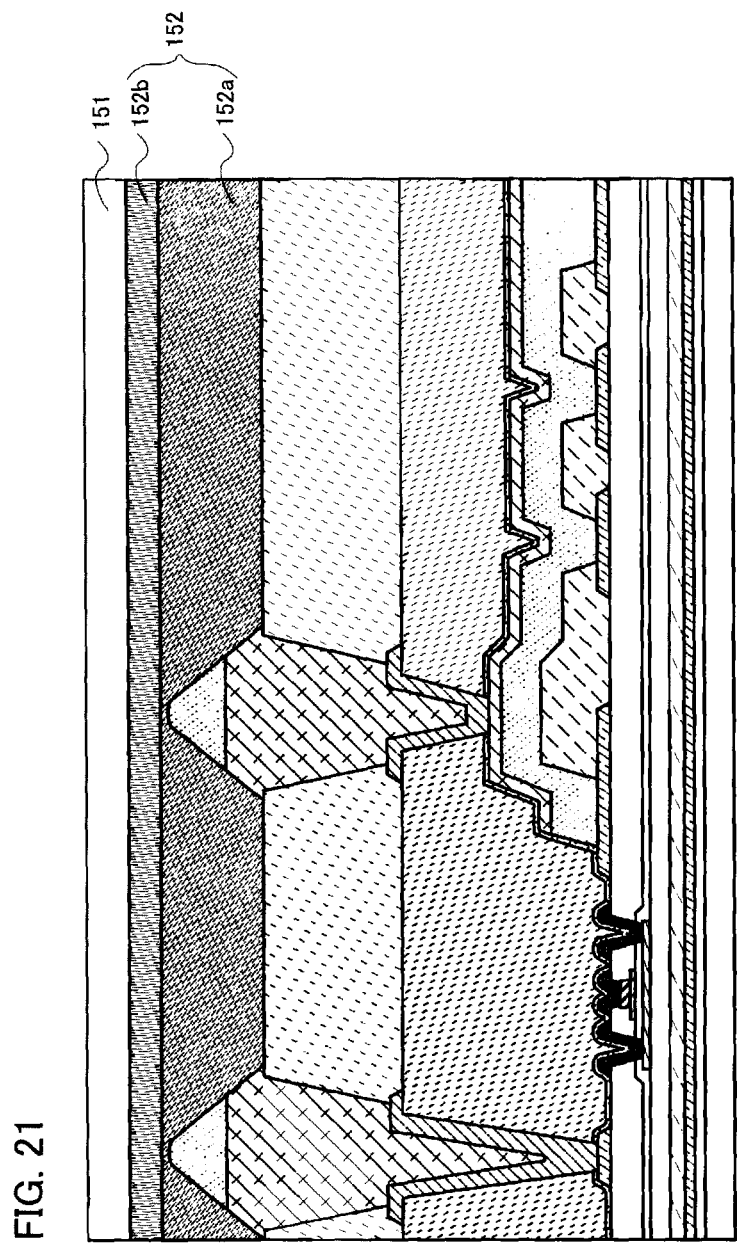
FIG. 21 is a cross-sectional view illustrating a manufacturing step of a semiconductor device of the present invention.

Next, the second substrate 151 is attached with the adhesive material 152 based on the step shown in FIG. 21.

Next, as in Embodiment Mode 1, the insulating film 134 is bonded to the substrate 101 with a bonding material 137 using the insulating film 134, the color filter 135, and the overcoat layer 136 which are shown in FIG. 3B. Then, the adhesive material 152 and the second substrate 151 are peeled off based on the step shown in the FIG. 25. In this manner, a semiconductor device of this embodiment mode can be obtained (See FIG. 7).

A semiconductor device manufactured in accordance with this embodiment mode is a lightweight and thin semiconductor device, so that the volume can be smaller than conventional semiconductor devices. As a result, electronic devices using the semiconductor device can be smaller and thinner. Further, in accordance with this embodiment mode, miniaturized semiconductor devices can be manufactured at lower manufacturing cost.

Embodiment Mode 4

Figure 8:
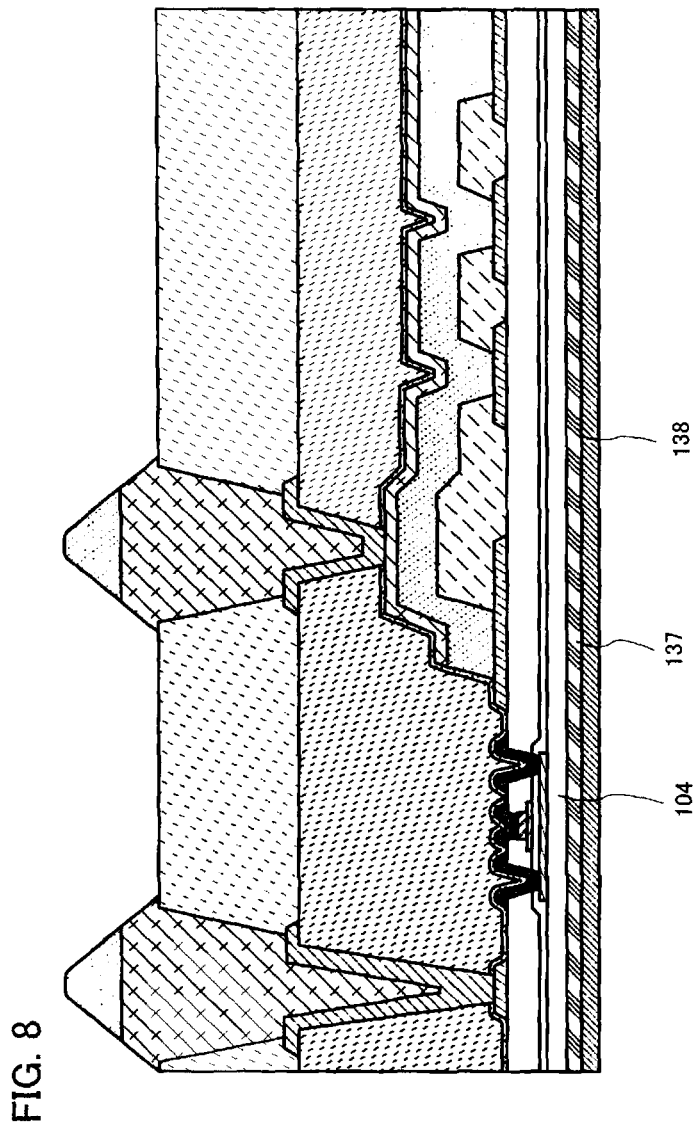
FIG. 8 is a cross-sectional view of a semiconductor device of the present invention.

In this embodiment mode, semiconductor devices having different structure from ones in the Embodiment Mode 1 to Embodiment Mode 3 will be described with reference to FIG. 8.

First, steps up to and including the step shown in FIG. 23 is performed in reference to description of Embodiment Mode 1.

Then, the color film 138 and the insulating film 104 with a bonding material 137, and the second substrate 151 and the adhesive material 152 are peeled off. In this manner, a semiconductor device of this embodiment mode is completed (See FIG. 8).

A resin in which a red pigment, a green pigment, or a blue pigment is dispersed may be used as the color film 138.

A semiconductor device manufactured in accordance with this embodiment mode is a lightweight and thin semiconductor device, so that the volume can be smaller than conventional semiconductor devices. As a result, electronic devices using the semiconductor device can be smaller and thinner. Further, in accordance with this embodiment mode, miniaturized semiconductor devices can be manufactured at lower manufacturing cost.

Embodiment Mode 5

In this embodiment mode, semiconductor devices having different structures from the ones in Embodiment Mode 1 to Embodiment Mode 4 will be described with reference to FIG. 9, FIG. 26, FIG. 46, and FIG. 47.

First, steps up to and including the step shown in FIG. 23 is performed in reference to description of Embodiment Mode 1.

Then, a resin containing a red pigment, a green pigment, or a blue pigment is dropped onto the entire surface of the insulating film 104 by ink-jet printing. A thermosetting resin, a light curable resin or the like may be used as the resin. The resin containing the pigment is dropped by ink-jet printing and cured; thus, a color film (hereinafter also referred to as a color lens) 155 which also serves as a lens is formed (See FIG. 9). Further, the color lens 155 may be formed only in a region corresponding to a region over the insulating film 104, where the photoelectric conversion layer 121 is formed (See FIG. 26).

Next, based on the description of Embodiment Mode 1, the second substrate 151 and the adhesive material 152 are peeled off. As described above, semiconductor devices of this embodiment mode are completed (See FIG. 9 and FIG. 26).

Figure 9:
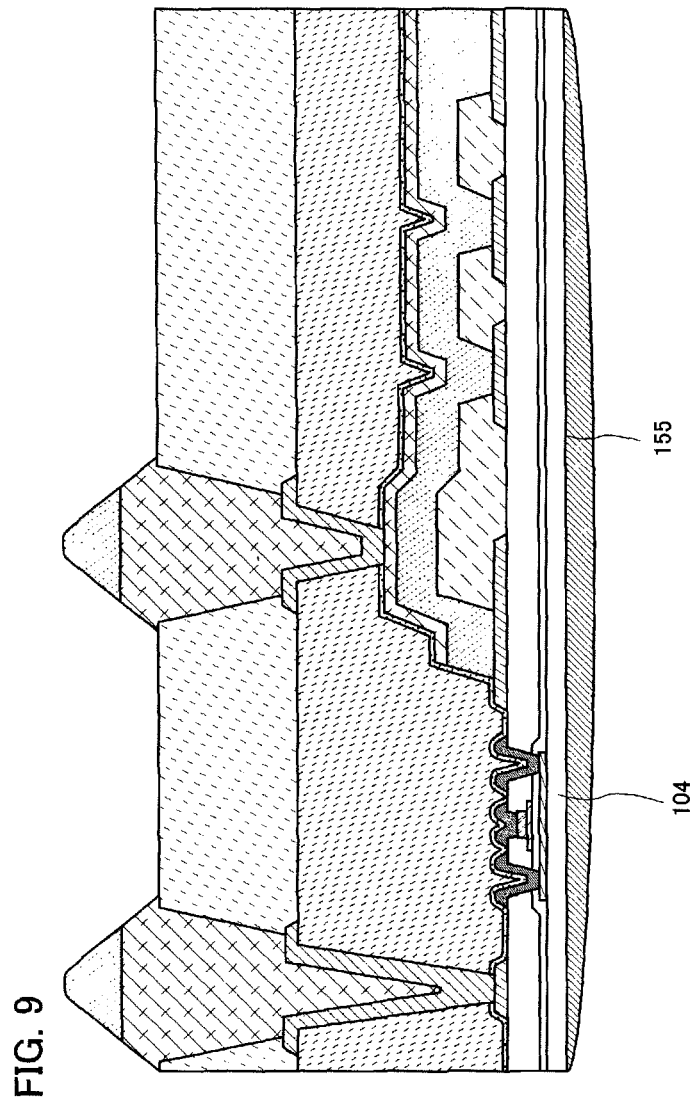
FIG. 9 is a cross-sectional view of a semiconductor device of the present invention.
Figure 26:
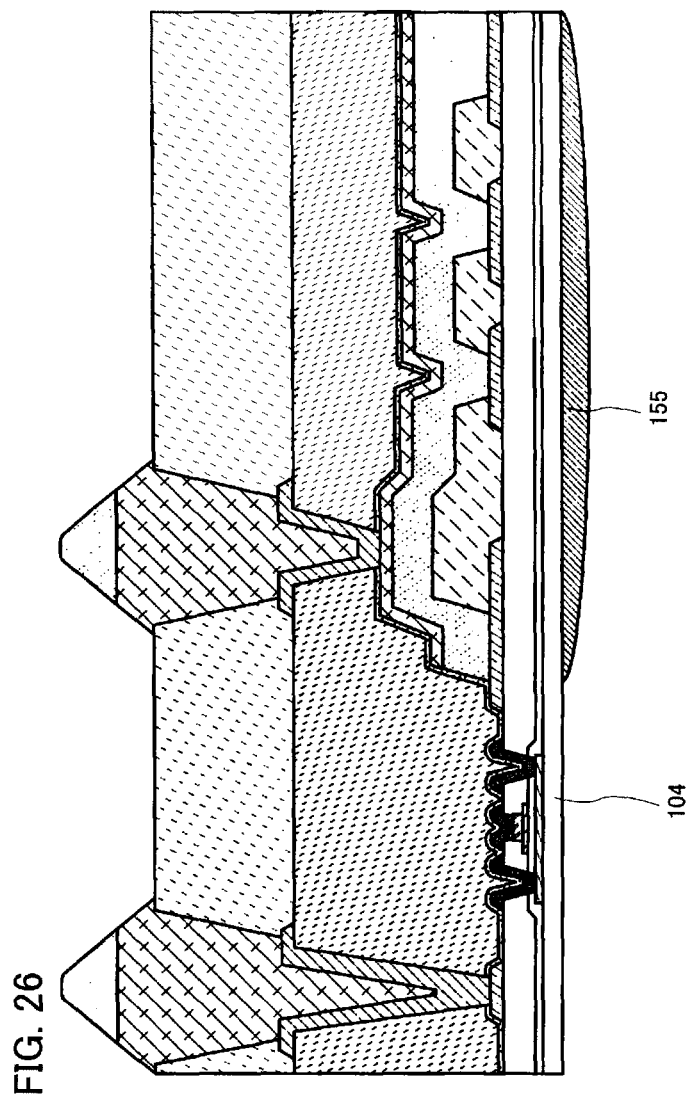
FIG. 26 is a cross-sectional view of a semiconductor device of the present invention.
Figure 46:
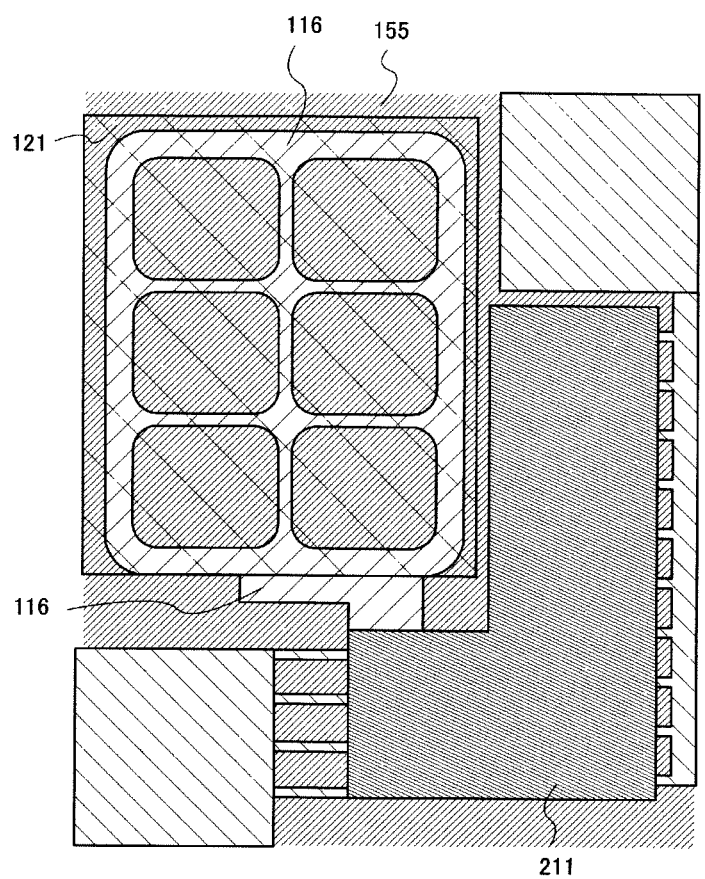
FIG. 46 is a top view of a semiconductor device of the present invention.
Figure 47:
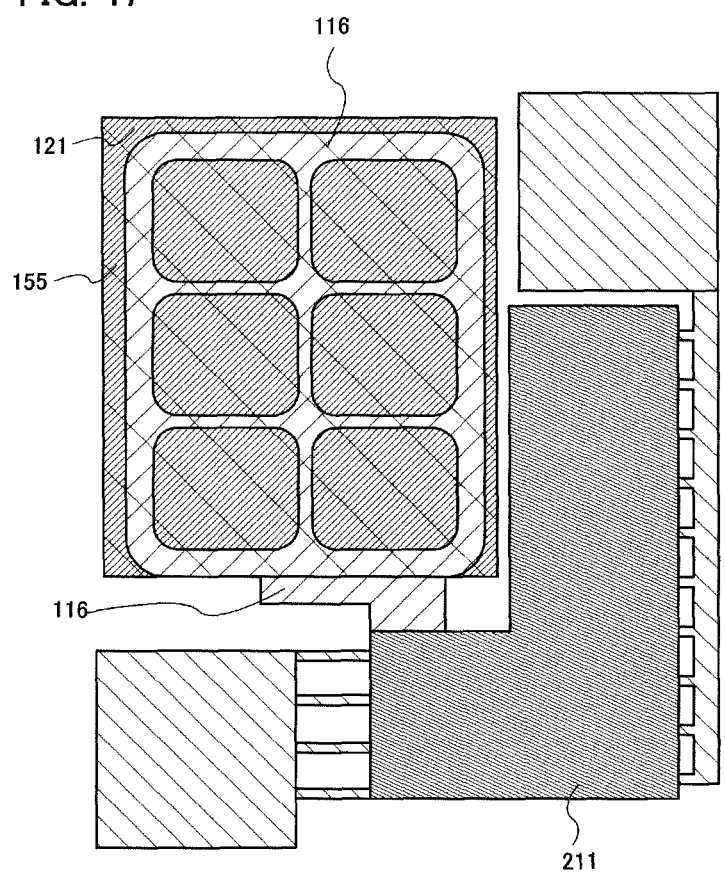
FIG. 47 is a top view of a semiconductor device of the present invention.

Top views of FIG. 9 and FIG. 26 correspond to FIG. 46 and FIG. 47, respectively. In FIG. 46, it is seen that the color lens 155 is formed on the entire surface of the surface where elements such as the photoelectric conversion layer 121 and the current mirror circuit 211 are formed. Further, in FIG. 47, it is seen that the color lens 155 is formed only in a region where the photoelectric conversion layer 121 is formed.

A semiconductor device manufactured in accordance with this embodiment mode is a lightweight and thin semiconductor device, so that the volume can be smaller than conventional semiconductor devices. As a result, electronic devices using the semiconductor device can be smaller and thinner. Further, in accordance with this embodiment mode, miniaturized semiconductor devices can be manufactured at lower manufacturing cost.

Embodiment Mode 6

In this embodiment mode, semiconductor devices having different structure from the ones in Embodiment Mode 1 to Embodiment Mode 5 will be explained with reference to FIG. 48, FIGS. 49A to 49C, FIGS. 50A and 50B, FIG. 51, and FIG. 52. Note that this embodiment mode is basically based on Embodiment Mode 1, and regarding omitted part of description, Embodiment Mode 1 should be referenced.

First, steps up to and including the step shown in FIG. 10C are performed based on Embodiment Mode 1 (See FIG. 49A). Then, end portions of the gate insulating film 106, the interlayer insulating film 109, and the electrode 116 are etched away (See FIG. 49B).

Figure 50A:
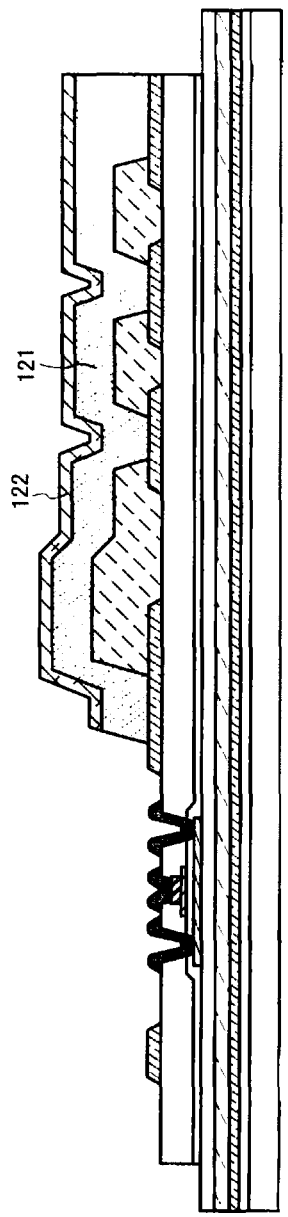
FIGS. 50A and 50B are cross-sectional views illustrating manufacturing steps of a semiconductor device of the present invention.

Next, the overcoat layer 117 is formed as in Embodiment Mode 1 (See FIG. 49C), and in addition, the photoelectric conversion layer 121 and the auxiliary electrode 122 are formed (See FIG. 50A).

Figure 50B:
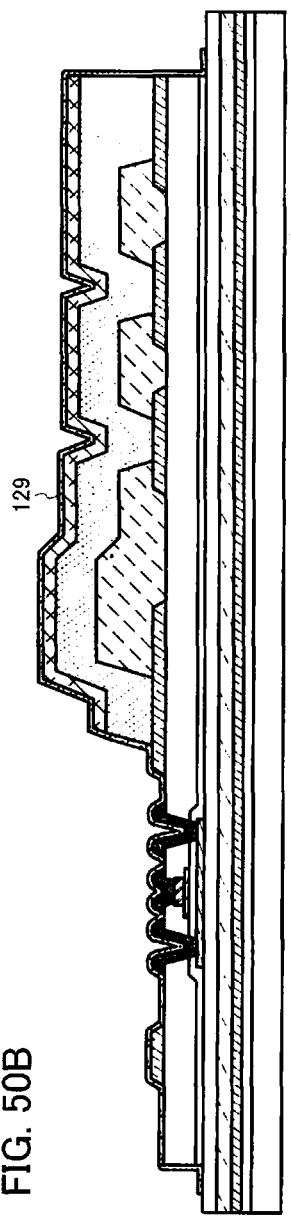

Next, the protective film 129 is formed so as to cover exposed part of the insulating film 104, the gate insulating film 106, the interlayer insulating film 109, the electrode 115, the gate wiring 111, the source electrode 112, the drain electrode 113, and the electrode 116 (See FIG. 50B). As the protective film, for example, a silicon nitride film may be used. The protective film 129 makes it possible to prevent mixing of impurities such as moisture and organic matter into the TFT 110 and the photoelectric conversion layer 121.

Figure 51:
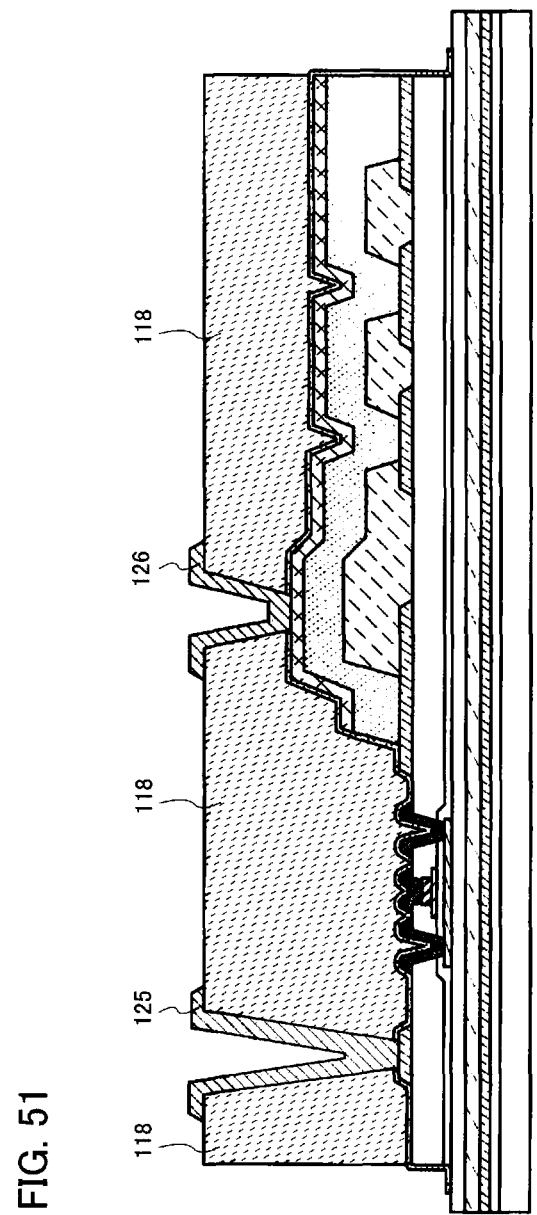
FIG. 51 is a cross-sectional view illustrating a manufacturing step of a semiconductor device of the present invention.

In addition, the interlayer insulating film 118, the electrode 125, and the electrode 126 are formed based on Embodiment Mode 1 (See FIG. 51). At that time, the interlayer insulating film 118 is made so as not to protrude from a region where the protective film 129 is formed, especially, a region where the interlayer insulating film 109 and the photoelectric conversion layer 121 are formed.

Figure 52:
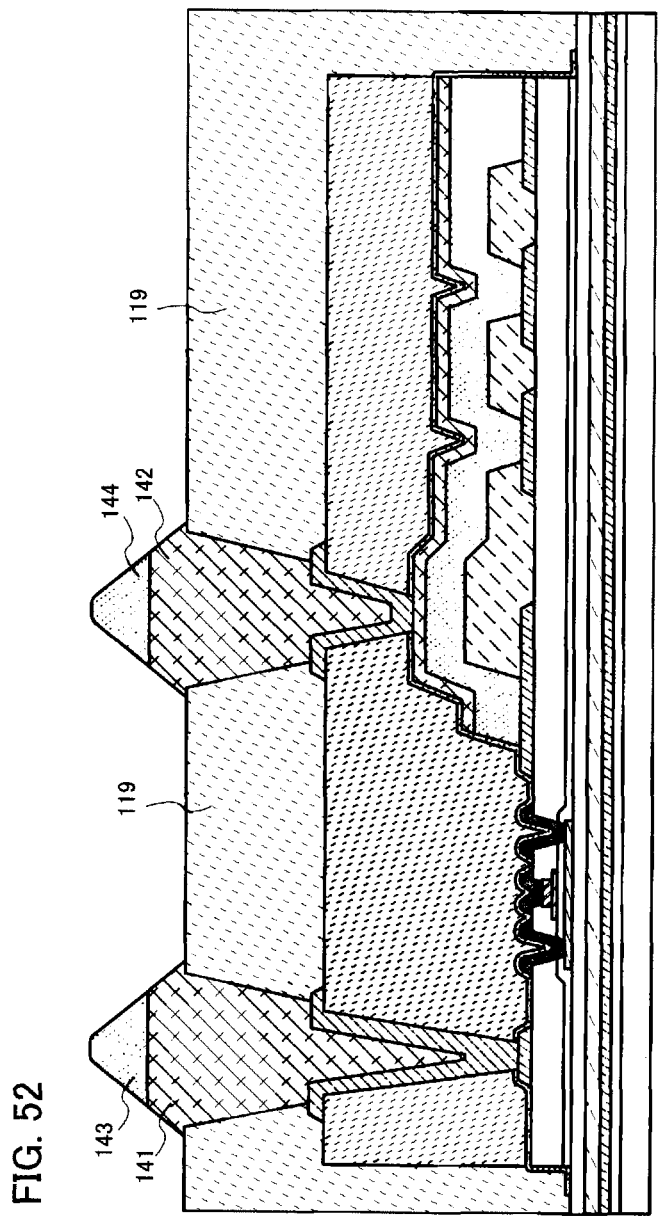
FIG. 52 is a cross-sectional view illustrating a manufacturing step of a semiconductor device of the present invention.

Next, as in Embodiment Mode 1, the interlayer insulating film 119, the electrode 141, the electrode 142, the electrode 143, and the electrode 144 are manufactured (See FIG. 52). An epoxy resin or the like may be used for the interlayer insulating film 119, for example. The interlayer insulating film 119 is formed so as to cover the protective film 129 and the insulating film 104 serving as a base film and so as to have a function of a sealing material.

Figure 48:
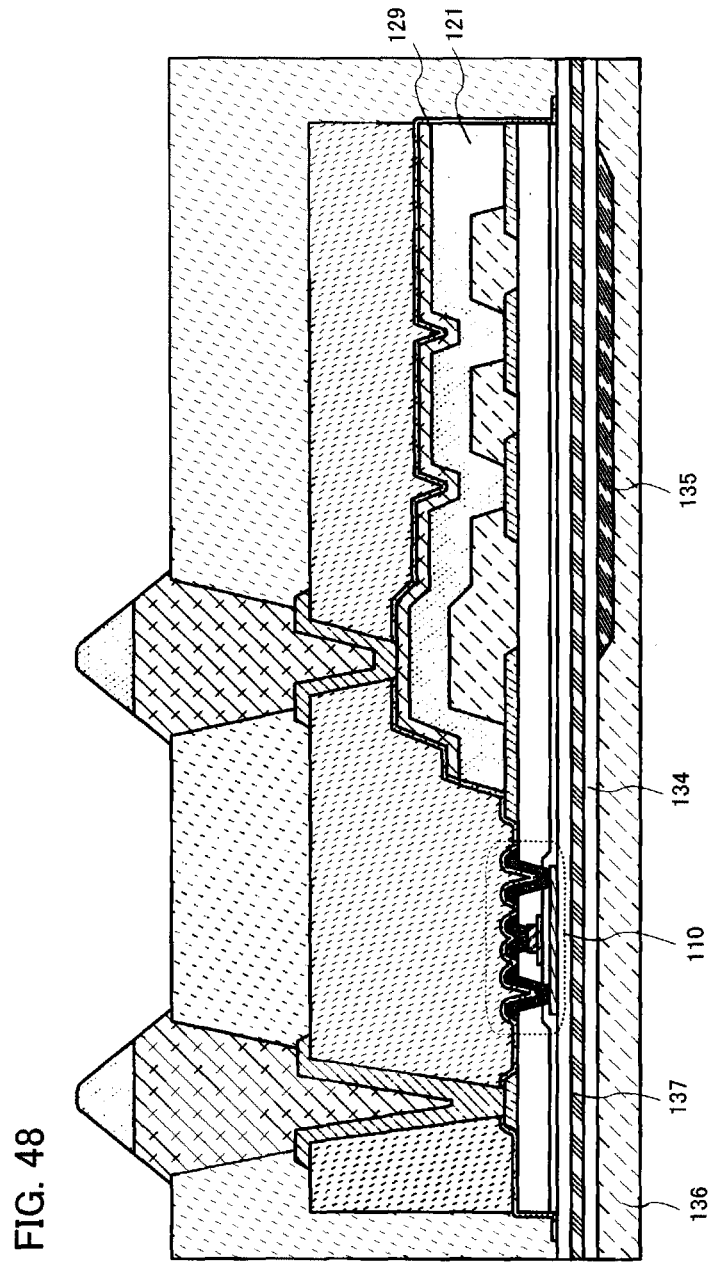
FIG. 48 is a cross-sectional view illustrating a manufacturing step of a semiconductor device of the present invention.

After that, based on FIG. 3A and FIG. 3B, and FIG. 21 to 25 and description thereof, the color filter 135 and the overcoat layer 136 are attached with the bonding material 137 provided between the insulating film 134 and the insulating film 104; thus, a semiconductor device of this embodiment mode is completed (See FIG. 48).

Figure 56:
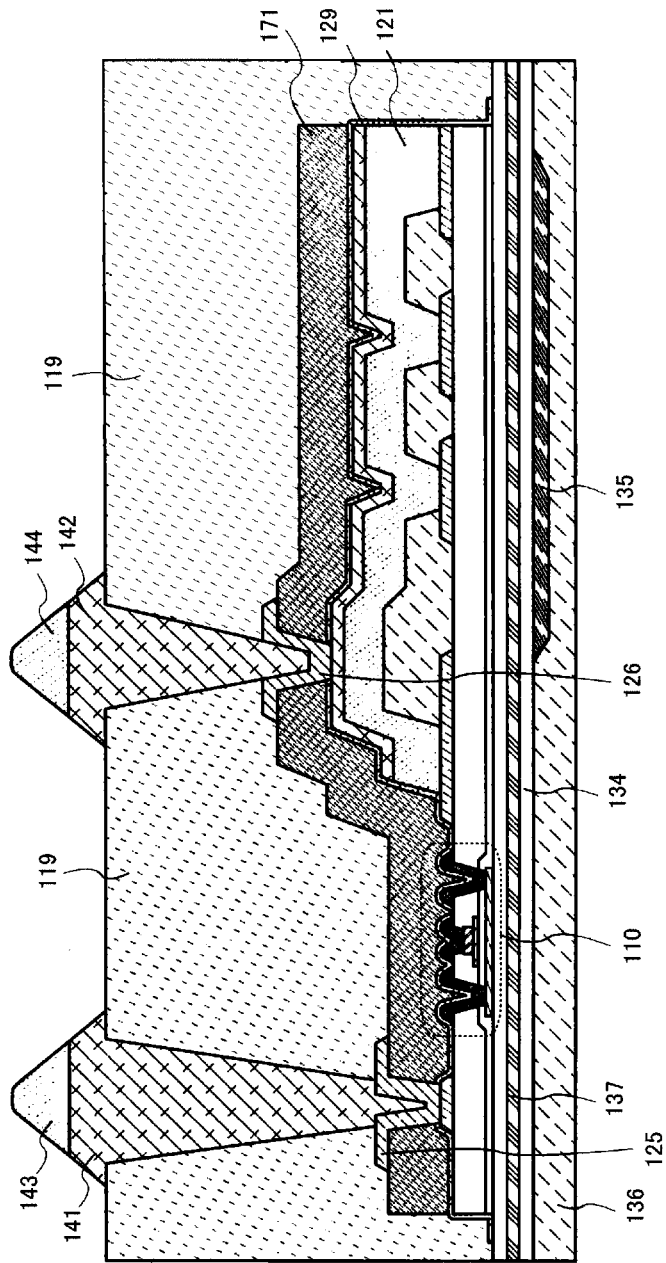
FIG. 56 is a cross-sectional view illustrating a manufacturing step of a semiconductor device of the present invention.

Further, the interlayer insulating film 118 is formed of polyimide in Embodiment Mode 1 and this embodiment mode; however, an inorganic material, for example, a silicon oxide film containing nitrogen or the like may be used instead of an organic material such as polyimide. The case is shown in FIG. 56. In FIG. 56, the interlayer insulating film 171 is formed instead of the interlayer insulating film 118, and the interlayer insulating film 171 is formed using a silicon oxide film containing nitrogen.

A semiconductor device of this embodiment mode is advantageous in preventing mixing of impurities such as moisture and organic matter.

Embodiment Mode 7

In this embodiment mode, semiconductor devices having different structures from the ones in Embodiment Mode 1 to Embodiment Mode 6 will be explained with reference to FIG. 53, FIGS. 54A to 54C, and FIG. 55. Note that this embodiment mode is basically based on Embodiment Mode 1, and regarding omitted part of description, Embodiment Mode 1 should be referenced.

Further, this embodiment mode is almost the same as Embodiment Mode 6 except for that the insulating film 104 of Embodiment Mode 6 has two layers and a lower insulating film 104a and an upper insulating film 104b are used. Therefore, Embodiment Mode 6 should also be referenced if necessary in addition to Embodiment Mode 1.

First, as in Embodiment Mode 1, the insulating film 102, the metal film 103, the metal oxide film 100, and the insulating film 104 are sequentially formed over the substrate 101. At that time, the insulating film 104 has the lower insulating film 104a and the upper insulating film 104b (See FIG. 54A). As the lower insulating film 104a, for example, a silicon nitride film containing oxygen ($SiO_xN_y$: y>x) may be used, and as the upper insulating film 104b, for example, a silicon oxide film containing nitrogen ($SiO_xN_y$: x>y) may be used. Thus, contaminants such as moisture can be prevented from mixing in from the substrate 101 side.

Next, steps up to and including the step shown in FIG. 10B are performed based on Embodiment Mode 1 (See FIG. 54B). In addition, as in FIG. 49B of Embodiment Mode 7, end portions of the gate insulating film 106, the interlayer insulating film 109, and the electrode 116 are etched away (See FIG. 54C).

Figure 55:
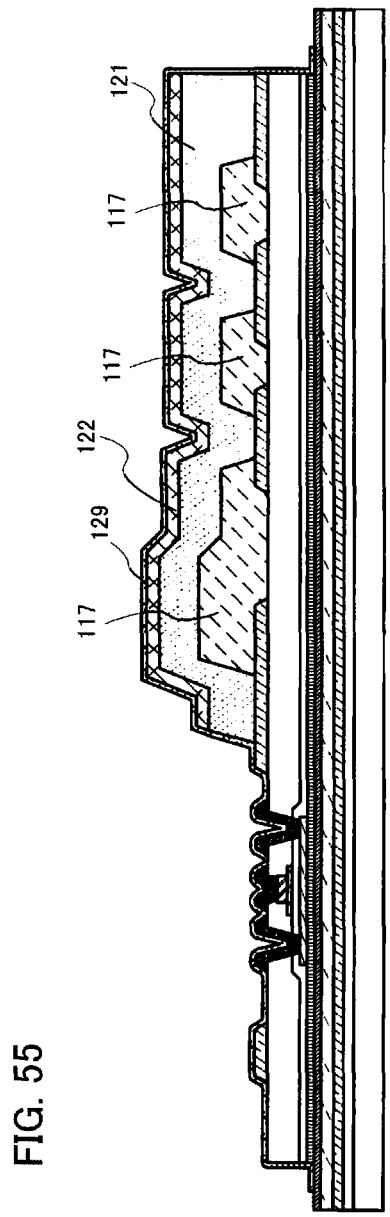
FIG. 55 is a cross-sectional view illustrating a manufacturing step of a semiconductor device of the present invention.

Next, in reference to Embodiment Mode 1, the protective film 129 is formed so as to cover exposed part of the insulating film 104, the gate insulating film 106, the interlayer insulating film 109, the electrode 115, the gate wiring 111, the source electrode 112, the drain electrode 113, and the electrode 116 (See FIG. 55). As the protective film, for example, a silicon nitride film may be used. The protective film 129 makes it possible to prevent mixing of impurities such as moisture and organic matter into the TFT 110 and the photoelectric conversion layer 121.

Figure 53:
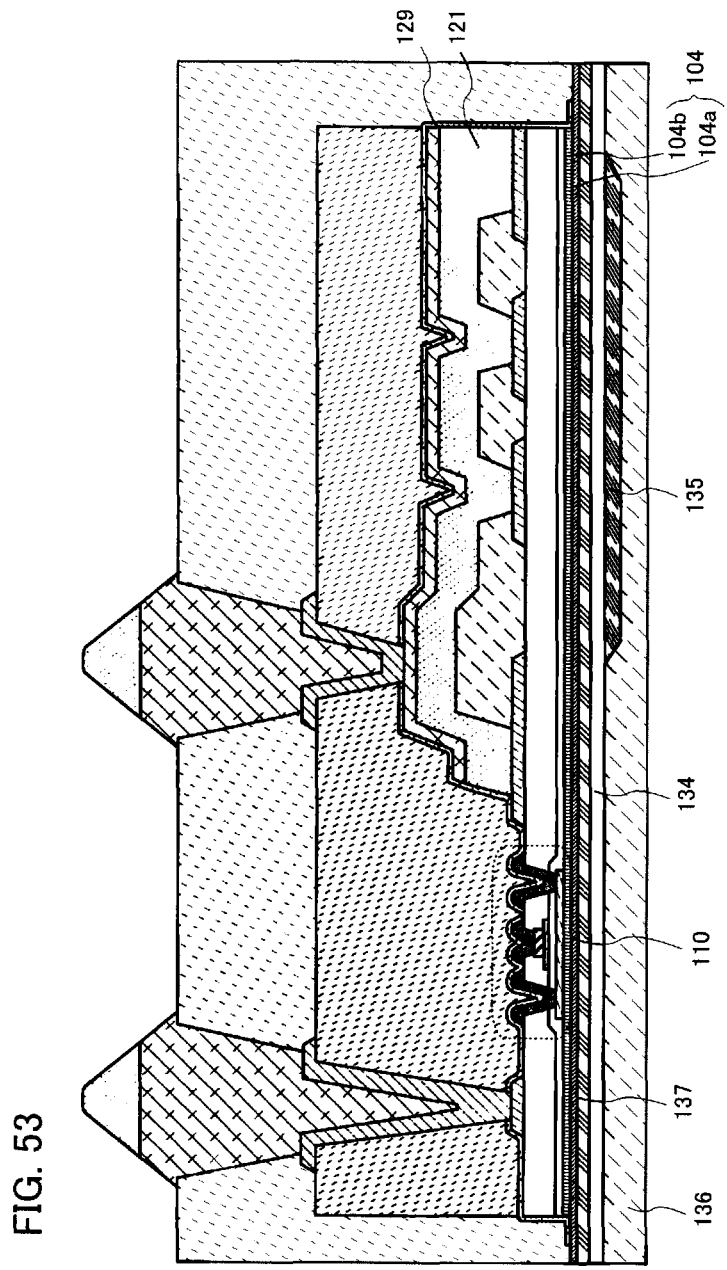
FIG. 53 is a cross-sectional view illustrating a manufacturing step of a semiconductor device of the present invention.

Further, a semiconductor device shown in FIG. 53 is completed through similar steps to Embodiment Mode 1 and Embodiment Mode 6.

A semiconductor device of this embodiment mode is advantageous in preventing mixing of impurities such as moisture and organic matter.

Embodiment Mode 8

In this embodiment mode, a battery will be described with respect to FIG. 27, FIGS. 28A and 28B, FIGS. 29A to 29E, FIG. 30, FIG. 31, FIG. 32, and FIG. 33. The battery can be used for a power supply such as the high potential power supply $V_{DD}$ and the low potential power supply $V_{SS}$ in Embodiment Mode 1 to Embodiment Mode 7.

In this specification, a device which includes a battery, an antenna, a circuit for charging the battery with an electromotive force that is generated from electromagnetic waves received at the antenna, and a medium for charging the battery with the electromotive force is also called an RF battery or a wireless battery.

In addition, a battery in this specification is also called a secondary battery or a storage battery, which converts electrical energy obtained from an external power supply into chemical energy, stores the energy therein, and outputs the energy as required. In addition, "capacitor" refers to a device having two adjacent conductive electrodes insulated from each other, in which charges can be stored by an electrical attractive force when one of the conductive electrodes is charged positively and the other is charged negatively.

Note that "battery" in this specification means a device whose continuous operating time can be restored by charging. Further, as a battery, a battery formed in a sheet-like form or a battery formed in a cylindrical form with a small diameter is preferably used, although the type of battery used may differ depending on the intended use of the device. For example, by using a lithium battery, preferably a lithium polymer battery that uses a gel electrolyte, a lithium ion battery, or the like, miniaturization is possible. Needless to say, any battery may be used, as long as it is chargeable. For example, the following batteries that are chargeable and dischargeable can be used: a nickel metal hydride battery, a nickel cadmium battery, an organic radical battery, a lead-acid battery, an air secondary battery, a nickel-zinc battery, and a silver-zinc battery. Alternatively, a high-capacity capacitor or the like may also be used.

As a high-capacity capacitor that can be used as a battery in this embodiment mode, it is preferable to use a capacitor having electrodes with large opposed areas. In particular, it is preferable to use a double-layer electrolytic capacitor which is formed from an electrode material having a large specific surface area such as activated carbon, fullerene, or a carbon nanotube. A capacitor is simpler in structure than a battery. Further, a capacitor can be easily formed to be thin and formed with stacked layers. A double-layer electrolytic capacitor has a function of storing electricity and will not deteriorate much even after it is charged and discharged a number of times. Further, the double-layer electrolytic capacitor has an excellent property in that it can be charged rapidly.

Figure 27:
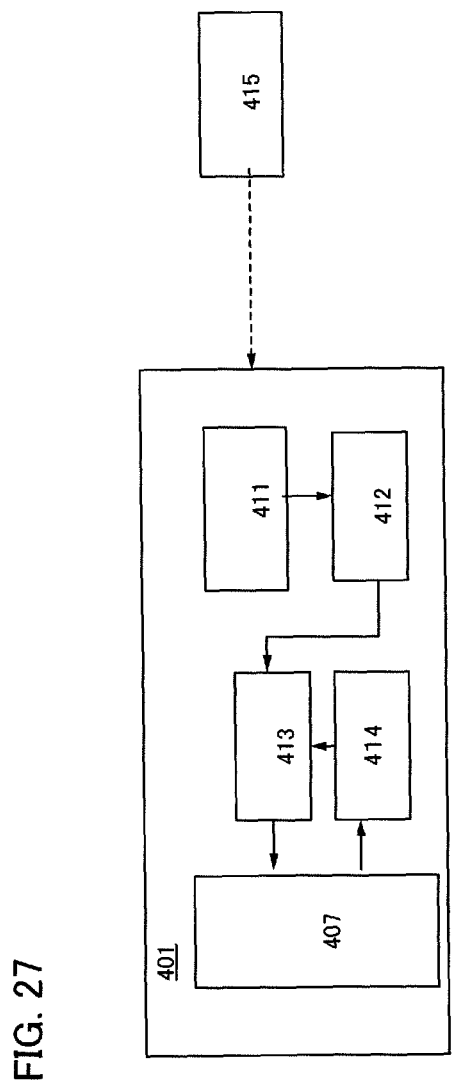
FIG. 27 is a block diagram illustrating a battery of the present invention.

Referring to FIG. 27, an RF battery 401 includes a battery 407, a charging circuit 413, a charge control circuit 414, an internal antenna circuit 411, and a rectifier circuit 412. An external antenna circuit 415 is provided outside of the RF battery 401. The internal antenna circuit 411 receives radio signals generated by the external antenna circuit 415. The signal received at the internal antenna circuit 411 is input to and converted to a DC signal by the rectifier circuit 412. The charging circuit 413 generates a current based on the electricity from the rectifier circuit 412, thereby charging the battery 407. The charge control circuit 414 monitors the charged level of the battery 407 so that the battery 407 is not overcharged. When the charged level of the battery 407 is increased, the charge control circuit 414 controls the charging circuit 413 to suppress the amount of charging. Note that the charging circuit 413 can be constructed from a voltage control circuit (also called a regulator) and a switch circuit, for example. When a diode is used as the switch circuit, the charge control circuit may be omitted. In addition, the voltage control circuit can be replaced with a circuit for controlling voltage and current or a constant current source circuit.

Figure 28A:
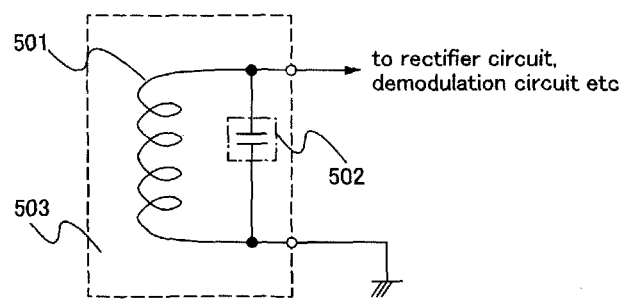
FIGS. 28A and 28B are circuit diagrams each illustrating a circuit included in a battery of the present invention.
Figure 28B:
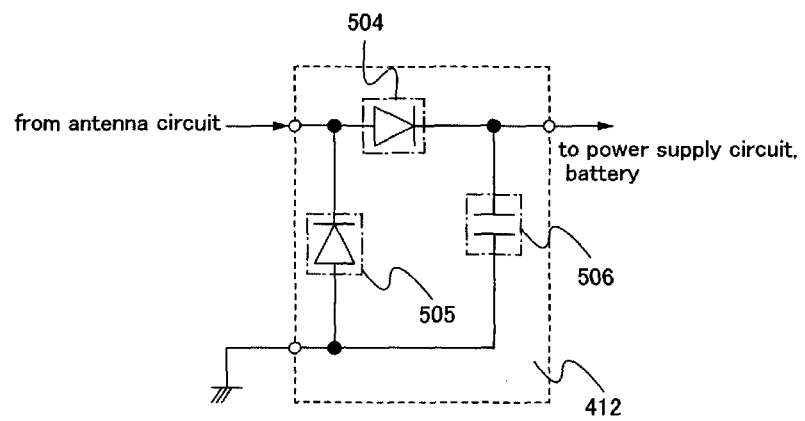

Note that the internal antenna circuit 411 and the external antenna circuit 415 can be an antenna circuit 503 shown in FIG. 28A, for example, which includes an antenna 501 and a resonant capacitor 502. In addition, the rectifier circuit 412 may be any circuit as long as it can convert an AC signal, which is induced by electromagnetic waves received at the internal antenna circuit 411 and the external antenna circuit 415, into a DC current. For example, as shown in FIG. 28B, the rectifier circuit 412 can be constructed from a diode 504, a diode 505, and a smoothing capacitor 506.

Note that radio signals received at the internal antenna circuit 411 in this embodiment mode can be signals with a frequency band of, for example, 125 kHz, 13.56 MHz, 915 MHz, or 2.45 GHz. Needless to say, the frequency of signals received at the internal antenna circuit is not limited to these, and for example, any of the following frequencies can be used: submillimeter waves of 300 GHz to 3 THz, millimeter waves of 30 GHz to 300 GHz, microwaves of 3 GHz to 30 GHz, a ultra high frequency of 300 MHz to 3 GHz, a very high frequency of 30 MHz to 300 MHz, a high frequency of 3 MHz to 30 MHz, a medium frequency of 300 kHz to 3 MHz, a low frequency of 30 kHz to 300 kHz, and a very low frequency of 3 kHz to 30 kHz.

Signals communicated between the internal antenna circuit 411 and the external antenna circuit 415 are signals obtained by carrier modulation. A carrier modulation method can be either analog modulation or digital modulation, and any of amplitude modulation, phase modulation, frequency modulation, and spread spectrum can be used. Preferably, amplitude modulation or frequency modulation is used. Further, for radio signals, the following external signals can be used: radio waves (e.g., 800 MHz to 900 MHz, 1.5 GHz, or 1.9 to 2.1 GHz) from mobile-phone relay stations, radio waves radiated from mobile phones, radio waves (e.g., 40 kHz) of radio wave clocks, noise (e.g., 60 Hz) of domestic AC power supply, and the like. Further, when a plurality of antenna circuits having antennas with different lengths or shapes are used for the internal antenna circuit 411, it is possible to use various radio signals for charging the battery 407.

The antennas provided in the internal antenna circuit 411 and the external antenna circuit 415 are formed to have lengths and shapes such that the above-described radio signals can be received with high sensitivity. When a plurality of radio waves are to be received, it is preferable to provide a plurality of antenna circuits with different lengths or shapes.

Further, the shape of the antenna provided in the internal antenna circuit 411 or the external antenna circuit 415 is not specifically limited. That is, a signal transmission method applied to the internal antenna circuit 411 or the external antenna circuit 415 can be any of an electromagnetic coupling method, an electromagnetic induction method, a microwave method, and the like. The transmission method may be selected as appropriate by a practitioner in consideration of the intended use of the device. Thus, an antenna with an optimum length and shape may be provided in accordance with the transmission method.

For example, in the case of using an electromagnetic coupling method or an electromagnetic induction method (e.g., 13.56 MHz) as the transmission method, a conductive film functioning as an antenna is formed in an annular form (e.g., a loop antenna) or a helical form (e.g., a spiral antenna, or a helical antenna) in order to utilize electromagnetic induction that occurs with changes in magnetic density.

In the case of using a microwave method (e.g., UHF band (860 MHz to 960 MHz) or 2.45 GHz band) as the transmission method, the length and shape of the conductive film functioning as the antenna may be appropriately determined in consideration of the wavelength of electric waves used for signal transmission. For example, the conductive film functioning as the antenna may be formed in a linear form (e.g., a dipole antenna), a flat form (e.g., a patch antenna), or the like. In addition, the shape of the conductive film functioning as the antenna is not limited to the linear form. For example, the conductive film may be provided in a curved form, a serpentine form, or a form combining them.

Exemplary shapes of the antenna provided in the internal antenna circuit 411 or the external antenna circuit 415 are shown in FIGS. 29A to 29E. For example, a layout shown in FIG. 29A may be used in which an antenna 523 is disposed all around a circuit element 522 having various circuits and the like. Note that the circuit element 522 herein includes various elements in a semiconductor device 251 capable of wireless communication (also referred to as RFID, ID chip, IC chip, IC tag, ID tag, or wireless chip) excluding the internal antenna circuit 411 or the external antenna circuit 415.

Figure 29A:
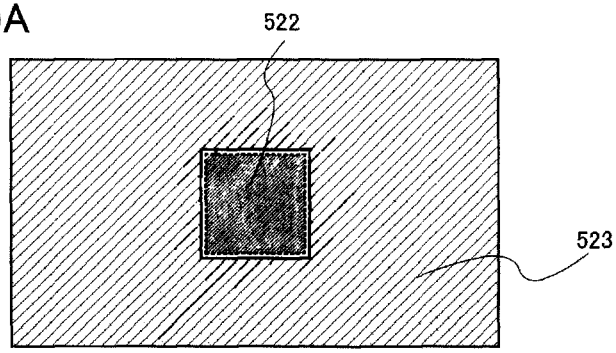
FIGS. 29A to 29E are top views each illustrating a circuit included in a battery of the present invention.
Figure 29B:
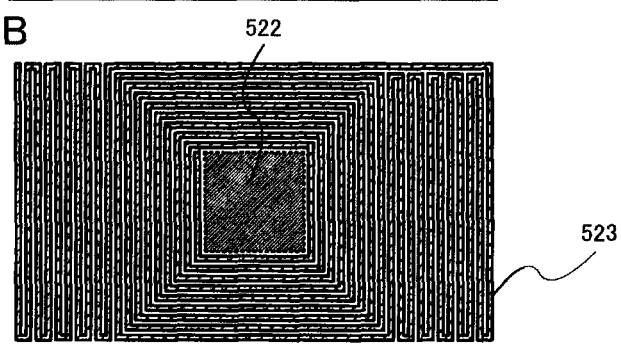
Figure 29C:
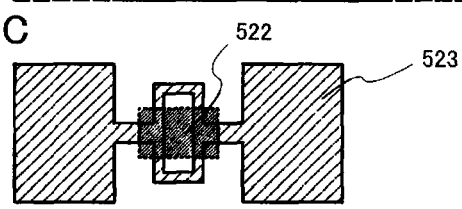
Figure 29D:
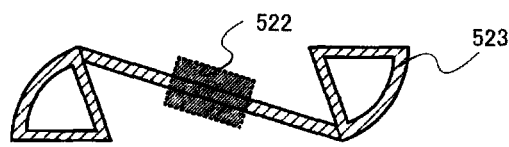
Figure 29E:
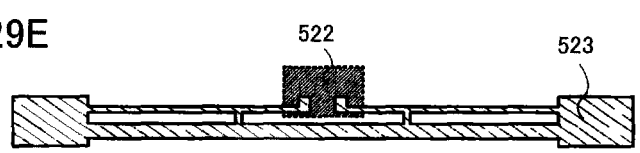

Alternatively, a layout shown in FIG. 29B may be used in which the circuit element 522 having various circuits and the like is coiled around by the thin antenna 523. Further, a layout shown in FIG. 29C may be used in which the antenna 523 has a form suited to receiving high-frequency electromagnetic waves from the circuit element 522 having various circuits and the like. Alternatively, a layout shown in FIG. 29D may be used in which the antenna 523 which is 180-degree omnidirectional (such that it can receive signals equally from any direction) may be disposed for the circuit element 522 having various circuits and the like. As a further alternative, a layout shown in FIG. 29E may be used in which the circuit element 522 having various circuits and the like is disposed, and the antenna 523 with a long rod shape is disposed. The internal antenna circuit 411 or the external antenna circuit 415 may be formed by combination of the antennas with the above-described shapes.

In FIGS. 29A to 29E, connection between the antenna 523 and the circuit element 522 having various circuits and the like is not specifically limited. For example, the antenna 523 and the circuit element 522 having various circuits and the like may be connected by wire bonding or bump bonding. Alternatively, part of the circuit element 522 may be used as an electrode to be attached to the antenna 523. With this method, the circuit element 522 can be attached to the antenna 523 by use of an ACF (Anisotropic Conductive Film). In addition, the length required of the antenna 523 differs depending on the reception frequency. For example, on the assumption that a frequency of 2.45 GHz is used, in the case of providing a half-wave dipole antenna, the length of the antenna is preferably about 60 nm (half the length of the wavelength); in the case of providing a monopole antenna, the length of the antenna is preferably about 30 nm (a quarter of the length of the wavelength).

Figure 30:
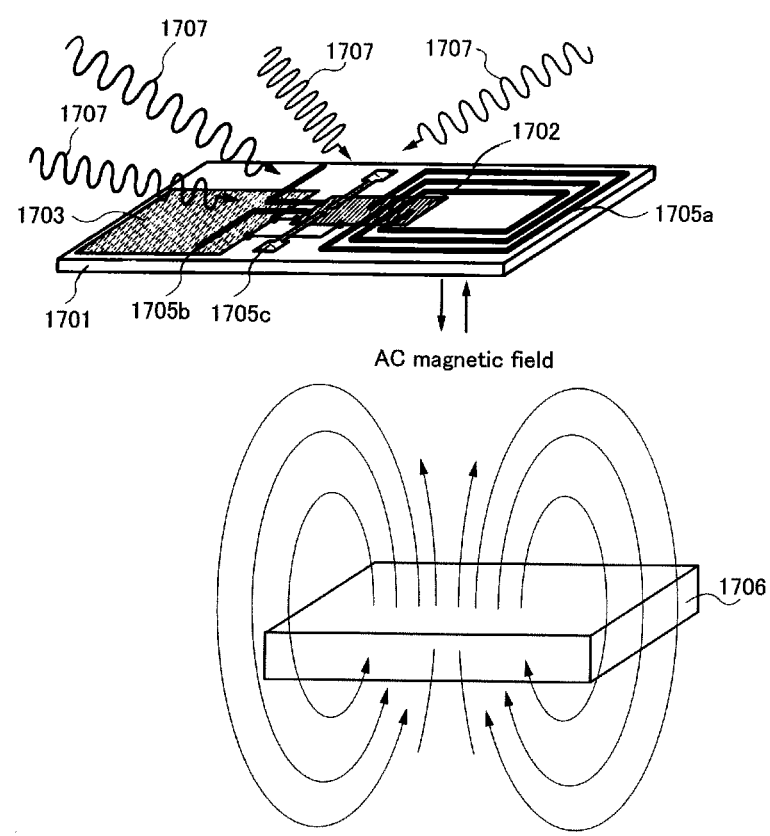
FIG. 30 is a diagram illustrating a circuit included in a battery of the present invention.

Note that the internal antenna circuit 411 may have a multi-band antenna structure capable of receiving electromagnetic waves with a plurality of frequency bands. For example, as shown in FIG. 30, the internal antenna circuit may be constructed from a plurality of antenna circuits. In the structure shown in FIG. 30, a first antenna circuit 1705a, a second antenna circuit 1705b, a third antenna circuit 1705c, a circuit element 1702 having a control circuit, and a battery 1703 are provided over a substrate 1701. Note that the first antenna circuit 1705a, the second antenna circuit 1705b, and the third antenna circuit 1705c are electrically connected to the control circuit provided in the circuit element 1702. Note also that reference numeral 1706 denotes a transmitter for transmitting electromagnetic waves for charging the battery, and provided in a display portion or the like.

Electric waves received at the first antenna circuit 1705a, the second antenna circuit 1705b, and the third antenna circuit 1705c are input to the battery 1703 through the rectifier circuit in the control circuit formed in the circuit element 1702, so that the battery 1703 is charged.

Here, an example is shown in which the first antenna circuit 1705a receives electric waves transmitted from the transmitter 1706, whereas the second antenna circuit 1705b and the third antenna circuit 1705c receive external radio signals 1707. Connection relation between the first antenna circuit 1705a, the second antenna circuit 1705b, and the third antenna circuit 1705c is not specifically limited. For example, all of the antennas may be electrically connected or separately provided without electrical connection.

Note that the lengths and shapes of the first antenna circuit 1705a, the second antenna circuit 1705b, and the third antenna circuit 1705c that are used for charging the battery 1703 are not limited to those shown in FIG. 30. Although FIG. 30 illustrates the example where linear antennas (dipole antennas) with different lengths are used as the second antenna circuit 1705b and the third antenna circuit 1705c, the following combinations may also be employed: a dipole antenna and a coiled antenna, a dipole antenna and a patch antenna, and the like. In this manner, by provision of a plurality of antennas with different lengths or shapes as the antennas used for charging the battery 1703, various radio signals can be received. Therefore, charging efficiency can be improved. In particular, when antennas with different shapes, e.g., a patch antenna and a dipole antenna, are used in combination (such that a folding dipole antenna is disposed around a patch antenna), limited space can be effectively used. Although the battery shown in this embodiment mode is provided with the three antenna circuits 1705a, 1705b, and 1705c, the invention is not limited to this structure. It is also possible to provide one antenna circuit or more then three antenna circuits.

As exemplary signals communicated between the first antenna circuit 1705a and the transmitter 1706, signals with a frequency band of 125 kHz, 13.56 MHz, 915 MHz, 2.45 GHz, or the like which meets the ISO standards can be used. Needless to say, the frequency of signals communicated between the first antenna circuit 1705a and the transmitter 1706 is not limited to these, and for example, any of the following frequencies can be used: submillimeter waves of 300 GHz to 3 THz, millimeter waves of 30 GHz to 300 GHz, microwaves of 3 GHz to 30 GHz, a ultra high frequency of 300 MHz to 3 GHz, a very high frequency of 30 MHz to 300 MHz, a high frequency of 3 MHz to 30 MHz, a medium frequency of 300 kHz to 3 MHz, a low frequency of 30 kHz to 300 kHz, and a very low frequency of 3 kHz to 30 kHz. In addition, signals communicated between the first antenna circuit 1705a and the transmitter 1706 are signals obtained by carrier modulation. A carrier modulation method can be either analog modulation or digital modulation, and any of amplitude modulation, phase modulation, frequency modulation, and spread spectrum can be used. Preferably, amplitude modulation or frequency modulation is used.

In addition, as the external radio signals 1707 received at the second antenna circuit 1705b and the third antenna circuit 1705c, the following signals can be used: radio wave (e.g., 800 MHz to 900 MHz, 1.5 GHz, or 1.9 to 2.1 GHz) from mobile-phone relay stations, radio waves radiated from mobile phones, radio waves (e.g., 40 kHz) of radio wave clocks, noise (e.g., 60 Hz) of domestic AC power supply, signals randomly emitted from other readers/writers, and the like. When the battery is wirelessly charged with radio signals received from outside, there is no need to use a separate charger and the like for charging the battery. Therefore, the manufacturing cost can be reduced. Further, when a plurality of antenna circuits having antennas with different lengths or shapes are provided as shown in FIG. 30, it is possible to use various radio signals for charging the battery 1703. In addition, the antennas provided in the second antenna circuit 1705b and the third antenna circuit 1705c are preferably formed to have lengths and shapes that can receive the above-described radio signals with high sensitivity. In addition, although FIG. 30 illustrates the example where the first antenna circuit 1705a receives electromagnetic waves from the transmitter 1706, the invention is not limited to this, and a structure may be used in which all of the antenna circuits receive external radio signals for charging the battery.

Although FIG. 30 illustrates the example where the plurality of antenna circuits 1705a, 1705b, and 1705c, the circuit element 1702, and the battery 1703 are provided over the same substrate 1701, the invention is not limited to this structure. For example, the above-described components may be provided over different substrates.

Next, a thin-film battery will be described as a configuration example of the battery 407 shown in FIG. 27. In this embodiment mode, a configuration example of a battery in the case of using a thin lithium ion battery is described with reference to FIG. 31.

Figure 31:
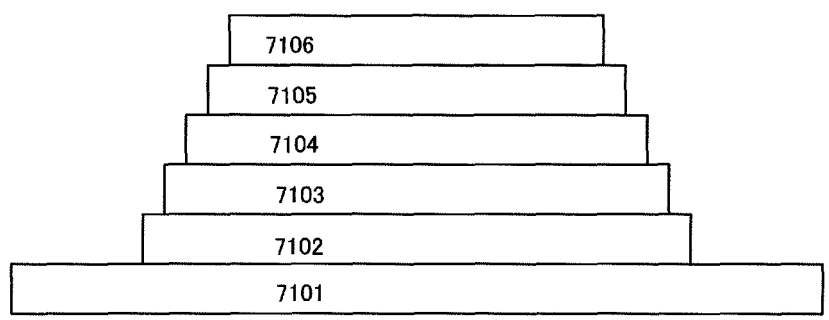
FIG. 31 is a cross-sectional view of a battery of the present invention.

FIG. 31 illustrates a schematic cross section of a thin-film battery. First, a current-collecting thin film 7102 to serve as an electrode is formed over a substrate 7101. The current-collecting thin film 7102 should have high adhesion to an upper negative electrode active material layer 7103 and have low resistance. For example, aluminum, copper, nickel, vanadium, or the like can be used. Next, the negative electrode active material layer 7103 is formed over the current-collecting thin film 7102. Generally, vanadium oxide ($V_2O_5$) or the like is used. Next, a solid electrolyte layer 7104 is formed over the negative electrode active material layer 7103. Generally, lithium phosphate ($Li_3PO_4$) or the like is used. Next, a positive electrode active material layer 7105 is formed over the solid electrolyte layer 7104. Generally, lithium manganate ($LiMn_2O_4$) or the like is used. Lithium cobaltate ($LiCoO_2$) or lithium nickel oxide ($LiNiO_2$) can also be used. Next, a current-collecting thin film 7106 to serve as an electrode is formed over the positive electrode active material layer 7105. The current-collecting thin film 7106 should have high adhesion to the positive electrode active material layer 7105 and have low resistance. For example, aluminum, copper, nickel, vanadium, or the like can be used. Note that lithium ion batteries are advantageous over nickel-cadmium batteries, lead batteries, and the like in that they have no memory effects and can discharge a large amount of current.

Each of thin layers of the current-collecting thin film 7102, the negative electrode active material layer 7103, the solid electrolyte layer 7104, the positive electrode active material layer 7105, and the current-collecting thin film 7106 may be formed by using a sputtering technique or an evaporation technique. In addition, each of the current-collecting thin film 7102, the negative electrode active material layer 7103, the solid electrolyte layer 7104, the positive electrode active material layer 7105, and the current-collecting thin film 7106 preferably has a thickness of 0.1 μm to 3 μm.

Next, charging and discharging operations will be described. In charging the battery, lithium ions are desorbed from the positive electrode active material layer. Then, the lithium ions are absorbed into the negative electrode active material layer through the solid electrolyte layer. At this time, electrons are released out of the positive electrode active material layer.

In discharging the battery, on the other hand, lithium ions are desorbed from the negative electrode active material layer. Then, the lithium ions are absorbed into the positive electrode active material layer through the solid electrolyte layer. At this time, electrons are released out of the negative electrode active material layer. The thin-film secondary battery operates in this manner.

Note that it is preferable to stack another set of thin layers of the current-collecting thin film 7102, the negative electrode active material layer 7103, the solid electrolyte layer 7104, the positive electrode active material layer 7105, and the current-collecting thin film 7106, whereby higher electricity can be stored in or released from the battery.

The battery shown in this embodiment mode has a thin-film form with a thickness of about 10 μm or less, and is chargeable and dischargeable. Therefore, using the battery in this embodiment mode can fabricate a compact and lightweight semiconductor device.

Figure 32:
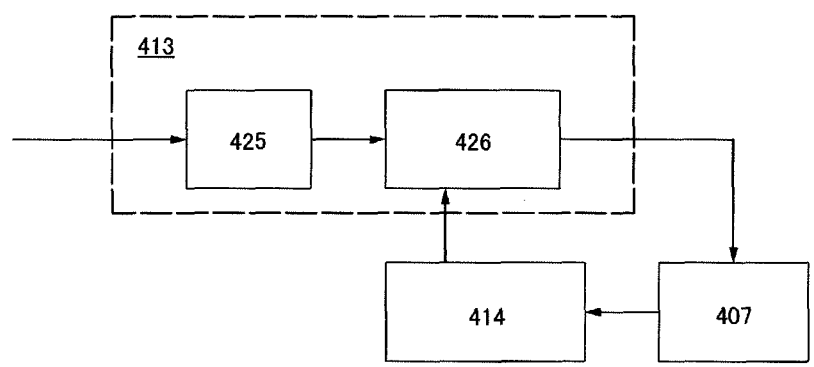
FIG. 32 is a block diagram illustrating a circuit included in a battery of the present invention.

When using a battery that is chargeable and dischargeable, it is generally necessary to control the charging and discharging of the battery. That is, it is necessary to charge the battery while at the same time monitoring the charged level of the battery in order to prevent overcharging. A charge control circuit in this embodiment mode will now be described. FIG. 32 is a block diagram of the charging circuit 413, the charge control circuit 414, and the battery 407 shown in FIG. 27.

The charging circuit 413 illustrated in FIG. 32 includes a constant current source circuit 425 and a switch circuit 426, and is electrically connected to the charge control circuit 414 and the battery 407. Note that the charging circuit shown in FIG. 32 is only exemplary. Therefore, the invention is not limited to this structure and other structures may also be used. Although the battery 407 is charged with a constant current in this embodiment mode, a power source may be switched to a constant voltage source at a certain point. In addition, another method without using a constant current may also be employed. Further, transistors included in the circuit, which are described below may be any of thin film transistors, transistors on a single-crystalline substrate, and organic transistors.

Figure 33:
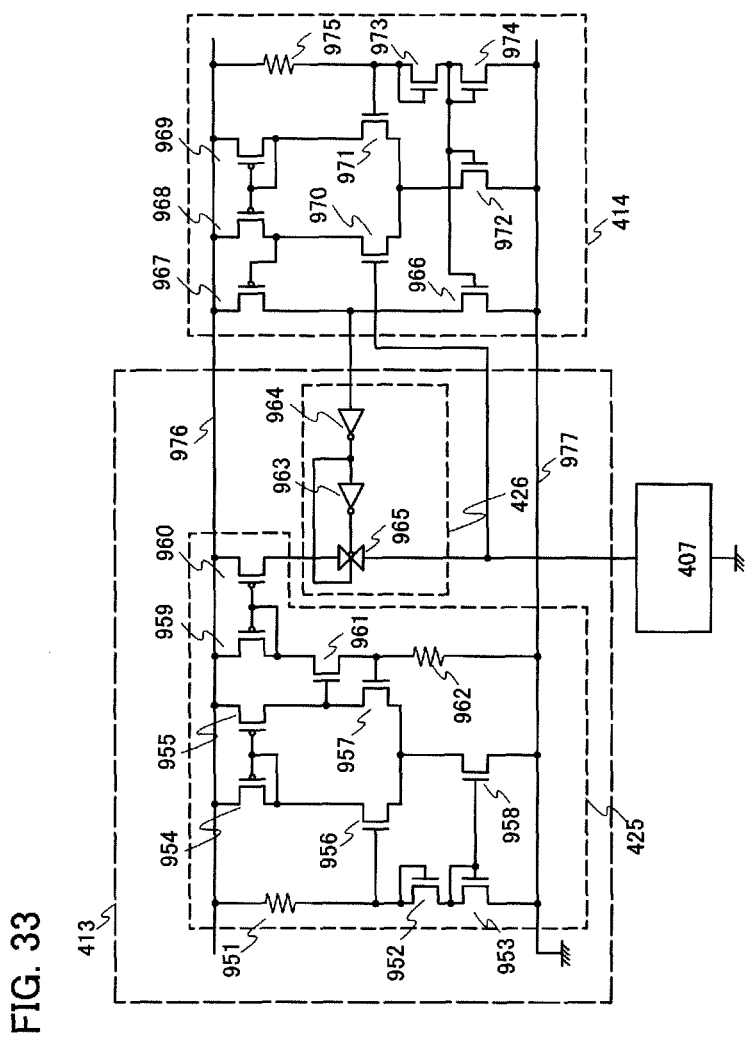
FIG. 33 is a circuit diagram of a circuit included in a battery of the present invention.

FIG. 33 is a detailed diagram of FIG. 32. The operation of the circuit will be described below. The constant current source circuit 425, the switch circuit 426, and the charge control circuit 414 use a high-potential power supply line 976 and a low-potential power supply line 977 as power supply lines. Although the low-potential power supply line 977 is used as a GND line in FIG. 33, the low-potential power supply line 977 may have a different potential without limitation to GND.

The constant current source circuit 425 includes transistors 952 to 961 and resistors 951 and 962. A current flows into the transistors 952 and 953 from the high-potential power supply line 976 through the resistor 951, so that the transistors 952 and 953 are turned on.

The transistors 954 to 958 constitute a feedback differential amplifier, and the gate potential of the transistor 952 is about the same level as the gate potential of the transistor 956. The drain current of the transistor 961 has a value obtained by dividing a potential difference between the gate potential of the transistor 957 and the potential of the low-potential power supply line 977 by the resistance value of the resistor 962. The drain current is input into the current mirror circuit constructed from the transistors 959 and 960, and an output current of the current mirror circuit is supplied to the switch circuit 426. The constant current source circuit 425 is not limited to this structure and a different structure may also be used.

The switch circuit 426 includes a transmission gate 965 and inverters 963 and 964. The input signal of the inverter 964 controls whether or not to supply a current to the battery 407 from the constant current source circuit 425. The switch circuit is not limited to this structure and a different structure may also be used.

The charge control circuit 414 includes transistors 966 to 974 and a resistor 975. A current flows into the transistors 973 and 974 from the high-potential power supply line 976 through the resistor 975, so that the transistors 973 and 974 are turned on. The transistors 968 to 972 constitute a differential comparator. When the gate potential of the transistor 970 is lower than the gate potential of the transistor 971, the drain potential of the transistor 968 has about the same level as the potential of the high-potential power supply line 976, whereas when the gate potential of the transistor 970 is higher than the gate potential of the transistor 971, the drain potential of the transistor 968 is about the same level as the source potential of the transistor 970.

When the drain potential of the transistor 968 is about the same level as the potential of the high-potential power supply line 976, the charge control circuit 414 outputs a low signal through a buffer constructed from the transistors 967 and 966. When the drain potential of the transistor 968 is about the same level as the source potential of the transistor 970, the charge control circuit 414 outputs a high signal through the buffer constructed from the transistors 967 and 966.

When the output of the charge control circuit 414 is low, a current is supplied to the battery 407 through the switch circuit 426. On the other hand, when the output of the charge control circuit 414 is high, the switch circuit 426 is turned off and no current is supplied to the battery 407. A gate of the transistor 970 is electrically connected to the battery 407; therefore, when the battery has been charged and the potential of the battery has surpassed the threshold voltage of the comparator of the charge control circuit 414, charging stops. Although the threshold voltage of the comparator is set at the gate potential of the transistor 973 in this embodiment mode, the threshold voltage is not limited to this value, and may be a different potential. Such potential is generally determined in accordance with the intended use of the device and the performance of the battery. Note that the configuration of the charging circuit for the battery is not limited to this structure.
Embodiment Mode 9

In this embodiment mode, a device including a semiconductor device (photoelectric conversion device) obtained in accordance with Embodiment Mode 1 to Embodiment Mode 7, a battery obtained in accordance with Embodiment Mode 8, and a semiconductor device capable of wireless communication will be described with reference to FIG. 34, FIGS. 35A and 35B, FIGS. 36A and 36B, FIG. 37, FIG. 38, and FIG. 39.

Figure 34:
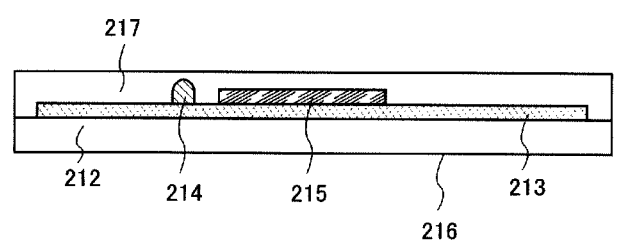
FIG. 34 is a cross-sectional view of a device manufactured using the present invention.

A device 216 shown in FIG. 34 includes a substrate 212 made of a resin such as polyimide, a chip 215 provided over the substrate 212, an antenna 213 made of a conductor such as copper, a light emitting element (light emitting diode (LED)) 214 provided over the substrate 212, and a light transmitting protective film 217 provided over the chip 215.

In the chip 215, a photo sensor (photoelectric conversion device) 252 as a sensor, a semiconductor device 251 capable of wireless communication, and a light emitting diode (LED) 253 as a light source (see FIG. 35A) are provided. If necessary, an RF (Radio Frequency) battery 254 may be placed as means for supplying power to each element (see FIG. 35B). However, the LED 253 is not necessarily provided as described below.

Figure 35A:
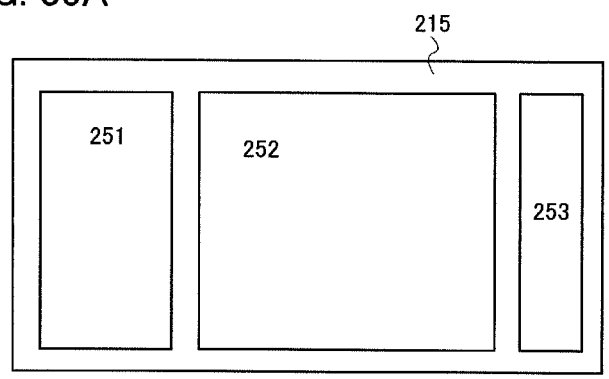
FIGS. 35A and 35B are block diagrams each illustrating a device manufactured using the present invention.
Figure 35B:
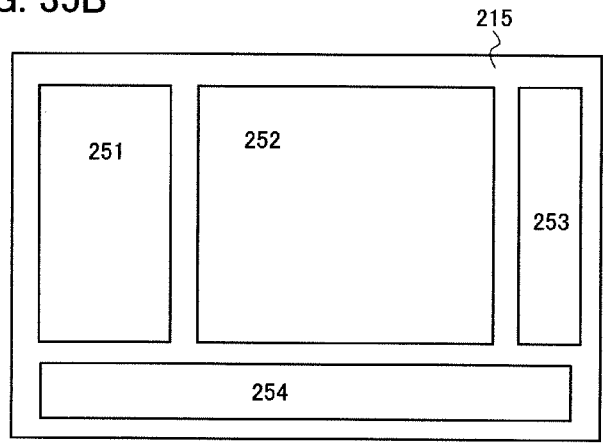
Figure 36A:
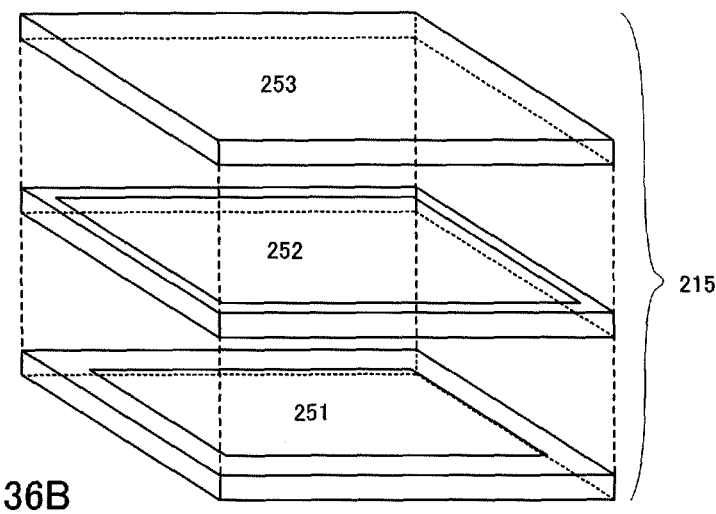
FIGS. 36A and 36B are block diagrams each illustrating a device manufactured using the present invention.
Figure 36B:
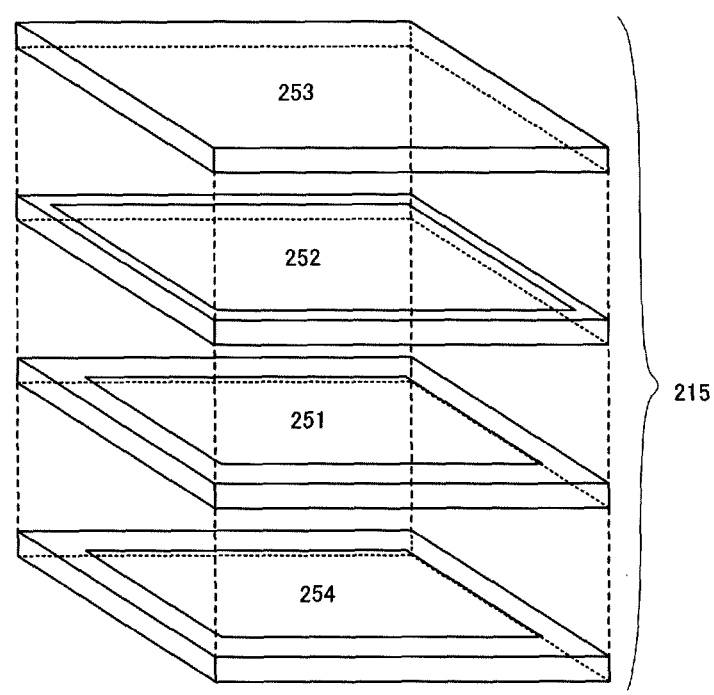

In FIGS. 35A and 35B, the photosensor 252, the semiconductor device 251 capable of wireless communication, and the LED 253, and the RF battery 254 are placed over the same flat surface. However, the chip 215 may be formed by forming the components over separate substrates and then attaching them together. FIG. 36A shows the chip 215 obtained by attaching together the semiconductor device 251 capable of wireless communication, the photosensor 252, and the LED 253, and FIG. 36B shows the chip 215 obtained by attaching together the semiconductor device 251 capable of wireless communication, the photosensor 252, the LED 253, and the RF battery 254. The order of stacking the semiconductor device 251 capable of wireless communication, the photosensor 252, the LED 253, and the RF battery 254 is not required to be that shown in FIG. 36A or FIG. 36B. A through-hole is provided in each substrate and the substrate is electrically connected to each other with a conductive material. In addition, the LED 253 may be surface-emitting.

Note that with respect to the light emitting element 214 and the light emitting diode 253 included in the chip 215, one or both of them may be provided. In addition, the light emitting element 214 and the LED 253 is not required to be provided if sufficient light that can be detected by the photosensor 252 is obtained from the external.

The photosensor 252 in this embodiment mode is a semiconductor device (photoelectric conversion device) obtained in accordance with Embodiment Mode 1 to Embodiment Mode 7; therefore, the manufacturing steps of Embodiment Mode 1 to Embodiment Mode 7 are used as appropriate.

Further, a battery obtained in Embodiment Mode 8 can be used as the RF battery 254, the manufacturing steps in Embodiment Mode 8 are used.

Figure 37:
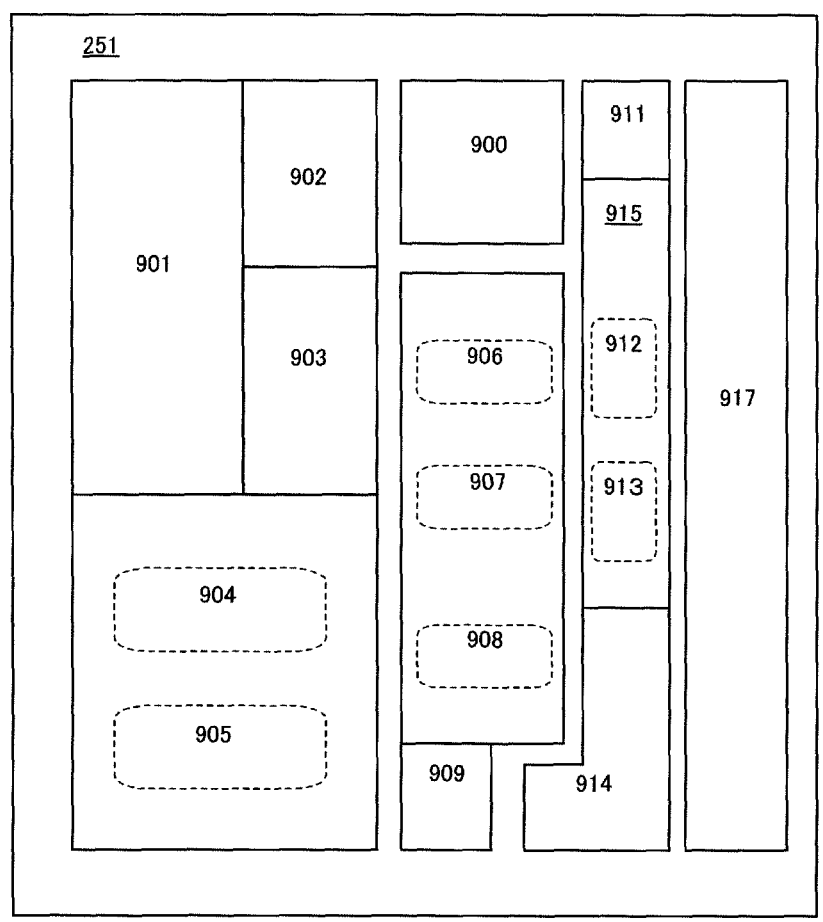
FIG. 37 is a block diagram illustrating a semiconductor device capable of wireless communication of the present invention.

Note that the antenna 213 shown in FIG. 34 may be electrically connected to each of the antenna 917 which is shown in FIG. 37, the internal antenna circuit 411, and the external antenna circuit 415 which are shown in FIG. 27. Alternatively, the antenna 213 may double as any one or a plurality of the antenna 917, the internal antenna circuit 411, and the external antenna circuit 415.

Figure 38:
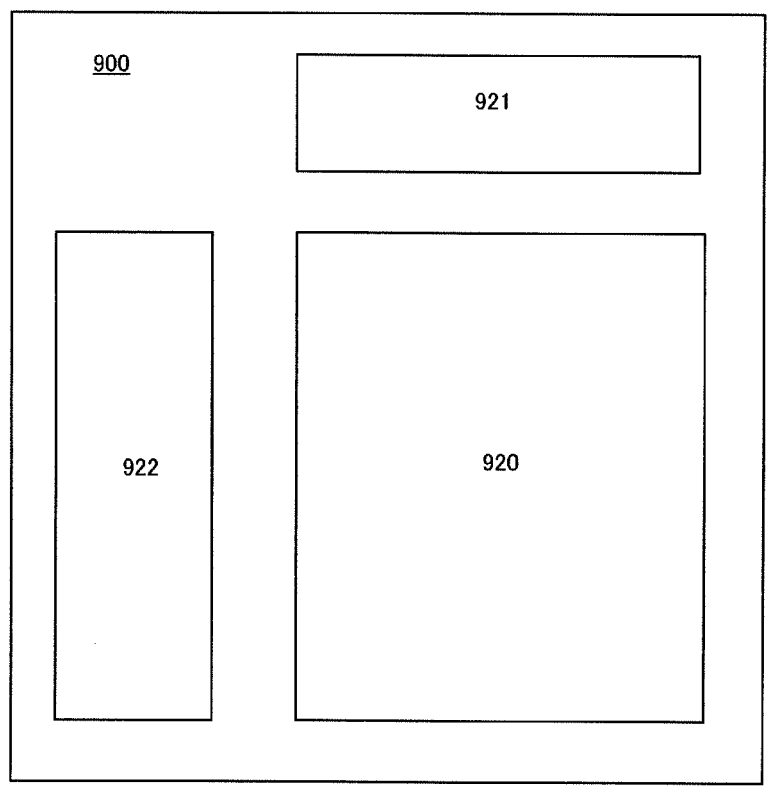
FIG. 38 is a block diagram illustrating a memory circuit of the present invention.
Figure 39:
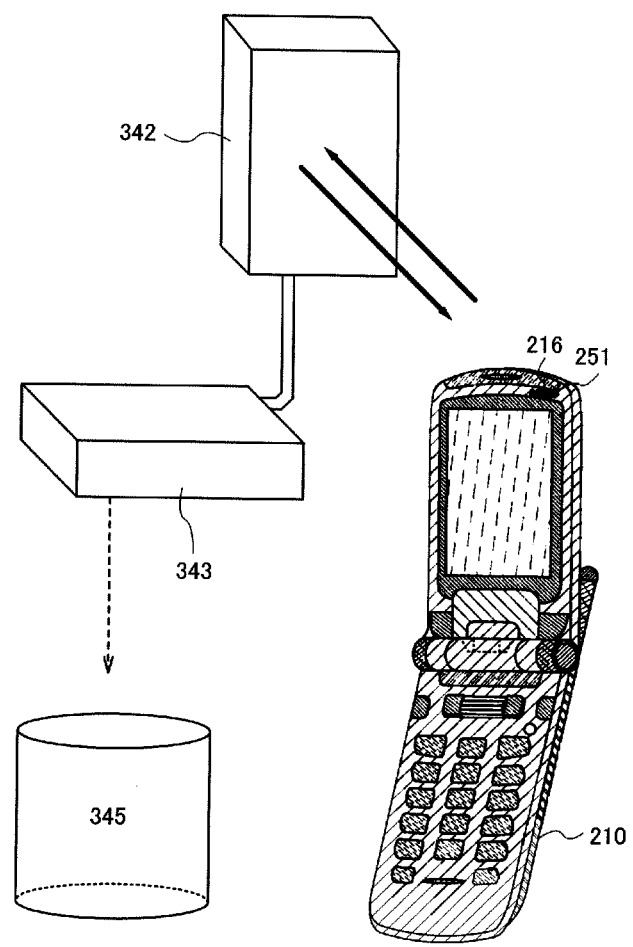
FIG. 39 is a diagram illustrating a system of wireless communication of the present invention.

Next, a structure and operation of the semiconductor device 251 of this embodiment mode capable of wireless communication is described with reference to FIG. 37, FIG. 38, and FIG. 39.

First, the structure is described. As shown in FIG. 37, a semiconductor device (also referred to as an RFID, an ID chip, an IC chip, an IC tag, an ID tag, or a wireless chip) 251 of the present invention capable of wireless communication includes circuit blocks of a rectifier circuit 906, a demodulation circuit 907, an analog amplifier 908, an antenna 917, a high-frequency circuit 914, a power supply circuit 915, a reset circuit 911, a clock generation circuit 903, a modulation circuit 909, a signal output control circuit 901, a CRC (Cyclic Redundancy Code) circuit 902, and a memory circuit 900. The power supply circuit 915 includes circuit blocks of a rectifier circuit 913 and a storage capacitor 912. Further, as shown in FIG. 38, the memory circuit 900 includes a memory cell array 920, a column decoder 921, and a row decoder 922.

As the antenna 917, any of a dipole antenna, a patch antenna, a loop antenna, and a Yagi antenna can be used.

In addition, as a method for transmitting and receiving a wireless signal in the antenna 917, any of an electromagnetic coupling method, an electromagnetic induction method, and an electromagnetic wave method may be used.

Next, the operation of the semiconductor device 251 of the present invention capable of wireless communication is described. As shown in FIG. 39, a wireless signal is transmitted from an antenna unit 342 which is electrically connected to an interrogator (also referred to as a reader/writer) 343. The wireless signal includes an instruction from the interrogator (also referred to as a reader/writer) 343 to the semiconductor device 251 capable of wireless communication. Note that in FIG. 39, the device 216 including the semiconductor device 251 capable of wireless communication is built in the electronic device 210. Further, a wireless response signal from the electronic device 210 is stored in a memory unit 345 through the antenna unit 342 and the interrogator 343.

The wireless signal received by the antenna 917 is transmitted to each circuit block via the high-frequency circuit 914. The signal transmitted to the power supply circuit 915 via the high-frequency circuit 914 is input to the rectifier circuit 913.

Here, the rectifier circuit 913 acts to rectify a polarity of the wireless signal. The signal is rectified and then smoothed by the storage capacitor 912. Then, a high power supply potential (VDD) is generated.

The wireless signal received by the antenna 917 is also transmitted to the rectifier circuit 906 via the high-frequency circuit 914. The signal is rectified and then demodulated by the demodulation circuit 907. The demodulated signal is amplified by the analog amplifier 908.

Further, the wireless signal received by the antenna 917 is also transmitted to the clock generation circuit 903 via the high-frequency circuit 914. The signal transmitted to the clock generation circuit 903 is frequency-divided to be a reference clock signal. Here, the reference clock signal is transmitted to each circuit block and used for latching a signal, selecting a signal, and the like.

The signal amplified by the analog amplifier 908 and the reference clock signal are transmitted to a code extraction circuit 904. In the code extraction circuit 904, an instruction transmitted from the interrogator 343 to the semiconductor device 251 capable of wireless communication is extracted from the signal amplified by the analog amplifier 908. The code extraction circuit 904 also forms a signal for controlling a code identification circuit 905.

The instruction extracted by the code extraction circuit 904 is transmitted to the code identification circuit 905. The code identification circuit 905 identifies the instruction transmitted from the interrogator 343. The code identification circuit 905 also has a role of controlling the CRC circuit 902, the memory circuit 900, and the signal output control circuit 901.

In this manner, the instruction transmitted from the interrogator (also referred to as a reader/writer) 343 is identified, and the CRC circuit 902, the memory circuit 900, and the signal output control circuit 901 are operated in accordance with the identified instruction. In addition, a signal including data which is stored in or written to the memory circuit 900, is output.

The memory circuit 900 includes data that is stored in advance. The data that is stored in advance may be data of personal information or the like. Data from the photosensor 252 may be written if necessary. The data from the photo sensor 202 may be data of intensity of external light, light intensity of a display panel, or the like.

The memory circuit 900 includes the memory cell array 920, the column decoder 921, and the row decoder 922.

The signal output control circuit 901 has a role of converting the signal including the data which is stored in or written to the memory circuit 900 into a signal encoded by an encoding method to which a standard of the ISO or the like is applied.

Lastly, in accordance with the encoded signal, the signal transmitted to the antenna 917 is modulated by the modulation circuit 909.

The modulated signal is received by the antenna unit 342 which is electrically connected to the interrogator 343. Then, the received signal is analyzed by the interrogator 343, and the data of the semiconductor device 251 of the present invention capable of wireless communication can be recognized.

In a wireless communication system using the semiconductor device 251 capable of wireless communication, formed using the present invention, the semiconductor device 251 capable of wireless communication, the interrogator 343 having a known structure, an antenna electrically connected to the interrogator, and a control terminal for controlling the interrogator can be used. A communication method of the semiconductor device 251 capable of wireless communication and the antenna electrically connected to the interrogator is one-way communication or two-way communication, and any of a space division multiplexing method, a polarization division multiplexing method, a frequency-division multiplexing method, a time-division multiplexing method, a code division multiplexing method, and an orthogonal frequency division multiplexing method can also be used.

The wireless signal is a signal in which a carrier wave is modulated. Modulation of a carrier wave is an analog modulation or a digital modulation, which may be any of an amplitude modulation, a phase modulation, a frequency modulation, and spread spectrum.

As for a frequency of a carrier wave, any of the following can be employed: a submillimeter wave of greater than or equal to 300 GHz and less than or equal to 3 THz; an extra high frequency of greater than or equal to 30 GHz and less than 300 GHz; a super high frequency of greater than or equal to 3 GHz and less than 30 GHz; an ultra high frequency of greater than or equal to 300 MHz and less than 3 GHz; a very high frequency of greater than or equal to 30 MHz and less than 300 MHz; a high frequency of greater than or equal to 3 MHz and less than 30 MHz; a medium frequency of greater than or equal to 300 kHz and less than 3 MHz; a low frequency of greater than or equal to 30 kHz and less than 300 kHz; and a very low frequency of greater than or equal to 3 kHz and less than 30 kHz.

In this embodiment mode, the device 216 is built in the electronic device 210; however, a structure in which the device 216 is attached to the exterior of the electronic device 210 may be employed.

Further, if an adhesion portion is provided on the device 216, the device 216 can be removable and reusable.

Embodiment Mode 10

This embodiment mode will describe examples of various electronic devices which include photoelectric conversion devices in accordance with the invention. Examples of electronic devices to which the invention is applied include computers, displays, mobile phones, television sets, and the like. Specific examples of such electronic devices are shown in FIG. 40, FIGS. 41A and 41B, FIGS. 42A and 42B, FIG. 43, and FIGS. 44A and 44B.

Figure 40:
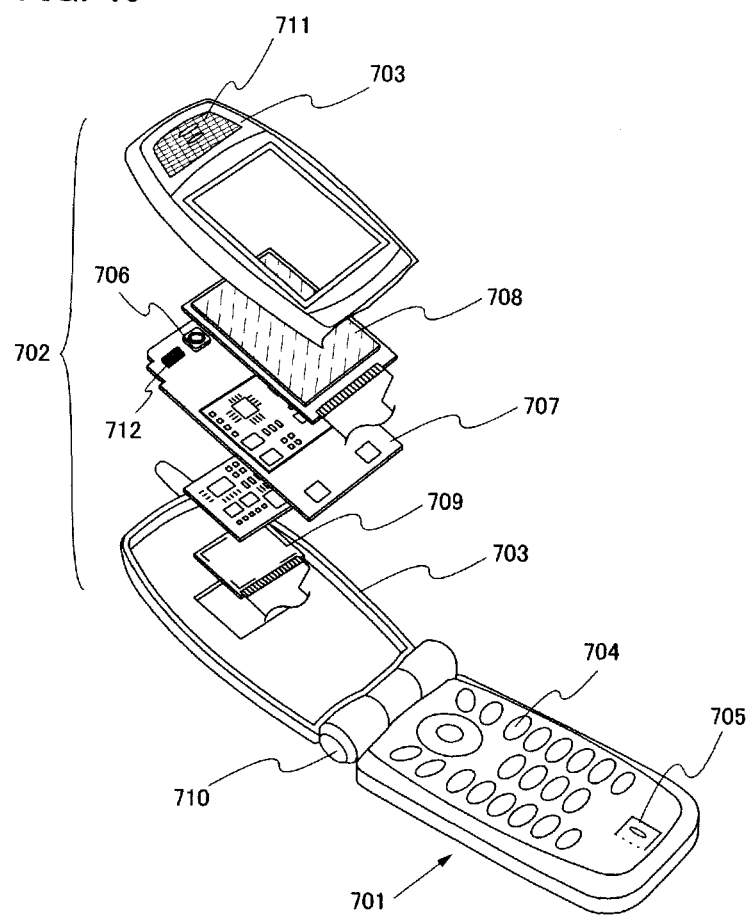
FIG. 40 is a diagram of a device mounted with a semiconductor device of the present invention.

FIG. 40 illustrates a mobile phone which includes a main body (A) 701, a main body (B) 702, a housing 703, operation keys 704, an audio input portion 705, an audio output portion 706, a circuit board 707, a display panel (A) 708, a display panel (B) 709, a hinge 710, a light-transmitting material portion 711, and a photoelectric conversion element 712. A semiconductor device obtained in accordance with Embodiment Mode 1 to Embodiment Mode 7, a device obtained by a combination of any one of Embodiment Mode 1 to Embodiment Mode 7 and Embodiment Mode 8, or a device obtained in accordance with Embodiment Mode 9 (hereinafter also referred to as "device of the invention device") can be applied to the photoelectric conversion element 712.

The photoelectric conversion element 712 detects light that has passed through the light-transmitting material portion 711, and controls the luminance of the display panel (A) 708 and the display panel (B) 709 as well as controlling the lighting of the operation keys 704 in accordance with the illuminance of outside light that has been detected by the photoelectric conversion element 712. Accordingly, power consumption of the mobile phone can be suppressed.

Figure 41A:
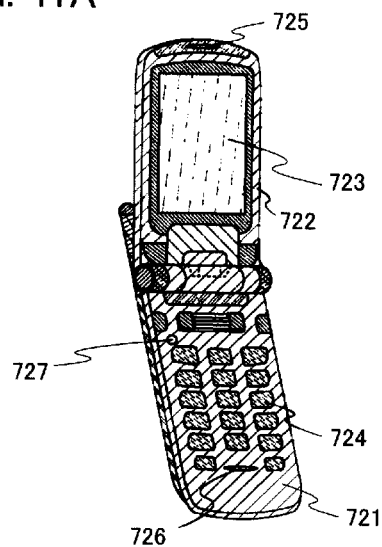
FIGS. 41A and 41B are diagrams each illustrating a device mounted with a semiconductor device of the present invention.
Figure 41B:
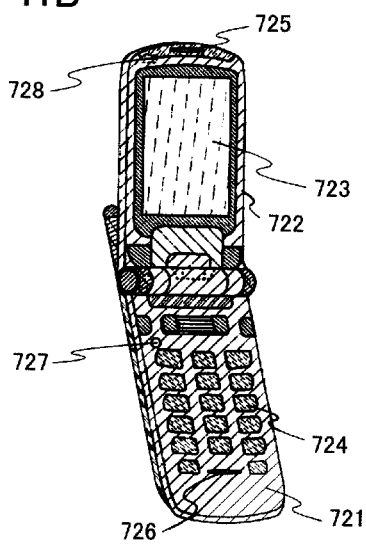

FIGS. 41A and 41B illustrate other examples of mobile phones. In FIGS. 41A and 41B, reference numeral 721 denotes a main body, reference numeral 722 denotes a housing, reference numeral 723 denotes a display panel, reference numeral 724 denotes operation keys, reference numeral 725 denotes an audio output portion, reference numeral 726 denotes an audio input portion, and reference numerals 727 and 728 denote photoelectric conversion elements.

A semiconductor device obtained in accordance with Embodiment Mode 1 to Embodiment Mode 7, a device obtained by a combination of any one of Embodiment Mode 1 to Embodiment Mode 7 and Embodiment Mode 8, or a device obtained in accordance with Embodiment Mode 9 (a device of the invention device) can be applied to the photoelectric conversion elements 727 and 728.

In the mobile phone shown in FIG. 41A, luminance of the display panel 723 and the operation keys 724 can be controlled by detecting outside light with the photoelectric conversion element 727 provided in the main body 721.

In the mobile phone shown in FIG. 41B, the photoelectric conversion element 728 is provided inside the main body 721 in addition to the structure of FIG. 41A. With the photoelectric conversion element 728, luminance of a backlight provided in the display panel 723 can also be detected.

Figure 42A:
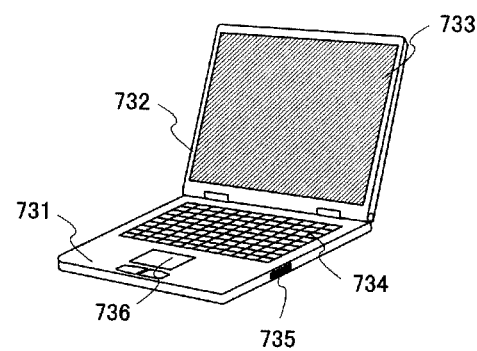
FIGS. 42A and 42B are diagrams each illustrating a device mounted with a semiconductor device of the present invention.

FIG. 42A illustrates a computer which includes a main body 731, a housing 732, a display portion 733, a keyboard 734, an external connection port 735, a pointing device 736, and the like.

Figure 42B:
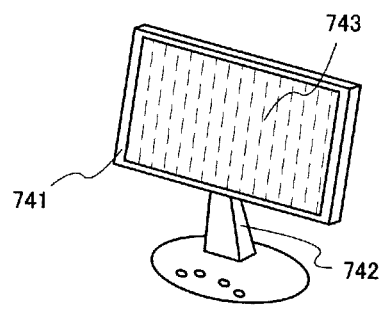

FIG. 42B illustrates a display device which corresponds to a television receiver for example. The display device includes a housing 741, a supporting base 742, a display portion 743, and the like.

Figure 43:
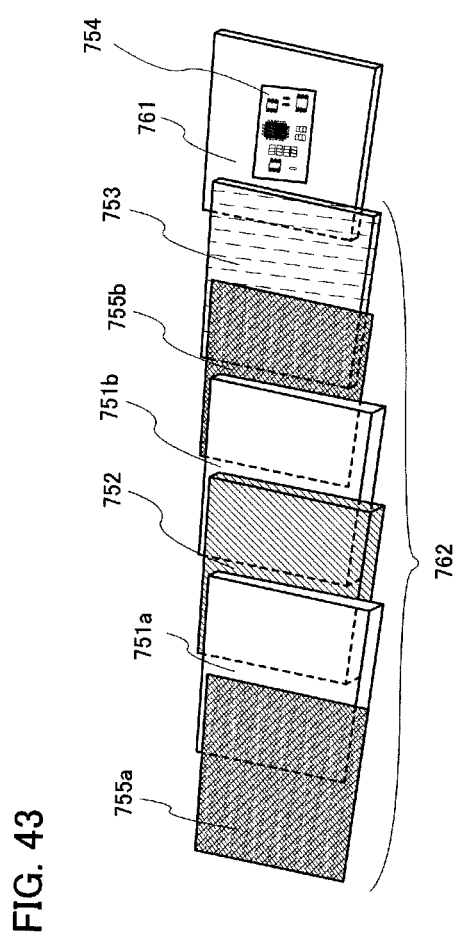
FIG. 43 is a diagram of a device mounted with a semiconductor device of the present invention.

FIG. 43 illustrates a specific configuration where a liquid crystal panel is used as the display portion 733 provided in the computer shown in FIG. 42A and the display portion 743 of the display device shown in FIG. 42B.

A liquid crystal panel 762 shown in FIG. 43 is built into a housing 761, and includes substrates 751a and 751b, a liquid crystal layer 752 sandwiched therebetween, polarization filters 755a and 755b, a backlight 753, and the like. In the housing 761, a photoelectric conversion element formation region 754 having a photoelectric conversion element is formed.

A device of the present invention can also be applied to the photoelectric conversion element in FIG. 43.

The photoelectric conversion element formation region 754 fabricated in accordance with the invention detects the amount of light from the backlight 753, the data of which is fed back to control the luminance of the liquid crystal panel 762.

Figure 44A:
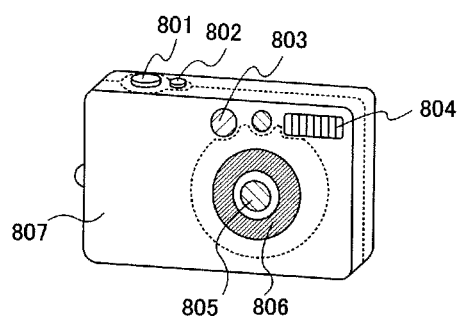
FIGS. 44A and 44B are diagrams illustrating a device mounted with a semiconductor device of the present invention.
Figure 44B:
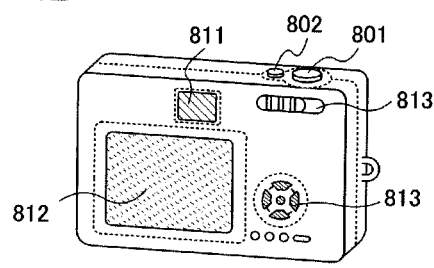

FIGS. 44A and 44B illustrate an example where a device of the present invention is built into a camera, e.g., a digital camera. FIG. 44A is a perspective view of the digital camera seen from the front side, and FIG. 44B is a perspective view thereof seen from the rear side. Referring to FIG. 44A, the digital camera is provided with a release button 801, a main switch 802, a viewfinder 803, a flash portion 804, a lens 805, a barrel 806, and a housing 807.

Referring to FIG. 44B, the digital camera is also provided with a viewfinder eyepiece 811, a monitor 812, and operation buttons 813.

When the release button 801 is pushed down to the half point, a focus adjustment mechanism and an exposure adjustment mechanism are activated. When the release button is pushed down to the lowest point, a shutter opens.

By pushing down or rotating the main switch 802, power of the digital camera is switched on or off.

The viewfinder 803 is located above the lens 805 on the front side of the digital camera, for checking the shooting range and the focus point from the viewfinder eyepiece 811 shown in FIG. 44B.

The flash portion 804 is located in the upper portion of the front side of the digital camera. When the luminance of the photographic subject is not enough, the release button may be pushed down to open the shutter and deliver auxiliary light from the flash portion 804.

The lens 805 is located at the front side of the digital camera and includes a focusing lens, a zoom lens, and the like. This lens, in conjunction with a shutter and a diaphragm (not shown), constitutes an imaging optical system. Behind the lens, an imaging device such as a CCD (Charge Coupled Device) is provided.

The barrel 806 moves the position of the lens to adjust the focus of the focusing lens, the zoom lens, and the like. In shooting, the barrel is slid out to move the lens 805 forward. When carrying the digital camera, the lens 805 is retracted to be compact. Note that a structure is employed in this embodiment mode in which the photographic subject can be zoomed and shot by sliding out the barrel; however, the invention is not limited to this structure. For example, a digital camera may be constructed which can zoom and shoot the photographic subject without sliding out the barrel with the use of the imaging optical system inside the housing 807.

The viewfinder eyepiece 811 is located in the upper portion of the rear side of the digital camera for looking therethrough in checking the shooting range and the focus point.

The operation buttons 813 are buttons with various functions provided on the rear side of the digital camera, which include a setup button, a menu button, a display button, a function button, a selection button, and the like.

When a device of the present invention is built into the camera shown in FIGS. 44A and 44B, presence and intensity of outside light can be detected with the device of the invention; thus, exposure adjustment and the like of the camera can be performed.

In addition, a device of the present invention can also be applied to other electronic devices such as a projection TV and a navigation system. That is, the photosensor of the invention can be applied to any object which needs to detect light.

Note that this embodiment mode can be combined with any of other embodiment modes.

Embodiment Mode 11

In this embodiment mode, semiconductor devices having different structures from the ones in Embodiment Mode 1 to Embodiment Mode 7 will be described with reference to FIG. 57 and FIG. 58. Note that a semiconductor device (photoelectric conversion device) of this embodiment mode can be applied to Embodiment Mode 8 to Embodiment Mode 10.

Figure 57:
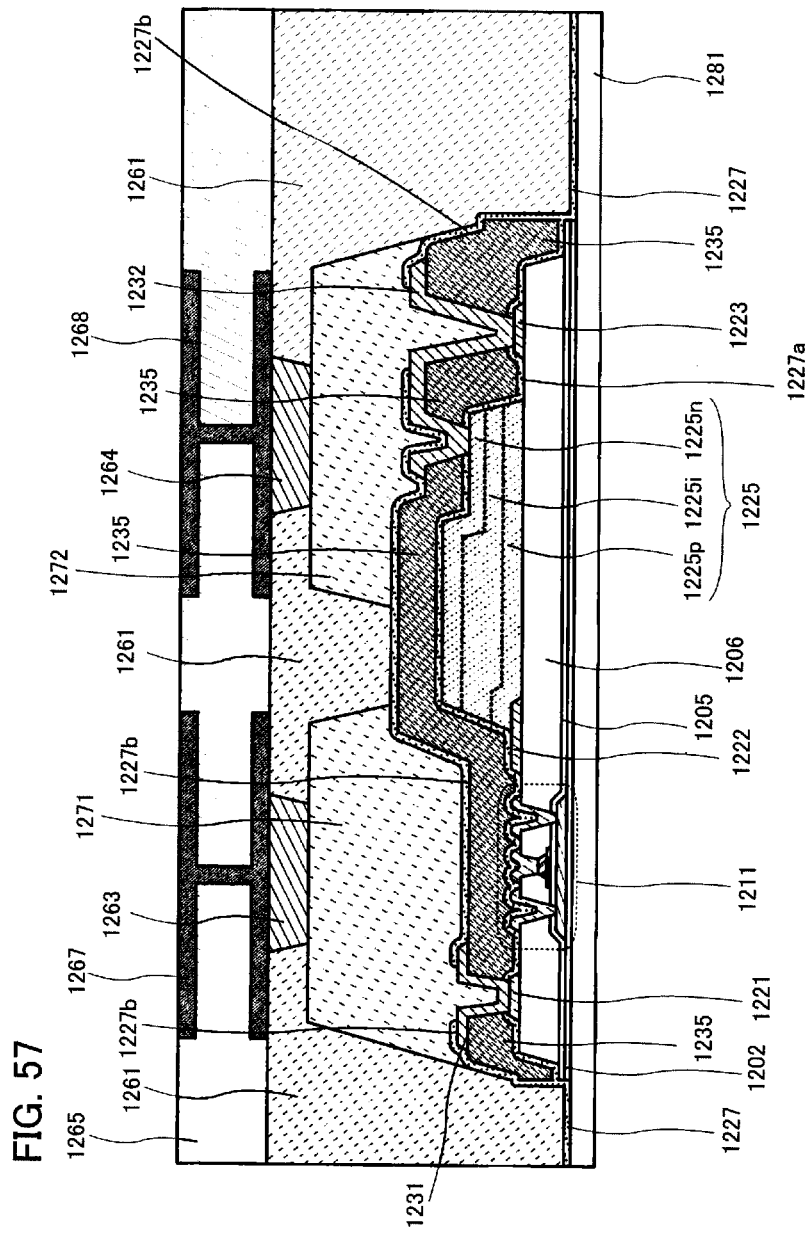
FIG. 57 is a cross-sectional view of a semiconductor device of the present invention.

A semiconductor device shown in FIG. 57 includes an insulating film 1281, an insulating film 1202, a TFT 1211, a gate insulating film 1205, an interlayer insulating film 1206, an electrode 1221, an electrode 1222, and an electrode 1223. In addition, the semiconductor device includes a photoelectric conversion layer 1225 having a p-type semiconductor layer 1225p, an i-type semiconductor layer 1225i, and an n-type semiconductor layer 1225n.

The insulating film 1281, the gate insulating film 1205, the interlayer insulating film 1206, and the electrodes 1221 to 1223 may be formed of the same material and through the same manufacturing steps as the insulating film 104, the gate insulating film 106, the interlayer insulating film 109, and the electrode 116, respectively.

The TFT 1211 may be formed of the same material as the TFT 110 through the same manufacturing steps.

The p-type semiconductor layer 1225p, the i-type semiconductor layer 1225i, and the n-type semiconductor layer 1225n may be formed of the same material and through the same manufacturing steps as the p-type semiconductor layer 121p, the i-type semiconductor layer 121i, and the n-type semiconductor layer 121n.

In addition, a protective film 1227a is formed so as to cover the insulating film 1281, the insulating film 1202, the TFT 1211, the gate insulating film 1205, the interlayer insulating film 1206, the electrode 1221, the electrode 1222, the electrode 1223, and the photoelectric conversion layer 1225.

On the protective film 1227a, an interlayer insulating film 1235 is formed. On the interlayer insulating film 1235, an electrode 1231 electrically connected to the electrode 1221 and an electrode 1232 electrically connected to the topmost layer of the photoelectric conversion layer 1225 (in this embodiment mode, the n-type semiconductor layer 1225n) and the electrode 1223.

The interlayer insulating film 1235 may be formed of the same material as the interlayer insulating film 171 through the same manufacturing steps. The electrode 1231 and the electrode 1232 may be formed of the same material as the electrode 125 through the manufacturing steps.

A protective film 1227b is formed so as to cover the electrode 1231, the electrode 1232, and the interlayer insulating film 1235. Note that, parts of the electrodes 1231 and 1232 are not covered with the protective film 1227b so openings are formed. The openings are provided so that electrodes to electrically connect to the electrodes 1231 and 1232 are formed. Further, the protective film 1227b and the protective film 1227a constitute a protective film 1227.

The protective film 1227a and the protective film 1227b may be formed of the same material as the protective film 129 through the same manufacturing steps.

Over the protective film 1227b, an electrode 1271 and an electrode 1272 are formed so as to electrically connect to the electrode 1231 and the electrode 1232, respectively. The electrode 1271 and the electrode 1272 may be formed of the same material and through the same manufacturing steps as the electrode 141.

In addition, an interlayer insulating film 1261 is formed so as to cover the electrode 1271 and the electrode 1272, and an electrode 1263 and an electrode 1264 are formed on the electrode 1271 and the electrode 1272 respectively, so as to be electrically connected to the electrode 1271 and the electrode 1272, respectively. The electrode 1263 and the electrode 1264 are formed by a printing method using silver (Ag) paste.

The interlayer insulating film 1261 electrically isolates the electrode 1271 and the electrode 1263 from the electrode 1272 and electrode 1264, respectively so as to prevent shortcut. The interlayer insulating film 1261 may be formed of the same material as the interlayer insulating film 119 through the same manufacturing steps.

On the interlayer insulating film 1261, an interlayer insulating film 1265 is formed. The interlayer insulating film 1265 may be formed of an organic insulation resin, for example, plastics. The electrode 1263 and the electrode 1264 are separately provided under the interlayer insulating film 1265, and electrically connected to an interposer 1267 and an interposer 1268 respectively, which serve as terminals used for mounting onto a chip.

Figure 58:
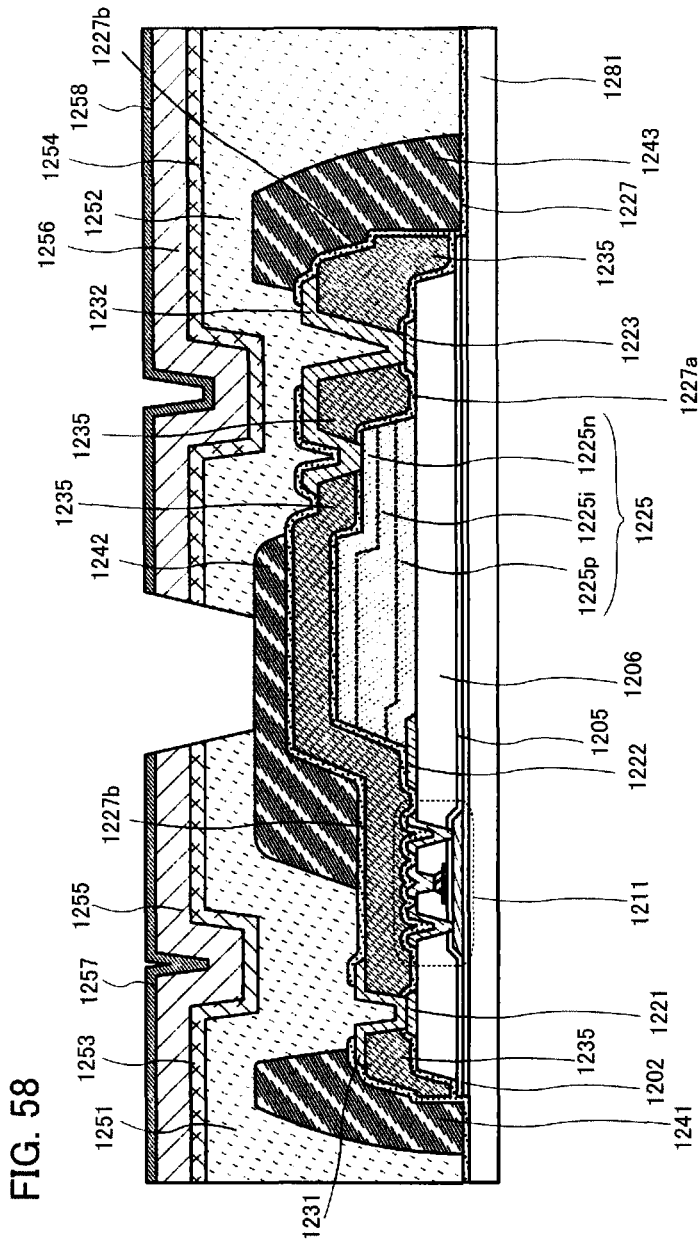
FIG. 58 is a cross-sectional view of a semiconductor device of the present invention.

A semiconductor device shown in FIG. 58 has a structure having the same layers up to and including the protective film 1227b as FIG. 57. On the protective film 1227b, an insulating film 1241, an insulating film 1242, and an insulating film 1243 which serve as sealing materials are formed.

Further, an electrode 1251 and an electrode 1252 are formed on the protective film 1227b so as to electrically connect to the electrode 1231 and the electrode 1232, respectively. The electrode 1251 and the electrode 1252 are formed of the same material as the electrode 141 through the same manufacturing steps.

In addition, an electrode 1253, an electrode 1255, and an electrode 1257 are formed so as to be in contact with the electrode 1251. Further, an electrode 1254, an electrode 1256, and an electrode 1258 are formed so as to be in contact with the electrode 1252.

In this embodiment mode, the electrode 1253 and the electrode 1254 are formed of a titanium film deposited by sputtering. The electrode 1255 and the electrode 1256 are formed of a nickel film deposited by sputtering The electrode 1257 and the electrode 1258 are formed of a gold film deposited by sputtering.

Openings are formed between the electrode 1251 and the electrode 1252, the electrode 1253 and the electrode 1254, the electrode 1255 and the electrode 1256, and the electrode 1257 and the electrode 1258. In addition the openings are provided on the insulating film 1242.

An electrode stack of the electrode 1251, the electrode 1253, the electrode 1255, and the electrode 1257 is electrically isolated from an electrode stack of the electrode 1252, the electrode 1254, the electrode 1256, and the electrode 1258 by an opening therebetween and the insulating film 1242.

The semiconductor devices shown in FIG. 57 and FIG. 58 have the protective film 1227a and the protective film 1227b, so that mixing of impurities such as moisture and organic matter can be prevented. Therefore, in accordance with this embodiment mode, highly reliable semiconductor device can be obtained.

After semiconductor devices shown in FIG. 57 and FIG. 58 are formed, a color filter covered with an overcoat layer may be attached to an insulating film 1281 with a bonding material based on Embodiment Mode 1 to Embodiment Mode 7. Alternatively, a color lens may be provided on the insulating film 1281.

In accordance with the present invention, a semiconductor device or a photoelectric conversion device in which decrease in photosensitivity can be suppressed can be manufactured. Further, when the semiconductor device or the photoelectric conversion device of the invention is built in an electronic device, stable circuit operation and high reliability can be ensured.

The present application is based on Japanese Priority application No. 2006-295929 filed in the Japanese Patent Office on Oct. 31, 2006, the entire contents of which are hereby incorporated by reference.

What is claimed is:

1. A method for manufacturing a semiconductor device comprising:
   forming a first insulating film over a first substrate;
   forming a first metal film over the first insulating film;
   forming a first metal oxide film over the first metal film;
   forming an second insulating film over the first metal oxide film;
   forming a photodiode and an amplifier circuit over the second insulating film, the amplifier circuit being configured to amplify output current of the photodiode;

separating the second insulating film from the first metal oxide film to form a first laminated body comprising the second insulating film, the photodiode and the amplifier circuit;
forming a third insulating film over a second substrate;
forming a third metal film over the third insulating film;
forming a second metal oxide film over the third metal film;
forming a fourth insulating film over the second metal oxide film;
forming a color filter over the fourth insulating film;
forming an overcoat layer over the color filter;
separating the fourth insulating film from the second metal oxide film to form a second laminated body comprising the fourth insulating film, the color filter and the overcoat layer; and
bonding the first laminated body and the second laminated body with a bonding material.

2. A method for manufacturing a semiconductor device according to claim 1, wherein the amplifier circuit is a current mirror circuit including a thin film transistor.

3. A method for manufacturing a semiconductor device according to claim 1, wherein the bonding material comprises a material selected from the group consisting of a reactive curable bonding material, a heat-curable bonding material, a light-curable bonding material and an anaerobic curable bonding material.

4. A method for manufacturing a semiconductor device according to claim 1, wherein the color filter is formed by an etching method using a colored resin, a color resist method using a color resist, a staining method, an electrodeposition method, a micelle electrolytic method, an electrodeposition transfer method, a film dispersion method, an inkjet method, or a silver-based color development method.

5. A method for manufacturing a semiconductor device comprising:
forming a first insulating film over a first substrate;
forming a photodiode and an amplifier circuit over the first insulating film, the amplifier circuit being configured to amplify output current of the photodiode, wherein the amplifier circuit is a current mirror circuit including a thin film transistor;
separating the first substrate from the first insulating film to form a first laminated body comprising the first insulating film, the photodiode and the amplifier circuit;
forming a second insulating film over a second substrate;
forming a color filter over the second insulating film;
forming an overcoat layer over the color filter;
separating the second substrate from the second insulating film to form a second laminated body comprising the second insulating film, the color filter and the overcoat layer; and
bonding the first laminated body and the second laminated body with a bonding material.

6. A method for manufacturing a semiconductor device according to claim 5, wherein the bonding material comprises a material selected from the group consisting of a reactive curable bonding material, a heat-curable bonding material, a light-curable bonding material and an anaerobic curable bonding material.

7. A method for manufacturing a semiconductor device according to claim 5, wherein the color filter is formed by an etching method using a colored resin, a color resist method using a color resist, a staining method, an electrodeposition method, a micelle electrolytic method, an electrodeposition transfer method, a film dispersion method, an inkjet method, or a silver-based color development method.

* * * * *